US012777909B2

(12) United States Patent
Kao et al.

(10) Patent No.: US 12,777,909 B2
(45) Date of Patent: Oct. 27, 2026

(54) BACK END DIELECTRIC-BASED MEMORY STRUCTURE IN A SEMICONDUCTOR DEVICE

(71) Applicant: Taiwan Semiconductor Manufacturing Company, Ltd., Hsinchu (TW)

(72) Inventors: Yun-Feng Kao, New Taipei City (TW); Katherine H. Chiang, New Taipei City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 431 days.

(21) Appl. No.: 18/336,791

(22) Filed: Jun. 16, 2023

(65) Prior Publication Data

US 2024/0421036 A1 Dec. 19, 2024

(51) Int. Cl.

| | |
|---|---|
| ***H10W 20/20*** | (2026.01) |
| ***G11C 13/00*** | (2006.01) |
| ***H10B 12/00*** | (2023.01) |
| ***H10B 20/25*** | (2023.01) |
| ***H10B 63/00*** | (2023.01) |
| ***H10B 80/00*** | (2026.01) |
| ***H10W 20/41*** | (2026.01) |

(52) U.S. Cl.

CPC ......... *H10W 20/20* (2026.01); *G11C 13/0069* (2013.01); *H10B 12/315* (2023.02); *H10B 12/485* (2023.02); *H10B 12/488* (2023.02); *H10B 20/25* (2023.02); *H10B 63/34* (2023.02); *H10B 80/00* (2023.02); *H10W 20/435* (2026.01)

(58) Field of Classification Search

CPC .... H10W 20/20; H10W 20/435; H10B 63/34; H10B 12/485; H10B 12/315; H10B 80/00; G11C 13/0069

See application file for complete search history.

(56) References Cited

U.S. PATENT DOCUMENTS

| | | | | |
|---|---|---|---|---|
| 7,864,568 | B2 | 1/2011 | Fujisaki et al. | |
| 9,059,168 | B2 | 6/2015 | Yen et al. | |
| 11,159,166 | B2 | 10/2021 | Lee et al. | |
| 11,430,814 | B2 | 8/2022 | Lilak et al. | |
| 2013/0062728 | A1* | 3/2013 | Kurz | H01L 23/5252 257/E29.325 |

(Continued)

FOREIGN PATENT DOCUMENTS

| | | | |
|---|---|---|---|
| TW | 200835007 | A | 8/2008 |
| TW | 201334159 | A | 8/2013 |

(Continued)

*Primary Examiner* — Timor Karimy

(74) *Attorney, Agent, or Firm* — Harrity & Harrity, LLP

(57) ABSTRACT

A semiconductor device may include a non-volatile memory structure that may be formed in a back end of line (BEOL) region of a semiconductor device. The non-volatile memory structure may include a dielectric-based one-time programmable (OTP) anti-fuse memory structure or a dielectric-based resistive random access memory (ReRAM), among other examples. The non-volatile memory structure may be selectively programmed based on modifying an electrical resistance of the non-volatile memory structure, and may retain data stored in the non-volatile memory structure even when electrical power is removed from the semiconductor device.

20 Claims, 35 Drawing Sheets

(56) References Cited

U.S. PATENT DOCUMENTS

| | | | | |
|---|---|---|---|---|
| 2021/0407908 | A1 | 12/2021 | Huang | |
| 2023/0136441 | A1 * | 5/2023 | Lin | G11C 13/0007 257/5 |
| 2023/0197654 | A1 * | 6/2023 | Gomes | H10B 53/20 257/296 |

FOREIGN PATENT DOCUMENTS

| | | | |
|---|---|---|---|
| TW | 201941545 | A | 10/2019 |
| TW | 201944565 | A | 11/2019 |
| TW | 202034482 | A | 9/2020 |

* cited by examiner

BACK END DIELECTRIC-BASED MEMORY STRUCTURE IN A SEMICONDUCTOR DEVICE

BACKGROUND

Memory devices are used in a wide variety of applications. Memory devices are made up of a plurality of memory cells that are typically arranged in an array of a plurality of rows and a plurality of columns. One type of memory cell includes a dynamic random access memory (DRAM) cell. In some applications, a DRAM cell-based memory device may be selected as opposed to other types of memory cell-based memory devices due to DRAM cell's lower cost, smaller area, and ability to hold a greater amount of data relative to, for example, a static random access memory (SRAM) cell or another type of memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
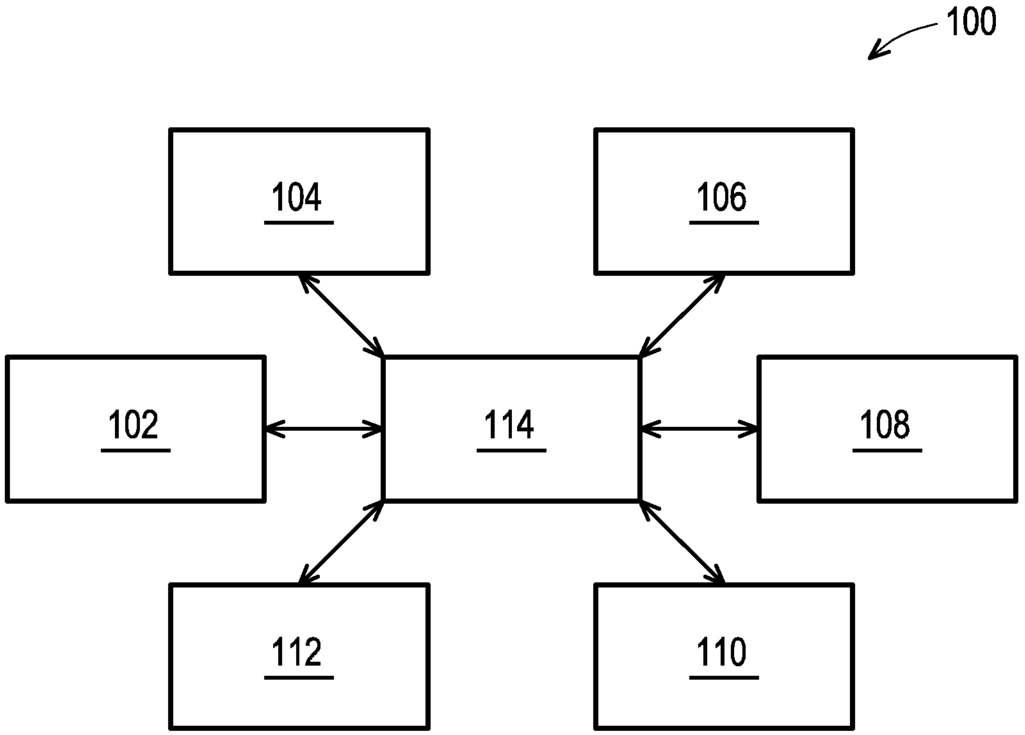
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A dynamic random access memory (DRAM) memory cell is a type of volatile memory cell that typically includes a transistor connected in series with a capacitor. This may be referred to as a one transistor-one capacitor (1T-1C) DRAM cell. The capacitor in a 1T-1C DRAM cell functions as a storage device by selectively storing electric charge. The capacitor may be charged through the transistor, and the amount of charge that is stored in the capacitor may be sensed by discharging the charge that is stored by the capacitor. The logical value (e.g., a 1-value or a 0-value) stored by the 1T-1C DRAM cell may correspond to the amount of charge that is stored by the capacitor.

A DRAM memory cell array may be implemented in a back end region (sometimes referred to as a back end of line (BEOL) region) of a semiconductor device. Peripheral circuitry may be included under the DRAM memory cell array, and may include circuits such as sense amplifier circuits, row decoder circuits, column decoder circuits, and/or address decoder circuits, among other examples. Including the peripheral circuitry under the DRAM memory cell array (a configuration that may be referred to as a circuit under array (CuA)) may enable the horizontal size of the semiconductor device to be reduced relative to if the peripheral circuitry were included adjacent to and/or around the DRAM memory cell array.

While a DRAM memory cell array may provide volatile memory for caching and other functions in a back end region of a semiconductor device, the data stored in the DRAM memory cell array is lost when power is removed from the semiconductor device due to the volatile nature of DRAM.

In some implementations described herein, a semiconductor device may include a non-volatile memory structure that may be formed in a BEOL region of a semiconductor device. The non-volatile memory structure may include a dielectric-based one-time programmable (OTP) anti-fuse memory structure or a dielectric-based resistive random access memory (ReRAM), among other examples. The non-volatile memory structure may be selectively programmed based on modifying an electrical resistance of the non-volatile memory structure, and may retain data stored in the non-volatile memory structure even when electrical power is removed from the semiconductor device.

The non-volatile memory structure may include a gate structure, a channel region, and a plurality of source/drain regions. A first source/drain region may be electrically coupled with the channel region and a source/drain interconnect structure that electrically connects the first source/drain region with a bit line conductive structure. A second source/drain region may be electrically coupled with the channel region. The second source/drain region may be formed such that the second source/drain region is not physically coupled or electrically coupled with a select line conductive structure. Instead, a portion of a dielectric layer in the BEOL region of the semiconductor device is included between the second source/drain region and the select line conductive structure such that the second source/drain region and the select line conductive structure are physically and electrically isolated.

The portion of the dielectric layer between the second source/drain region and the select line conductive structure functions as a programmable resistance-based memory cell region of the non-volatile memory structure. A voltage may be pulsed on the gate structure, which causes current pulses to flow through the channel region from the first source/drain region to the second source/drain region. The current pulses cause an electric field to repeatedly modify the electrical resistance in the portion of the dielectric layer between the second source/drain region and the select line conductive structure until the portion of the dielectric layer breaks down (either reversibly in the case of a programmable ReRAM implementation or permanently in the case of an OTP anti-fuse implementation) and becomes a conductive path from the second source/drain region to the select line conductive structure. In this way, the electrical resistance of the non-volatile memory structure is modified, thereby enabling selective storage of a logical value (e.g., a "0" value or a "1" value) in the non-volatile memory structure.

As described herein, the non-volatile memory structure may be included in the BEOL region of the semiconductor device along with a volatile memory structure (e.g., a DRAM memory structure), such that caching and long-term storage may be performed in the BEOL region of the semiconductor device. The non-volatile memory structure and the volatile memory structure may be formed by similar processing techniques and in the same operations without additional masking steps, which may reduce the complexity of forming the non-volatile memory structure and may result in minimal impact to back end processing cost and time for the semiconductor device.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform one or more semiconductor processing operations described herein. For example, one or more of the semiconductor processing tools 102-112 and/or the wafer/die transport tool 114 may form a word line conductive structure in a semiconductor device, may form a plurality of BEOL dielectric layers over the word line conductive structure, may form, over the word line conductive structure, a recess through the plurality of BEOL dielectric layers to expose the word line conductive structure through the recess, may form a gate structure, of a non-volatile memory structure of the semiconductor device, in the recess such that the gate structure is coupled with the word line conductive structure, may form a first source/drain region and a second source/drain region of the non-volatile memory structure over the gate structure, may form a first interconnect structure on the first source/drain region, may form a bit line conductive structure over the first interconnect structure such that the bit line conductive structure is physically coupled with the first interconnect structure, where the bit line conductive structure is formed in a BEOL dielectric layer of the plurality of BEOL dielectric layers, may form a select line conductive structure in the BEOL dielectric layer, and/or may form a second interconnect structure in the BEOL dielectric layer and on the second source/drain region, where the second interconnect structure is formed such that the second interconnect structure and the select line conductive structure are spaced apart by the BEOL dielectric layer.

As another example, one or more of the semiconductor processing tools 102-112 and/or the wafer/die transport tool 114 may form a gate dielectric layer of the non-volatile memory structure over the gate structure, may form a channel layer of the non-volatile memory structure over the gate dielectric layer, and may form the first source/drain region and the second source/drain region over the channel layer. As another example, one or more of the semiconductor processing tools 102-112 and/or the wafer/die transport tool 114 may form a gate structure, of a volatile memory structure of the semiconductor device, in the plurality of BEOL dielectric layers, where the gate structure of the non-volatile memory structure and the gate structure of the volatile memory structure are formed in a same set of semiconductor processing operations.

As another example, one or more of the semiconductor processing tools 102-112 and/or the wafer/die transport tool 114 may form a first source/drain region and a second source/drain region of a volatile memory structure of the semiconductor device, where the first source/drain region and the second source/drain region of the non-volatile memory structure and the first source/drain region and the second source/drain region of the volatile memory structure are formed in a same set of first semiconductor processing operations. As another example, one or more of the semiconductor processing tools 102-112 and/or the wafer/die transport tool 114 may form a first interconnect structure for the non-volatile memory structure on the first source/drain region of the non-volatile memory structure, where the first interconnect structure of the non-volatile memory structure and the first interconnect structure of the volatile memory structure are formed in a same set of second semiconductor processing operations. As another example, one or more of the semiconductor processing tools 102-112 and/or the wafer/die transport tool 114 may form a second interconnect structure for the non-volatile memory structure on the second source/drain region of the non-volatile memory structure, wherein the second interconnect structure of the non-volatile memory structure and the second interconnect structure of the volatile memory structure are formed in a same set of third semiconductor processing operations.

In some implementations, one or more of the semiconductor processing tools 102-112 and/or the wafer/die transport tool 114 may perform one or more other semiconductor processing operations described herein, such as in connection with FIGS. 5A-5K, 6A-6M, and/or 9, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
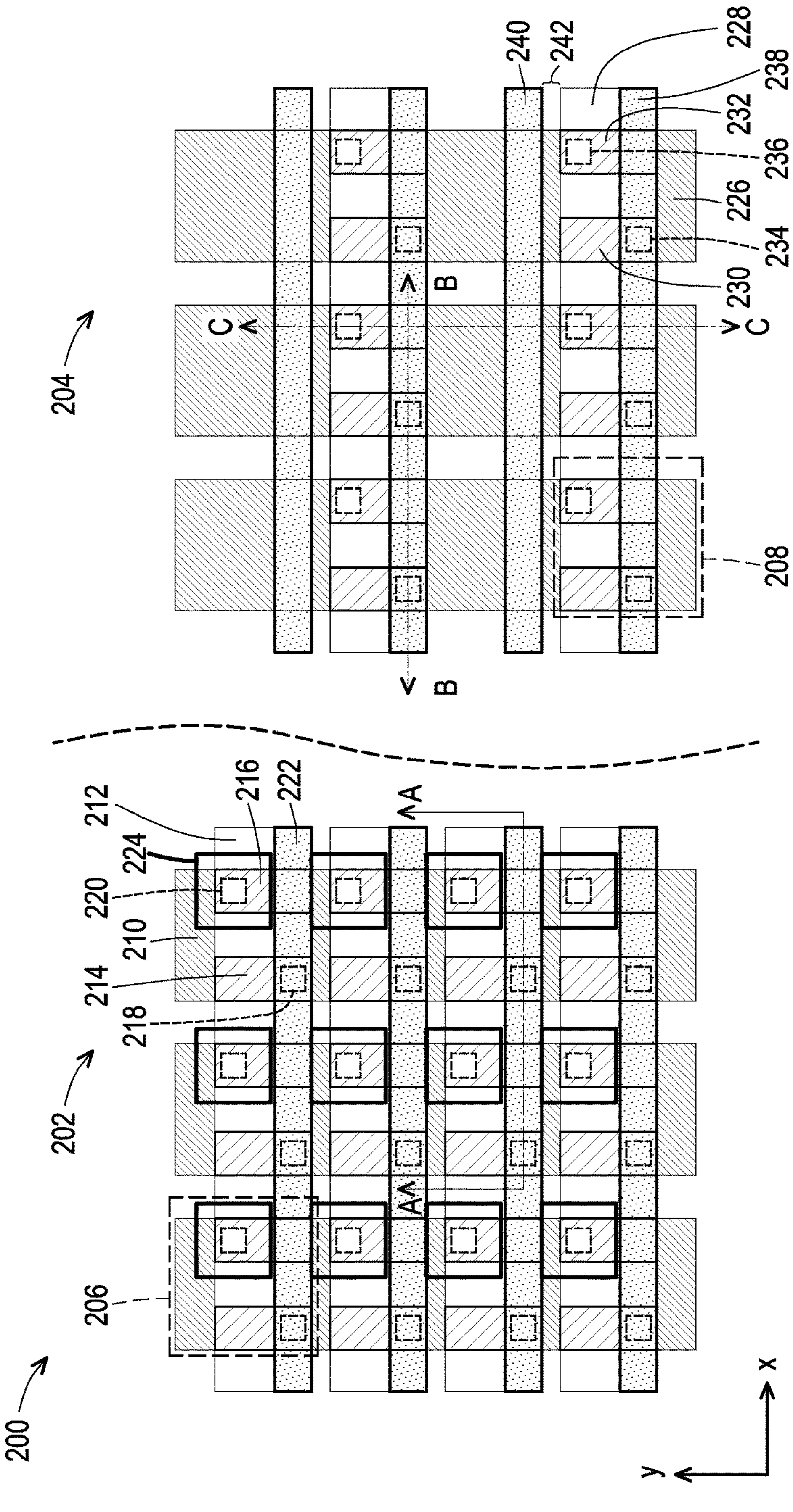
FIG. 2 is a diagram of an example semiconductor device that includes a volatile memory array and a non-volatile memory array described herein.

FIG. 2 is a diagram of an example semiconductor device 200 described herein. In particular, FIG. 2 illustrates a top-down view of a back end region or BEOL region of the semiconductor device 200. The semiconductor device 200 includes an example of a semiconductor device, such as a semiconductor memory device, an image sensor device (e.g., a complementary metal oxide semiconductor (CMOS) image sensor (CIS) device), a semiconductor logic device (e.g., a processor, a central processing unit (CPU), a graphics processing unit (GPU), a digital signal processor (DSP)), an input/output device, an application specific integrated circuit (ASIC), or another type of semiconductor device. In some implementations, the semiconductor device 200 includes a front end of line (FEOL) region that includes integrated circuitry that is connected with the BEOL region of the semiconductor device 200.

As shown in FIG. 2, a volatile memory array 202 and a non-volatile memory array 204 may be included in the back end region of the semiconductor device 200. In some implementations, the volatile memory array 202 and the non-volatile memory array 204 may be physically and/or electrically isolated by a non-array region between the volatile memory array 202 and the non-volatile memory array 204. The volatile memory array 202 and the non-volatile memory array 204 may be included in one or more back end dielectric layers (e.g., BEOL dielectric layers) in the BEOL region of the semiconductor device 200.

As further shown in FIG. 2, the volatile memory array 202 may include a plurality of volatile memory structures 206 in the back end dielectric layer(s) of the semiconductor device 200. The volatile memory structures 206 may include DRAM memory structures and/or another type of volatile memory structures. The non-volatile memory array 204 may include a plurality of non-volatile memory structures 208 in the back end dielectric layer(s) of the semiconductor device 200. The non-volatile memory structures 208 may include programmable ReRAM structures, one-time programmable anti-fuse memory structures, and/or another type of resistive-based non-volatile memory structures.

A volatile memory structure 206 in the volatile memory array 202 may include a gate structure 210, a channel layer 212 above the gate structure 210, and a plurality of source/drain regions 214 and 216 above the channel layer 212. The gate structure 210, the channel layer 212, and the source/drain regions 214 and 216 may correspond to a transistor of the volatile memory structure 206. A source/drain region, as used herein, may refer to a source region, a drain region, or both a source region and a drain region, depending on the context. The volatile memory structure 206 may further include an interconnect structure 218 above the source/drain region 214, an interconnect structure 220 above the source/drain region 216, a bit line conductive structure 222 above the interconnect structure 218, and a capacitor structure 224 above the interconnect structure 220. The interconnect structure 218 may electrically couple the transistor of the volatile memory structure 206 with the bit line conductive structure 222, and the interconnect structure 220 may electrically couple the transistor of the volatile memory structure 206 with the capacitor structure 224. The capacitor structure 224 may be configured to selectively store an electrical charge for the volatile memory structure 206, enabling one or more logical values to be stored by the volatile memory structure 206 based on an amount of electrical charge stored in the capacitor structure 224. The capacitor structure 224 may be referred to as a programmable charge-based memory cell of the volatile memory structure 206.

As further shown in FIG. 2, one or more bit line conductive structures 222 in the volatile memory array 202 may extend in a first direction (e.g., an x-direction) in the semiconductor device 200. One or more gate structures 210 in the volatile memory array 202 may extend in a second direction (e.g., an y-direction) in the semiconductor device 200 that is approximately orthogonal to the first direction. This enables a gate structure 210 to span multiple volatile memory structures 206 in the volatile memory array 202, and enables a single bit line conductive structure 222 to span multiple volatile memory structures 206 in the volatile memory array 202. Thus, the volatile memory structures 206 in the volatile memory array 202 may be arranged in a grid and each electrically coupled to a single gate structure 210 and a single bit line conductive structure 222, which enables each volatile memory structures 206 in the volatile memory array 202 to be accessed by a specific combination of a gate structure 210 and a bit line conductive structure 222.

As further shown in FIG. 2, one or more channel layers 212 in the volatile memory array 202 may extend in the first direction in the semiconductor device 200 and may span across a plurality of volatile memory structures 206. A source/drain region 214 and a source/drain region 216 may extend in the second direction. In some implementations, each volatile memory structure 206 may include its own set of source/drain regions 214 and 216.

As further shown in FIG. 2, a non-volatile memory structure 208 in the non-volatile memory array 204 may include a gate structure 226, a channel layer 228 above the gate structure 226, and a plurality of source/drain regions 230 and 232 above the channel layer 228. The gate structure 226, the channel layer 228, and the source/drain regions 230 and 232 may correspond to a transistor of the non-volatile memory structure 208.

The non-volatile memory structure 208 may further include an interconnect structure 234 above the source/drain region 230, an interconnect structure 236 above the source/drain region 232, a bit line conductive structure 238 above the interconnect structure 234, and a select line conductive structure 240 adjacent to the interconnect structure 236. The interconnect structure 234 may electrically couple the transistor of the non-volatile memory structure 208 with the bit line conductive structure 238.

The interconnect structure 236 may be spaced apart from a select line conductive structure 240 in the non-volatile memory array 204 such that a gap is included between the interconnect structure 236 and the select line conductive structure 240. The gap may include a dielectric region in the BEOL region of the semiconductor device 200, and may be configured as a programmable resistance-based memory cell region 242 of the non-volatile memory structure 208.

The electrical resistance of the programmable resistance-based memory cell region 242 may correspond to a first logic value (e.g., a "0" value or a "1" value). One or more electrical pulses (e.g., current pulses, voltage pulses) may be provided to the programmable resistance-based memory cell region 242, resulting in formation of an electric field in the programmable resistance-based memory cell region 242. The electric field breaks down the dielectric structure of the programmable resistance-based memory cell region 242, resulting in a reduced electrical resistance in the programmable resistance-based memory cell region 242. The reduced electrical resistance may correspond to a second logic value. In some implementations, the dielectric breakdown in the programmable resistance-based memory cell region 242 may be reversable (e.g., non-permanent), enabling the non-volatile memory structure 208 to operate as an ReRAM structure (e.g., a programmable ReRAM cell). In some implementations, the dielectric breakdown in the programmable resistance-based memory cell region 242 may be permanent (e.g., non-reversable), enabling the non-volatile memory structure 208 to operate as a one-time programmable memory anti-fuse structure.

As further shown in FIG. 2, one or more bit line conductive structures 238 in the non-volatile memory array 204 may extend in the first direction (e.g., the x-direction) in the semiconductor device 200. One or more gate structures 226 in the non-volatile memory array 204 may extend in a second direction (e.g., an y-direction) in the semiconductor device 200 that is approximately orthogonal to the first direction. This enables a gate structure 226 to span multiple non-volatile memory structures 208 in the non-volatile memory array 204, and enables a single bit line conductive structure 238 to span non-volatile memory structures 208 in the non-volatile memory array 204. Thus, the non-volatile memory structures 208 in the non-volatile memory array 204 may be arranged in a grid and each electrically coupled to a single gate structure 226 and a single bit line conductive structure 238, which enables each non-volatile memory structure 208 in the non-volatile memory array 204 to be accessed by a specific combination of a gate structure 226 and a bit line conductive structure 238.

As further shown in FIG. 2, one or more select line conductive structures 240 in the non-volatile memory array 204 may extend in the first direction (e.g., the x-direction) in the semiconductor device 200. The one or more select line conductive structures 240 may be approximately parallel with the one or more bit line conductive structures 238, and may be approximately orthogonal to the one or more gate structures 226.

As further shown in FIG. 2, one or more channel layers 228 in the non-volatile memory array 204 may extend in the first direction in the semiconductor device 200 and may span across a plurality of non-volatile memory structures 208. A source/drain region 230 and a source/drain region 232 may extend in the second direction. In some implementations, each non-volatile memory structure 208 may include its own set of source/drain regions 230 and 232.

As further shown in FIG. 2, an interconnect structure 234 and an interconnect structure 236 of a non-volatile memory structure 208 may be staggered (e.g., not aligned) in both the first direction (e.g., the x-direction) and in the second direction (e.g., the y-direction). The interconnect structure 234 and the interconnect structure 236 of the non-volatile memory structure 208 being staggered (e.g., not aligned) in the first direction (e.g., the x-direction) enables the interconnect structure 234 to be coupled with the source/drain region 230 and the interconnect structure 236 to be coupled with the source/drain region 232. The interconnect structure 234 and the interconnect structure 236 of the non-volatile memory structure 208 being staggered (e.g., not aligned) in the second direction (e.g., the y-direction) enables the interconnect structure 234 and not the interconnect structure 236 to be coupled with the bit line conductive structure 238.

As indicated above, FIG. 2 is provided as an example. Other examples may differ from what is described with regard to FIG. 2.

Figure 3A:
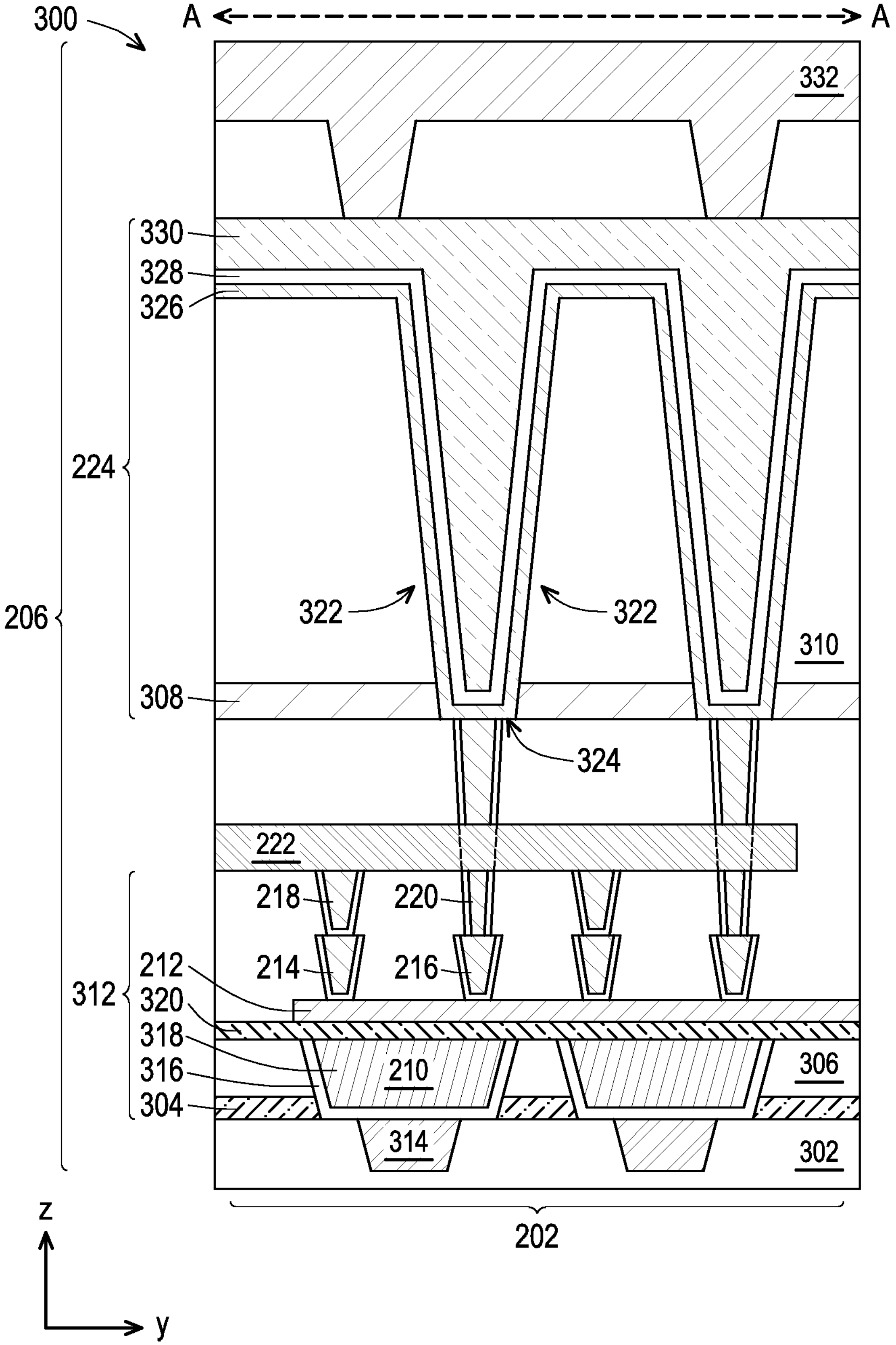
FIGS. 3A and 3B are diagrams of an example implementation of a volatile memory structure of a volatile memory array described herein.
Figure 3B:
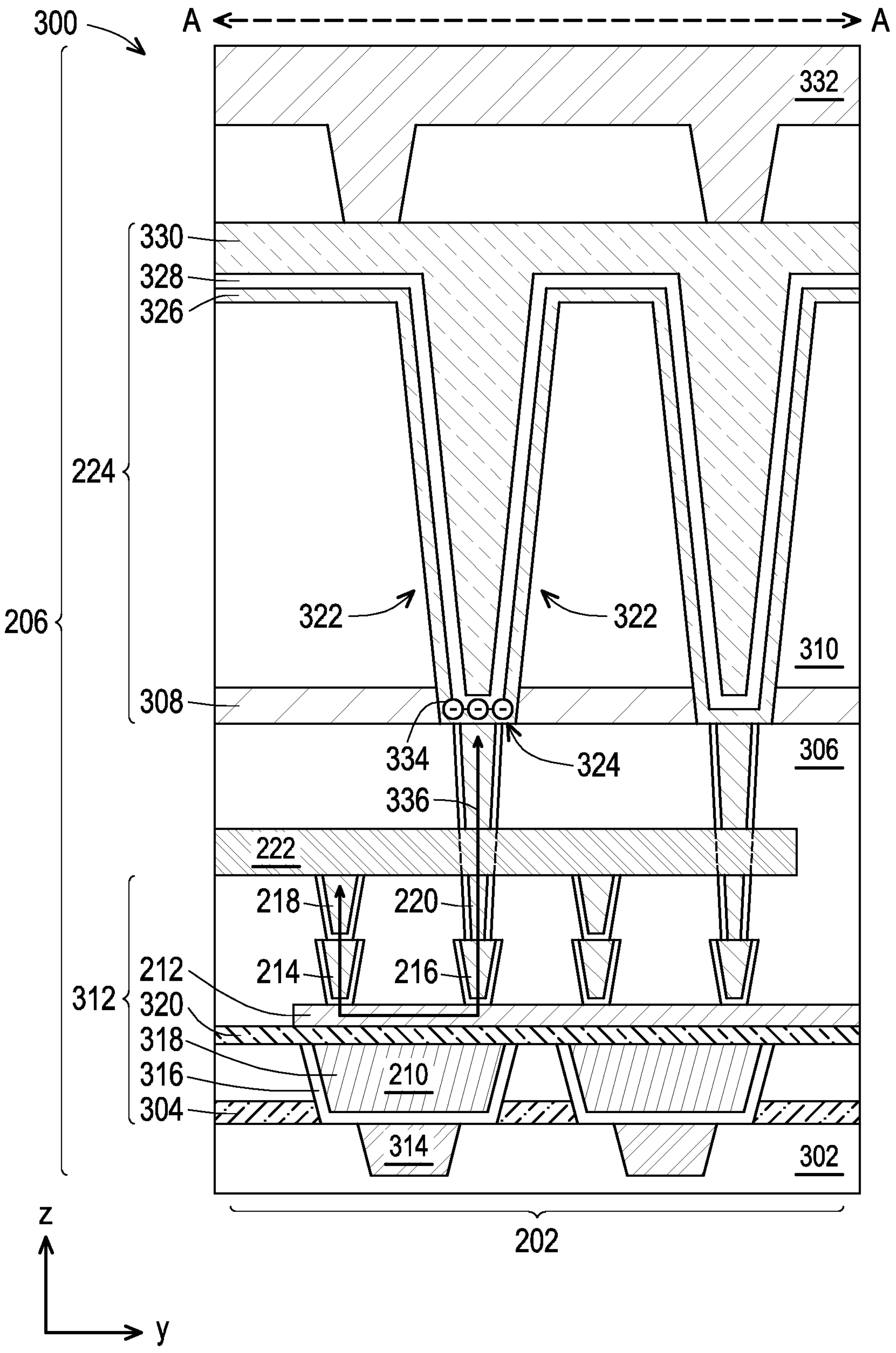

FIGS. 3A and 3B are diagrams of an example implementation 300 of a volatile memory structure 206 of a volatile memory array 202 included in a semiconductor device described herein. The volatile memory structure 206 of the volatile memory array 202 may be included in a back end region or BEOL region of the semiconductor device (e.g., the semiconductor device 200, a semiconductor device 700 of FIG. 7).

FIGS. 3A and 3B illustrate an elevation view of the volatile memory structure 206 along the cross-sectional plane A-A shown in FIG. 2. In other words, the cross-section is taken along a bit line conductive structure 222 to which the interconnect structure 218 of the volatile memory structure 206 is connected, and the cross-section is superimposed on the interconnect structure 220 and the capacitor structure 224 of the volatile memory structure 206 in the elevation view in FIGS. 3A and 3B. Thus, the interconnect structure 220 and the capacitor structure 224 are not necessarily in the same plane as the bit line conductive structure 222 and the interconnect structure 218, and are instead further back from the location of the cross-section that includes bit line conductive structure 222 and the interconnect structure 218.

As shown in FIG. 3A, the volatile memory array 202 may be included in one or more back end layers of a semiconductor device, such as the semiconductor device 200 and/or the semiconductor device 700, among other examples. The back end dielectric layer(s) (e.g., BEOL layers or BEOL dielectric layers) may include a dielectric layer 302 (e.g., an interlayer dielectric (ILD) layer), a dielectric layer 304 (e.g., an etch stop layer (ESL)) over and/or on the dielectric layer 302, a dielectric layer 306 (e.g., another ILD layer) over and/or on the dielectric layer 304, a dielectric layer 308 (e.g., another ESL) over and/or on the dielectric layer 306, and a dielectric layer 310 (e.g., another ILD layer) over and/or on the dielectric layer 308, among other examples. In some implementations, one or more of the dielectric layers 302-310 may include a plurality of layers. For example, the dielectric layer 310 may include a plurality of ILD layers.

The dielectric layers 302, 306, and 310 may each include one or more low dielectric constant (low-k) dielectric materials such as a silicon oxide ($SiO_x$), fluoride-doped silicate glass (FSG), and/or another low-k dielectric material. The dielectric layers 304 and 308 may each include one or more high dielectric constant (high-k) dielectric materials to provide etch selectivity relative to the dielectric layers 302, 306, and 310. Examples of high-k dielectric materials include dielectric materials having a dielectric constant greater than the dielectric constant of silicon oxide (approximately 3.6), such as aluminum oxide ($AlO_x$), silicon carbon nitride (SiCN), and/or silicon nitride ($Si_xN_y$), among other examples.

The volatile memory structure 206 may be included in the back end dielectric layer(s) of the semiconductor device. The volatile memory structure 206 may include a DRAM memory structure and/or another type of volatile memory structure. The volatile memory structure 206 may include a transistor structure 312 and a capacitor structure 224. The capacitor structure 224 may be configured to selectively store an electrical charge corresponding to a logical value (e.g., a “1” value or a “0” value) stored by the volatile memory structure 206. The transistor structure 312 may be configured to selectively control access to the capacitor structure 224. For example, the transistor structure 312 may be activated to enable a charge to be provided to the capacitor structure 224 through the transistor structure 312. As another example, the transistor structure 312 may be deactivated to enable a charge to be stored in (e.g., to remain in) the capacitor structure 224. As another example, the transistor structure 312 may be activated to perform a "read" operation in which a charge stored in the capacitor structure 224 is discharged through the transistor structure 312 and measured.

The volatile memory structure 206 may be physically coupled and/or electrically coupled with a word line conductive structure 314 in the dielectric layer 302 below and/or under the transistor structure 312. The word line conductive structure 314 may also be referred to as an access line conductive structure, a select line conductive structure, an address line conductive structure, and/or a row line conductive structure, among other examples. The word line conductive structure 314 may be configured to selectively provide a voltage or current to a gate structure 210 of the transistor structure 312 for performing access operations associated with the volatile memory structure 206. The word line conductive structure 314 may include a trench, a via, metal line, a metallization layer, and/or another type of conductive structure. The word line conductive structure 314 may include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples.

The gate structure 210 of the transistor structure 312 may be located over and/or on the word line conductive structure 314. In particular, the gate structure 210 and the word line conductive structure 314 may be in direct physical contact such that a current or a voltage may be directly applied to the gate structure 210 from the word line conductive structure 314. The gate structure 210 may be included in the dielectric layers 304 and 306. The gate structure 210 may include one or more liner layers 316 between a gate electrode 318 of the gate structure 210 and the word line conductive structure 314. The gate electrode 318 may include polysilicon (e.g., polycrystalline silicon), one or more conductive materials, one or more high-k materials, and/or a combination thereof. The liner layer(s) 316 may include adhesion liners (e.g., liners that are included to promote adhesion between the gate electrode 318 and the dielectric layers 304 and 306), barrier layers (e.g., layers that are included to reduce or minimize diffusion of the material of the gate electrode 318 into the dielectric layers 304 and 306 and/or into the word line conductive structure 314), and/or another type of liner layers.

A gate dielectric layer 320 may be included over and/or on the gate structure 210. The gate dielectric layer 320 may be included in the dielectric layer 306. In some implementations, each transistor structure 312 includes a separate gate dielectric layer 320. In some implementations, two or more transistor structures 312 in the volatile memory array 202 share the same gate dielectric layer 320. In other words, a gate dielectric layer 320 may extend and/or span across gate structures 210 of a plurality of transistor structures 312. The gate dielectric layer 320 may include one or more dielectric materials, including high dielectric constant (high-k) materials such as hafnium silicate ($HfO_xSi$), zirconium silicate ($ZrSiO_x$), hafnium oxide ($HfO_x$), and/or zirconium oxide ($ZrO_x$), among other examples.

In some implementations, each transistor structure 312 may include a channel layer 212 over and/or on the gate dielectric layer 320. In some implementations, a channel layer 212 may extend across a plurality of gate structures 210 of a plurality of transistor structures 312 included in the volatile memory array 202. The channel layer 212 may include one or more semiconductor materials, such as silicon (Si), germanium (Ge), doped silicon, doped germanium, indium zinc oxide (InZnO), indium tin oxide (InSnO), indium oxide ($In_xO_y$ such as $In_2O_3$), gallium oxide ($Ga_xO_y$ such as $Ga_2O_3$), indium gallium zinc oxide (InGaZnO), zinc oxide (ZnO), aluminum zinc oxide ($Al_xO_yZn_z$ such as $Al_2O_5Zn_2$), aluminum doped zinc oxide, titanium oxide ($TiO_x$), III-V semiconductor materials, and/or combinations (e.g., alloys or stacked layers) of semiconductor materials, among other examples. This enables a conductive channel to be selectively formed in the channel layer 212 based on current or a voltage being applied to the gate structure 210.

Source/drain regions 214 and 216 may be included over and/or on the channel layer 212. The source/drain regions 214 and 216 may be electrically coupled with channel layer 212 such that current is selectively permitted to flow between the source/drain regions 214 and 216 through the channel layer 212. The source/drain regions 214 and 216 may each include one or more semiconductor materials, such as silicon (Si), germanium (Ge), doped silicon, and/or doped germanium, among other examples. In some implementations, the source/drain regions 214 and/or 216 may include one or more liner layers and a conductive material (or a semiconductive materials). The one or more liner layers may include a barrier liner included to prevent material migration from the conductive material into the surrounding dielectric layers, an adhesion layer included to promote adhesion between the conductive material and the surrounding dielectric layers, and/or another type of liner layer. Examples of conductive materials include copper (Cu), cobalt (Co), ruthenium (Ru), titanium (Ti), tungsten (W), gold (Au), and/or silver (Ag), among other examples. Examples of liner layers include tantalum (Ta), tantalum nitride (TaN), indium oxide (InO), tungsten nitride (WN), titanium nitride (TiN), and/or another suitable liner layer, among other examples.

The source/drain regions 214 and 216 may be respectively coupled with interconnect structures. For example, the source/drain region 214 may be coupled with an interconnect structure 218 that is located over and/or on the source/drain region 214. The interconnect structure 218 may electrically couple the source/drain region 214 with the bit line conductive structure 222. The bit line conductive structure 222 may also be referred to as a column line conductive structure. The bit line conductive structure 222 may be located over and/or on the interconnect structure 218, and may be configured to selectively receive a current from the capacitor structure 224 or to provide a current to the capacitor structure 224 through the transistor structure 312.

As another example, the source/drain region 216 may be coupled with an interconnect structure 220 that is located over and/or on the source/drain region 216. In the diagram in FIG. 3A, the interconnect structure 220 is located behind the bit line conductive structure 222 and is not in physical contact with the bit line conductive structure 222. The interconnect structure 220 electrically couples the source/drain region 216 with the capacitor structure 224.

The interconnect structures 218 and 220, and the bit line conductive structure 222, may each include vias, plugs, trenches, dual damascene structures, and/or another type of conductive structures. The interconnect structures 218 and 220, and the bit line conductive structure 222, may each include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples. In some implementations, interconnect structures 218 and/or 220 may include one or more liner layers and the conductive material(s). The one or more liner layers may include a barrier liner included to prevent material migration from the conductive material(s) into the surrounding dielectric layers, an adhesion layer included to promote adhesion between the conductive material(s) and the surrounding dielectric layers, and/or another type of liner layer. Examples of liner layers include tantalum (Ta), tantalum nitride (TaN), indium oxide (InO), tungsten nitride (WN), titanium nitride (TiN), and/or another suitable liner layer, among other examples.

The capacitor structure 224 may include a deep trench capacitor structure (DTC structure) having a relatively high aspect ratio between the height of the capacitor structure 224 and a width or critical dimension (CD) of the capacitor structure 224. The capacitor structure 224 may include sidewalls 322 and a bottom surface 324 connecting the sidewalls 322. The capacitor structure 224 may be coupled with the interconnect structure 220 at the bottom surface 324 of the capacitor structure 224. The capacitor structure 224 may be located in the dielectric layers 308 and 310, with the bottom surface 324 of the capacitor structure 224 extending through the dielectric layer 308 such that the bottom surface 324 is located in the dielectric layer 308.

As further shown in FIG. 3A, the capacitor structure 224 may include a plurality of layers, such as a conductive layer 326 over and/or on the sidewalls 322 and bottom surface 324, a dielectric layer 328 over and/or on the conductive layer 326, and another conductive layer 330 over and/or on the dielectric layer 328. The conductive layers 326 and 330 may correspond to the electrical conductors or electrodes of the capacitor structure 224, and the dielectric layer 328 may correspond to the dielectric medium between the electrodes, thereby enabling a charge to be stored in the capacitor structure 224 based on an electric field between the electrodes. The deep trench structure of the capacitor structure 224 enables the surface area of the conductive layers 326 and 330 to be increased with minimal increase to the horizontal footprint of the capacitor structure 224, which increases the capacitive storage capacity of the capacitor structure 224.

A ground conductive structure 332 may be included over and/or on the capacitor structure 224. The ground conductive structure 332 may include vias, plugs, trenches, dual damascene structures, and/or another type of conductive structures. The ground conductive structure 332 may be configured as an electrical ground for the volatile memory structure 206. The ground conductive structure 332 may include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples.

FIG. 3B illustrates an example operation of the volatile memory structure 206. As shown in FIG. 3B, the capacitor structure 224 of the volatile memory structure 206 may selectively store a charge 334 corresponding to the logical value stored by the volatile memory structure 206. For example, a charge 334 at a first voltage may correspond to a 1-value, and the absence of the charge 334 in the capacitor structure 224 may correspond to a second voltage at a 0-value. A flow path 336 between the bit line conductive structure 222 and the capacitor structure 224 may enable the volatile memory structure 206 to be selectively programmed (e.g., written to), read from, or erased.

For example, the charge 334 may be provided to the capacitor structure 224 from the bit line conductive structure 222 to write a logical value to the volatile memory structure 206. Here, the charge 334 traverses along the flow path 336 from the bit line conductive structure 222, through the interconnect structure 218, through the source/drain region 214, through the channel layer 212 of the transistor structure 312, through the source/drain region 216, and through the interconnect structure 220 to the capacitor structure 224. A current or a voltage may be applied to the gate structure 210 from the word line conductive structure 314 to enable the charge 334 to flow through the channel layer 212. Moreover, a voltage may be applied to the bit line conductive structure 222 such that the electrical potential on the conductive layer 326 is greater relative to the electrical potential on the conductive layer 330 (which is grounded to 0 volts) to facilitate charging of the capacitor structure 224 through the transistor structure 312.

To read from or erase the logical value stored by the volatile memory structure 206, a current or a voltage may be applied to the gate structure 210 from the word line conductive structure 314 to enable the charge 334 to flow through the channel layer 212. The voltage may be removed from the bit line conductive structure 222 such that the charge 334 flows from the capacitor structure 224 to the bit line conductive structure 222 along the flow path 336 through the transistor structure 312.

As indicated above, FIGS. 3A and 3B is provided as an example. Other examples may differ from what is described with regard to FIGS. 3A and 3B.

FIGS. 4A-4D are diagrams of an example implementation 400 of a non-volatile memory structure 208 of a non-volatile memory array 204 included in a semiconductor device described herein. The non-volatile memory structure 208 of the non-volatile memory array 204 may be included in a back end region or BEOL region of the semiconductor device (e.g., the semiconductor device 200, a semiconductor device 700 of FIG. 7).

Figure 4A:
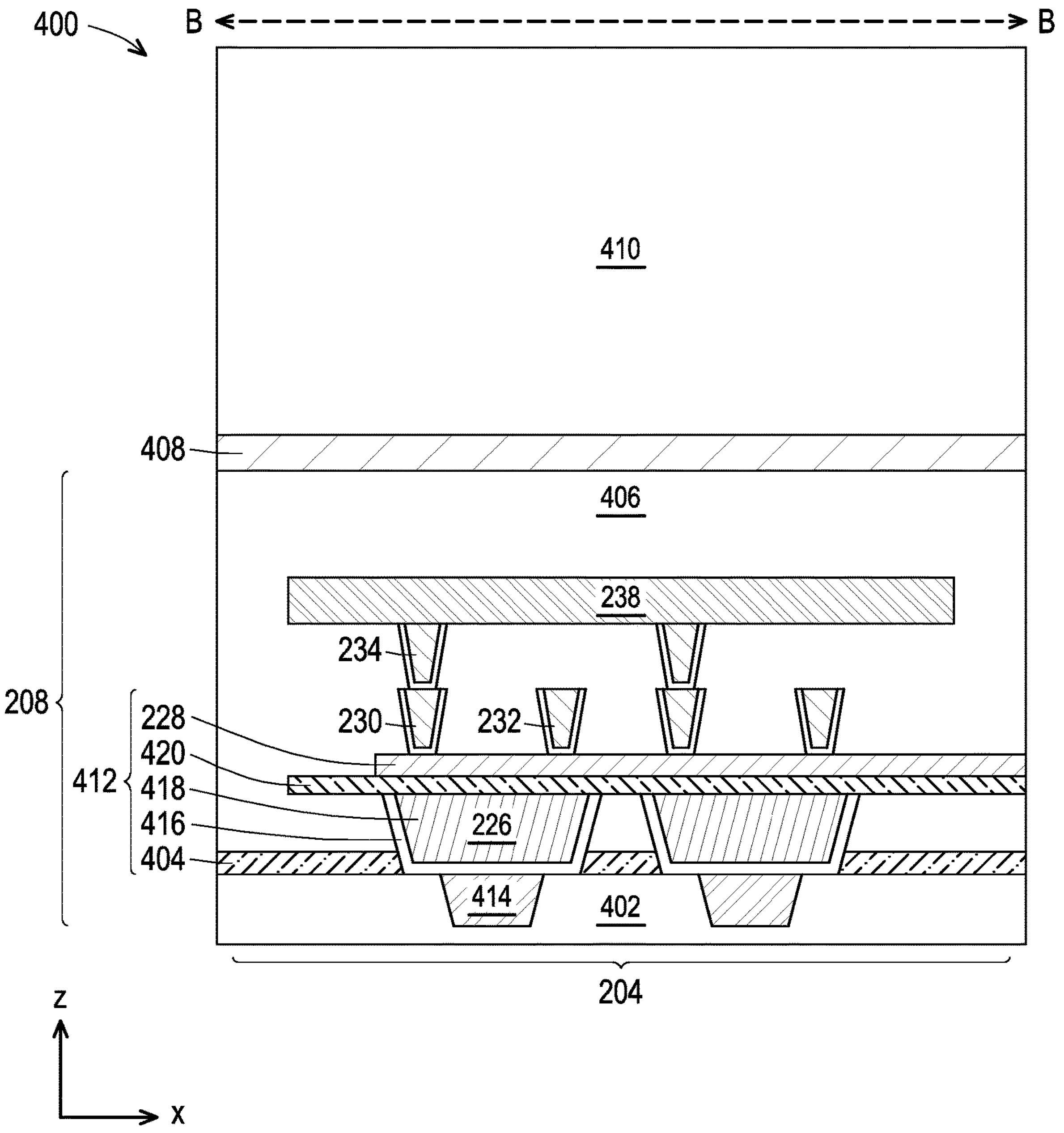
FIGS. 4A-4D are diagrams of an example implementation of a non-volatile memory structure of a non-volatile memory array described herein.
Figure 4B:
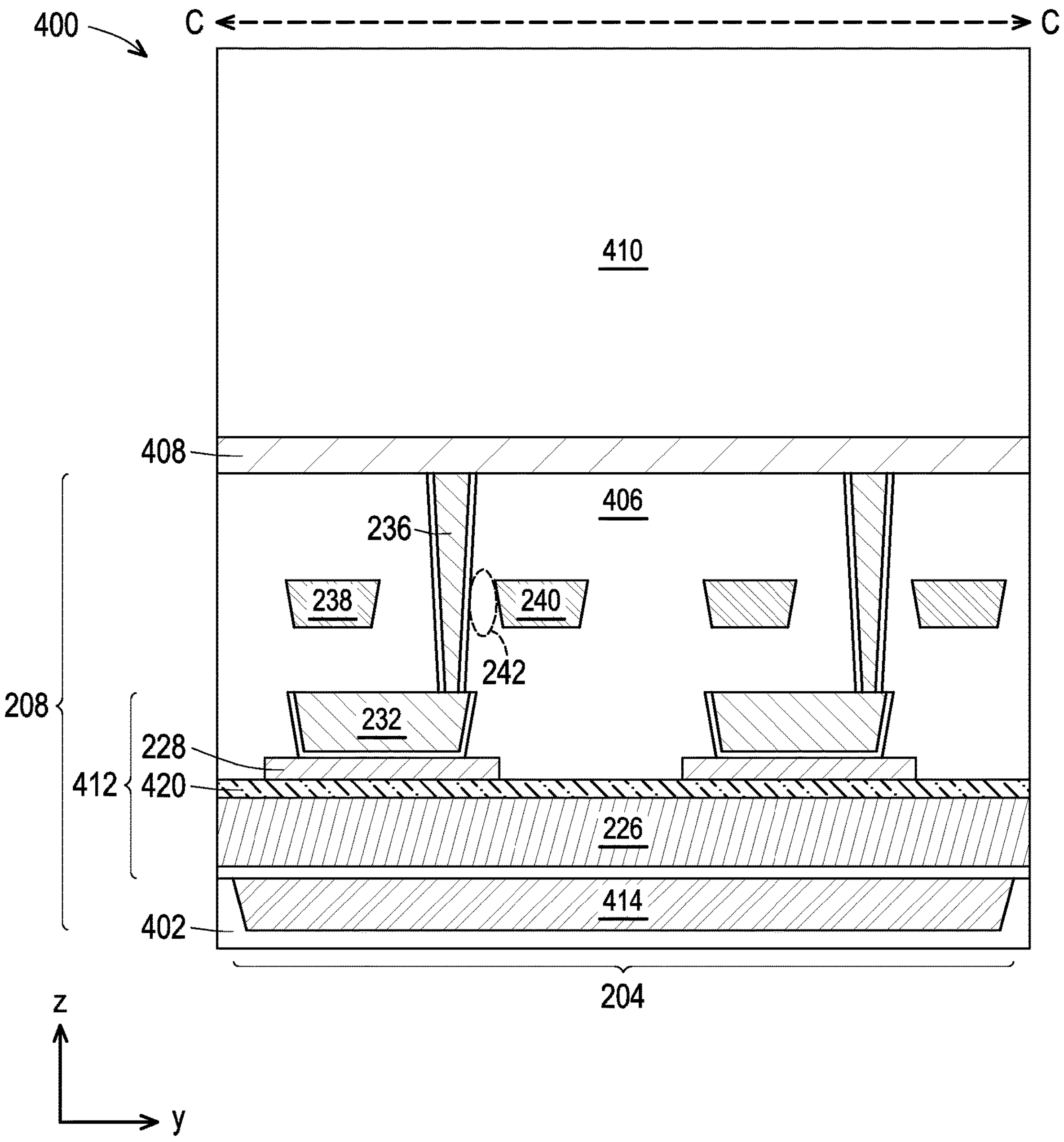
Figure 4C:
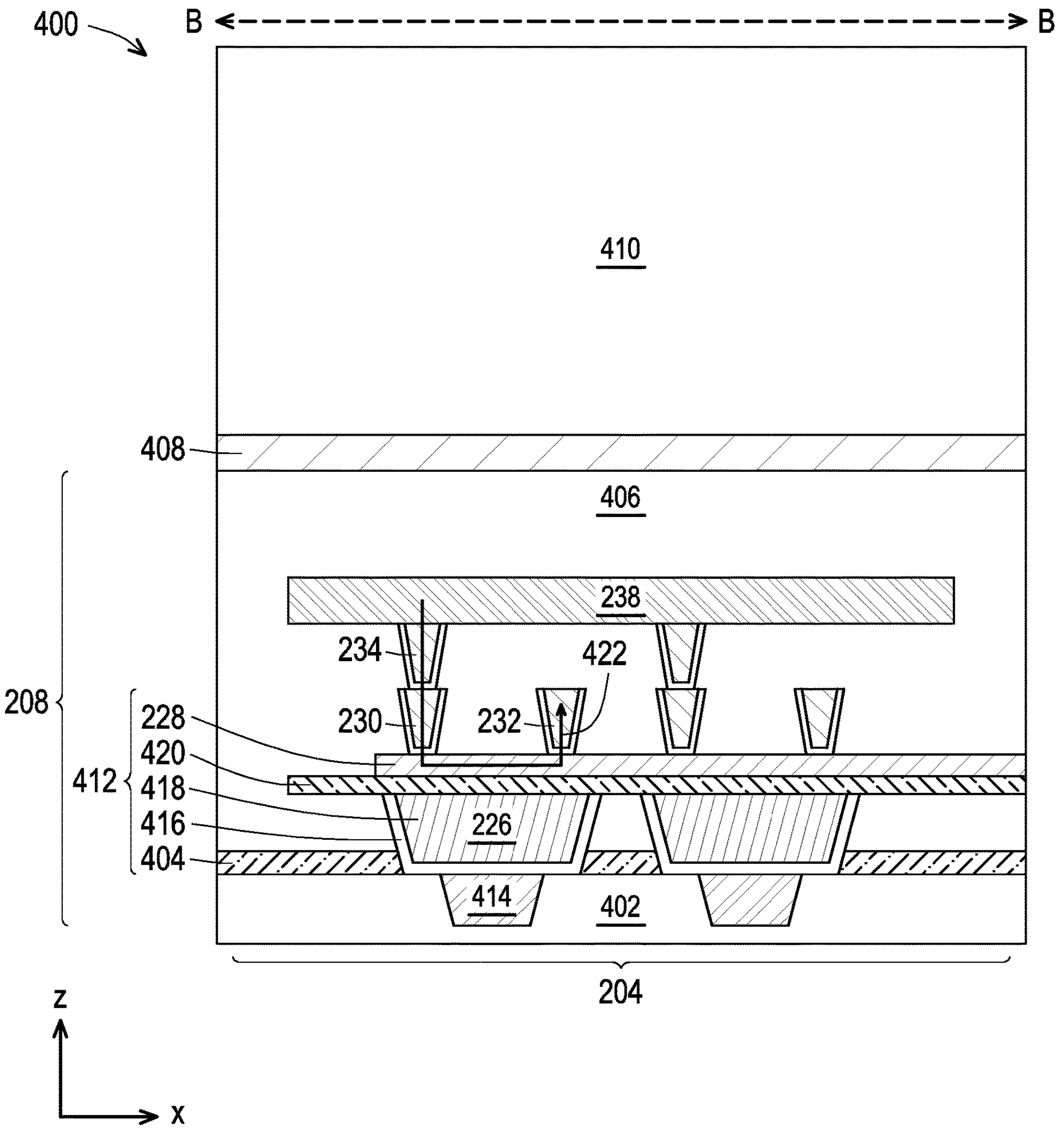
Figure 4D:
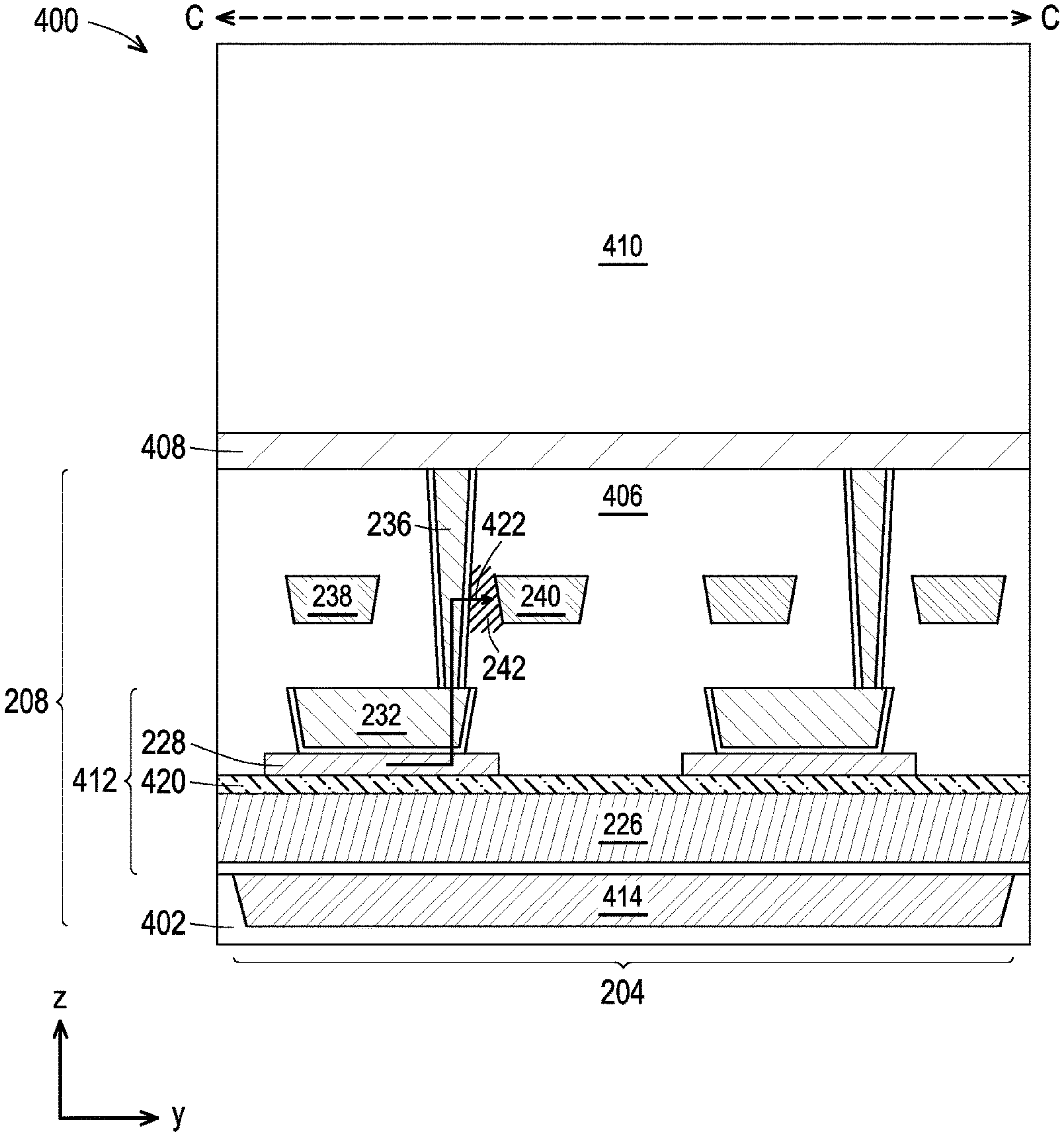

FIGS. 4A-4D illustrate cross-section views of the non-volatile memory structure 208 along one or more cross-sectional planes shown in FIG. 2. For example, FIGS. 4A and 4C illustrate cross-section views of the non-volatile memory structure 208 along a cross-sectional plane B-B shown in FIG. 2. The cross-sectional plane B-B may extend along the x-direction FIG. 2 and may be referred to as an x-cut view of the non-volatile memory structure 208. Thus, FIGS. 4A and 4C illustrate cross-section views of the non-volatile memory structure 208 in an x-z plane. As another example, FIGS. 4B and 4D illustrate cross-section views of the non-volatile memory structure 208 along a cross-sectional plane C-C shown in FIG. 2. The cross-sectional plane C-C may extend along the y-direction FIG. 2 and may be referred to as an y-cut view of the non-volatile memory structure 208. Thus, FIGS. 4B and 4D illustrate cross-section views of the non-volatile memory structure 208 in a y-z plane.

As shown in FIG. 4A, the non-volatile memory array 204 may be included in one or more back end layers of a semiconductor device, such as the semiconductor device 200 and/or the semiconductor device 700, among other examples. In some implementations, the non-volatile memory array 204 may be included in the same back end layers of the semiconductor device as the volatile memory array 202. The back end dielectric layer(s) (e.g., BEOL layers or BEOL dielectric layers) may include a dielectric layer 402 (e.g., an ILD layer), a dielectric layer 404 (e.g., an ESL) over and/or on the dielectric layer 402, a dielectric layer 406 (e.g., another ILD layer) over and/or on the dielectric layer 404, a dielectric layer 408 (e.g., another ESL) over and/or on the dielectric layer 406, and a dielectric layer 410 (e.g., another ILD layer) over and/or on the dielectric layer 408, among other examples. In some implementations, one or more of the dielectric layers 402-410 may include a plurality of layers. For example, the dielectric layer 410 may include a plurality of ILD layers. The dielectric layer 402 may correspond to the dielectric layer 302 (and/or the dielectric layer 302 and the dielectric layer 402 may be the same dielectric layer). The dielectric layer 404 may correspond to the dielectric layer 304 (and/or the dielectric layer 304 and the dielectric layer 404 may be the same dielectric layer). The dielectric layer 406 may correspond to the dielectric layer 306 (and/or the dielectric layer 306 and the dielectric layer 406 may be the same dielectric layer). The dielectric layer 408 may correspond to the dielectric layer 308 (and/or the dielectric layer 308 and the dielectric layer 408 may be the same dielectric layer). The dielectric layer 410 may correspond to the dielectric layer 310 (and/or the dielectric layer 310 and the dielectric layer 410 may be the same dielectric layer).

The dielectric layers 402, 406, and 410 may each include one or more low dielectric constant (low-k) dielectric materials such as a silicon oxide ($SiO_x$), fluoride-doped silicate glass (FSG), and/or another low-k dielectric material. The dielectric layers 404 and 408 may each include one or more high-k dielectric materials to provide etch selectivity relative to the dielectric layers 402, 406, and 410. Examples of high-k dielectric materials include dielectric materials having a dielectric constant greater than the dielectric constant of silicon oxide (approximately 3.6), such as aluminum oxide ($AlO_x$), silicon carbon nitride (SiCN), and/or silicon nitride ($Si_xN_y$), among other examples.

The non-volatile memory structure 208 may be included in the back end dielectric layer(s) of the semiconductor device. The non-volatile memory structure 208 may include an ReRAM memory structure, an OTP anti-fuse memory structure, and/or another type of non-volatile memory structure. The non-volatile memory structure 208 may include a transistor structure 412. The transistor structure 412 may be configured to selectively control electrical pulses (e.g., current pulses, voltage pulses) to a programmable resistance-based memory cell region 242 of the non-volatile memory structure 208. For example, the transistor structure 412 may be repeatedly cycled between an activated state and a deactivated state to enable a plurality of electrical pulses to be provided to through the transistor structure 412.

The non-volatile memory structure 208 may be physically coupled and/or electrically coupled with a word line conductive structure 414 in the dielectric layer 402 below and/or under the transistor structure 412. The word line conductive structure 414 may also be referred to as an access line conductive structure, an address line conductive structure, and/or a row line conductive structure, among other examples. The word line conductive structure 414 may be configured to selectively provide a voltage or current to a gate structure 226 of the transistor structure 412 for performing access operations associated with the non-volatile memory structure 208. The word line conductive structure 414 may include a trench, a via, metal line, a metallization layer, and/or another type of conductive structure. The word line conductive structure 414 may include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples.

The gate structure 226 of the transistor structure 412 may be located over and/or on the word line conductive structure 414. In particular, the gate structure 226 and the word line conductive structure 414 may be in direct physical contact such that a current or a voltage may be directly applied to the gate structure 226 from the word line conductive structure 414. The gate structure 226 may be included in the dielectric layers 404 and 406. The gate structure 226 may include one or more liner layers 416 between a gate electrode 418 of the gate structure 226 and the word line conductive structure 414. The gate electrode 418 may include polysilicon (e.g., polycrystalline silicon), one or more conductive materials, one or more high-k materials, and/or a combination thereof. The liner layer(s) 416 may include adhesion liners (e.g., liners that are included to promote adhesion between the gate electrode 418 and the dielectric layers 404 and 406), barrier layers (e.g., layers that are included to reduce or minimize diffusion of the material of the gate electrode 418 into the dielectric layers 404 and 406 and/or into the word line conductive structure 414), and/or another type of liner layers.

A gate dielectric layer 420 may be included over and/or on the gate structure 226. The gate dielectric layer 420 may be included in the dielectric layer 406. In some implementations, each transistor structure 412 includes a separate gate dielectric layer 420. In some implementations, two or more transistor structures 412 in the non-volatile memory array 204 share the same gate dielectric layer 420. In other words, a gate dielectric layer 420 may extend and/or span across gate structures 226 of a plurality of transistor structures 412. The gate dielectric layer 420 may include one or more dielectric materials, including high-k materials such as hafnium silicate ($HfO_xSi$), zirconium silicate ($ZrSiO_x$), hafnium oxide ($HfO_x$), and/or zirconium oxide ($ZrO_x$), among other examples.

In some implementations, each transistor structure 412 may include a channel layer 228 over and/or on the gate dielectric layer 420. In some implementations, a channel layer 228 may extend across a plurality of gate structures 226 of a plurality of transistor structures 412 included in the non-volatile memory array 204. The channel layer 228 may include one or more semiconductor materials, such as silicon (Si), germanium (Ge), doped silicon, doped germanium, indium zinc oxide (InZnO), indium tin oxide (InSnO), indium oxide ($In_xO_y$ such as $In_2O_3$), gallium oxide ($Ga_xO_y$ such as $Ga_2O_3$), indium gallium zinc oxide (InGaZnO), zinc oxide (ZnO), aluminum zinc oxide ($Al_xO_yZn_z$ such as $Al_2O_5Zn_2$), aluminum doped zinc oxide, titanium oxide ($TiO_x$), III-V semiconductor materials, and/or combinations (e.g., alloys or stacked layers) of semiconductor materials, among other examples. This enables a conductive channel to be selectively formed in the channel layer 228 based on current or a voltage being applied to the gate structure 210.

Source/drain regions 230 and 232 may be included over and/or on the channel layer 228. The source/drain regions 230 and 232 may be electrically coupled with channel layer 228 such that current is selectively permitted to flow between the source/drain regions 230 and 232 through the channel layer 228. The source/drain regions 230 and 232 may each include one or more semiconductor materials, such as silicon (Si), germanium (Ge), doped silicon, and/or doped germanium, among other examples. In some implementations, the source/drain regions 230 and/or 232 may include one or more liner layers and a conductive material (or a semiconductive materials). The one or more liner layers may include a barrier liner included to prevent material migration from the conductive material into the surrounding dielectric layers, an adhesion layer included to promote adhesion between the conductive material and the surrounding dielectric layers, and/or another type of liner layer. Examples of conductive materials include copper (Cu), cobalt (Co), ruthenium (Ru), titanium (Ti), tungsten (W), gold (Au), and/or silver (Ag), among other examples. Examples of liner layers include tantalum (Ta), tantalum nitride (TaN), indium oxide (InO), tungsten nitride (WN), titanium nitride (TiN), and/or another suitable liner layer, among other examples.

The source/drain regions 230 and 232 may be respectively coupled with interconnect structures. For example, and as shown in FIG. 4A, the source/drain region 230 may be coupled with an interconnect structure 234 that is located over and/or on the source/drain region 230. The interconnect structure 234 may electrically couple the source/drain region 230 with a bit line conductive structure 238. The bit line conductive structure 238 may also be referred to as a column line conductive structure. The bit line conductive structure 238 may be located over and/or on the interconnect structure 234, and may be configured to selectively provide one or more electrical pulses to a programmable resistance-based memory cell region 242 of the non-volatile memory structure 208 through the transistor structure 412. As shown in FIG. 4A, the bit line conductive structure 238 may extend along the x-direction in the semiconductor device.

As shown in FIG. 4B, the source/drain region 232 may be coupled with an interconnect structure 236 that is located over and/or on the source/drain region 232. The interconnect structure 236 may be located between the bit line conductive structure 238 and a select line conductive structure 240. Portions of the dielectric layer 406 may be included between the interconnect structure 236 and the bit line conductive structure 238, and between the interconnect structure 236 and the select line conductive structure 240, such that the interconnect structure 236 is physically isolated and electrically isolated from the bit line conductive structure 238 and the select line conductive structure 240. The physical and electrical isolation between the interconnect structure 236 and the select line conductive structure 240 enables the portion of the dielectric layer 406 between the interconnect structure 236 and the select line conductive structure 240 to function as a programmable resistance-based memory cell region 242 of the non-volatile memory structure 208. The portion of the dielectric layer 406 (e.g., an oxide dielectric material) between the interconnect structure 236 and the select line conductive structure 240 provides electrical resistance (e.g., a high electrical resistance, such as an "open-circuit" resistance) in the programmable resistance-based memory cell region 242 when the programmable resistance-based memory cell region 242 is in an unprogrammed or erased state. The portion of the dielectric layer 406 between the interconnect structure 236 and the select line conductive structure 240 may be modified to reduce the electrical resistance (e.g., a low electrical resistance, such as a "short-circuit" resistance) in the programmable resistance-based memory cell region 242 when the programmable resistance-based memory cell region 242 is in a programmed state.

In some implementations, interconnect structures 234 and/or 236 may include one or more liner layers and the conductive material(s). The one or more liner layers may include a barrier liner included to prevent material migration from the conductive material(s) into the surrounding dielectric layers, an adhesion layer included to promote adhesion between the conductive material(s) and the surrounding dielectric layers, and/or another type of liner layer. Examples of liner layers include tantalum (Ta), tantalum nitride (TaN), indium oxide (InO), tungsten nitride (WN), titanium nitride (TiN), and/or another suitable liner layer, among other examples.

As further shown in FIG. 4B, a top surface of the interconnect structure 236 may be located at a greater height in the semiconductor device relative to a top surface of the bit line conductive structure 238 and relative to a top surface of the select line conductive structure 240. This enables the interconnect structure 236 to be formed in the same set of one or more semiconductor processing operations as the interconnect structure 220 included in the volatile memory structure 206 of the volatile memory array 202. The interconnect structure 236 may be located closer to the select line conductive structure 240 than the bit line conductive structure 238. The greater spacing between the interconnect structure 236 and the bit line conductive structure 238 enables the portion of the dielectric layer 406 between the interconnect structure 236 and the bit line conductive structure 238 to provide a relatively high electrical isolation between the interconnect structure 236 and the bit line conductive structure 238, which reduces the amount of and/or likelihood of current leakage between the interconnect structure 236 and the bit line conductive structure 238, and/or reduces the amount of and/or likelihood of parasitic capacitance between the interconnect structure 236 and the bit line conductive structure 238, among other examples.

The lesser spacing between the interconnect structure 236 and the select line conductive structure 240 enables the portion of the dielectric layer 406 between the interconnect structure 236 and the select line conductive structure 240 to function as the programmable resistance-based memory cell region 242. In some implementations, a distance or spacing between the interconnect structure 236 and the select line conductive structure 240 is included in a range of approximately 3 nanometers to approximately 15 nanometers. Forming the interconnect structure 236 and the select line conductive structure 240 such that the spacing between the interconnect structure 236 and the select line conductive structure 240 is included in this range provides sufficient electrical resistance between the interconnect structure 236 and the select line conductive structure 240 while still enabling the programmable resistance-based memory cell region 242 to be selectively programmed to form a conductive path between the interconnect structure 236 and the select line conductive structure 240 through the programmable resistance-based memory cell region 242 when the programmable resistance-based memory cell region 242 is in a programmed state. If the spacing between the interconnect structure 236 and the select line conductive structure 240 is outside of this range, process variations in forming the interconnect structure 236 and the select line conductive structure 240 may result in electrical shorting between the interconnect structure 236 and the select line conductive structure 240 if the distance is too small, whereas a greater power consumption and/or circuit design complexity for the non-volatile memory array 204 may result if the distance is too large (e.g., because of the higher breakdown voltage needed to modify the electrical resistance in the programmable resistance-based memory cell region 242). However, other values for the range are within the scope of the present disclosure. In some implementations, the spacing between the interconnect structure 236 and the select line conductive structure 240 may be selected based on one or more parameters for the non-volatile memory structure 208, such as the semiconductor processing node used to manufacture the non-volatile memory structure 208, a target breakdown voltage for the non-volatile memory structure 208, a device pitch for the non-volatile memory structure 208, an operating voltage for the non-volatile memory structure 208, and/or another parameter.

The interconnect structures 234 and 236, the bit line conductive structure 238, and the select line conductive structure 240, may each include vias, plugs, trenches, dual damascene structures, and/or another type of conductive structures. The interconnect structures 234 and 236, the bit line conductive structure 238, and the select line conductive structure 240, may each include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples.

FIGS. 4C and 4D illustrate an example operation of the non-volatile memory structure 206. The example operation may include an example programming operation or an example erase operation. As shown in FIG. 4C, an electrical pulse 422 (e.g., a current pulse, a voltage pulse) may be provided from the bit line conductive structure to the channel layer 228 of the transistor structure 412 through the interconnect structure 234 and the source/drain region 230. A current or a voltage may be applied to the gate structure 226 from the word line conductive structure 414 to enable the electrical pulse 422 to flow through the channel layer 228 to the source/drain region 232.

As shown in FIG. 4D, the electrical pulse 422 may be provided to the programmable resistance-based memory cell region 242 between the interconnect structure 236 and the select line conductive structure 240. The electrical pulse 422 may result in the formation of an electric field in the programmable resistance-based memory cell region 242, which causes dielectric breakdown (e.g., oxide breakdown) to occur in the programmable resistance-based memory cell region 242. The dielectric breakdown modifies the electrical resistance of the dielectric material of the dielectric layer 406 between the interconnect structure 236 and the select line conductive structure 240, which may reduce the electrical resistance in the programmable resistance-based memory cell region 242. Electrical pulses 422 may be repeatedly applied to the programmable resistance-based memory cell region 242 in a similar manner until a conductive path forms between the interconnect structure 236 and the select line conductive structure 240 through the programmable resistance-based memory cell region 242. This may be referred to as a programmed state of the non-volatile memory structure 208.

In some implementations, the magnitude of the electrical pulse 422 (e.g., referred to as the breakdown voltage) may be selected to enable the dielectric breakdown in the programmable resistance-based memory cell region 242 to be either reversable or permanent. Higher breakdown voltages may be used to achieve a greater amount of dielectric breakdown in the programmable resistance-based memory cell region 242, and therefore may be used to implement one-time programmable anti-fuse operation in the non-volatile memory structure 208 (e.g., such that the non-volatile memory structure 208 is configured to be programmed for a single programming operation). Lower breakdown voltages may be used to achieve a lesser amount of dielectric breakdown in the programmable resistance-based memory cell region 242, and therefore may be used to implement ReRAM operation in the non-volatile memory structure 208 (which enables the non-volatile memory structure 208 to be repeatedly programmed and erased in a plurality of program-erase cycles).

To read from the non-volatile memory structure 206, a current or a voltage may be applied to the gate structure 226 from the word line conductive structure 414 to enable an electrical current to flow through the channel layer from the bit line conductive structure 238, through the channel layer 228, through the programmable resistance-based memory cell region 242, and to the select line conductive structure 240. The electrical current may be measured to determine a voltage drop across the programmable resistance-based memory cell region 242, which may be based on the electrical resistance of the programmable resistance-based memory cell region 242. A high electrical resistance may correspond to a first logic value (e.g., a “0” value or a “1” value) stored by the non-volatile memory structure 208, whereas a low electrical resistance may correspond to a second logic value stored by the non-volatile memory structure 208.

As indicated above, FIGS. 4A-4D are provided as an example. Other examples may differ from what is described with regard to FIGS. 4A-4D.

FIGS. 5A-5K are diagrams of an example implementation 500 of forming a volatile memory structure 206 of a volatile memory array 202 described herein. The example implementation 600 may include an example process for forming the volatile memory structure 206 of the volatile memory array 202 in the back end region (e.g., BEOL region) of the semiconductor device 200 of FIG. 2 and/or of a semiconductor device 700 of FIG. 7 described herein. In some implementations, one or more of the processing operations described in connection with FIGS. 5A-5K may be performed by one or more of the semiconductor processing tools 102-112 and/or the wafer/die transport tool 114. In some implementations, one or more of the processing operations described in connection with FIGS. 5A-5K may be performed by another semiconductor processing tool not shown in FIG. 1. In some implementations, one or more of the processing operations described in connection with FIGS. 5A-5K may be performed after front end processing of the semiconductor device.

Figure 5A:
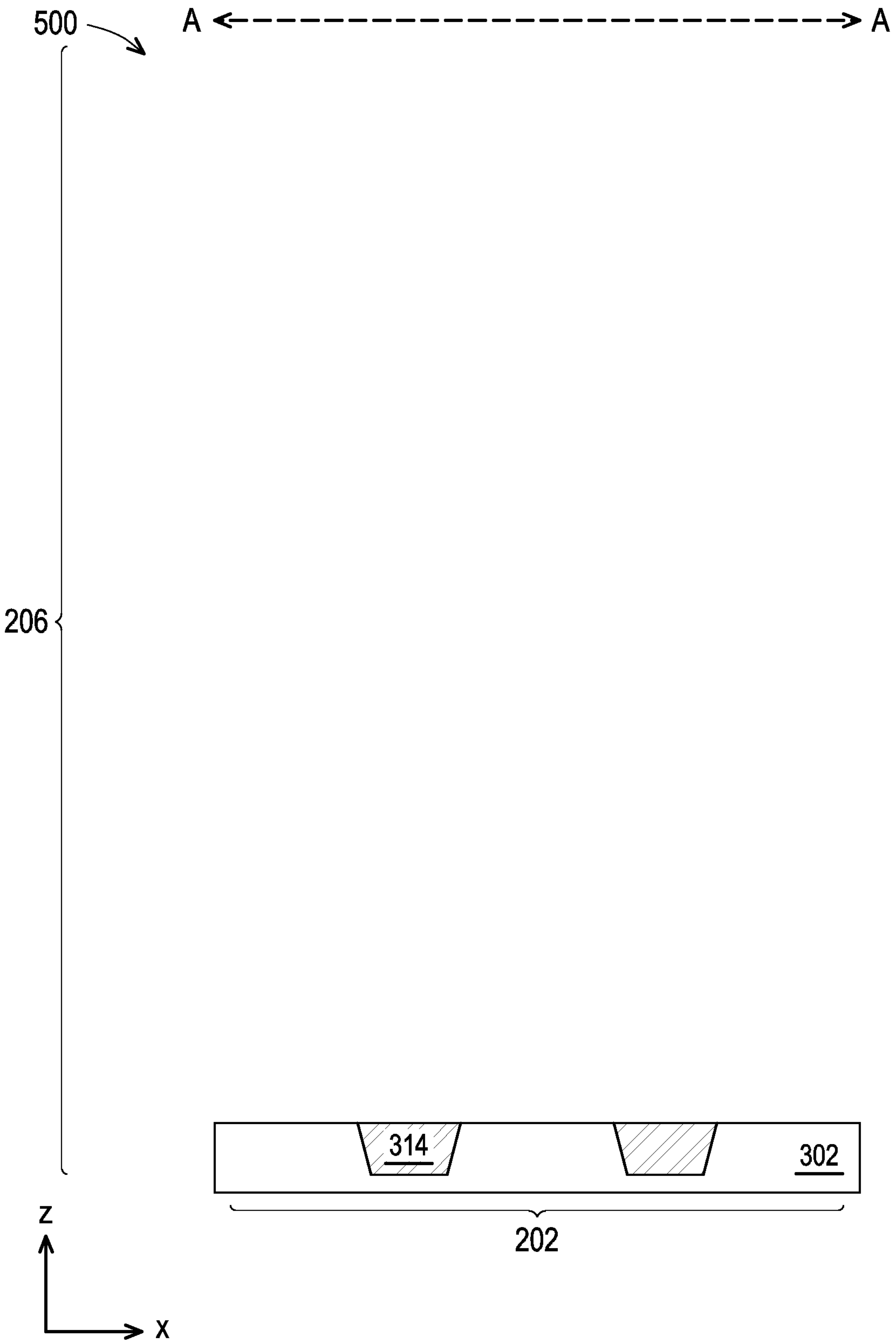
FIGS. 5A-5K are diagrams of an example implementation of forming a volatile memory structure of a volatile memory array described herein.

As shown in FIG. 5A, the dielectric layer 302 may be formed. The deposition tool 102 may deposit the dielectric layer 302 using a CVD technique, a PVD technique, an ALD technique, another deposition technique described above in connection with FIG. 1, and/or a deposition technique other than as described above in connection with FIG. 1.

As further shown in FIG. 5A, a word line conductive structure 314 may be formed in dielectric layer 302 in the volatile memory array 202. In some implementations, a pattern in a photoresist layer is used to form a recess in the dielectric layer 302. In these implementations, the deposition tool 102 forms the photoresist layer on the dielectric layer 302. The exposure tool 104 exposes the photoresist layer to a radiation source to pattern the photoresist layer. The developer tool 106 develops and removes portions of the photoresist layer to expose the pattern. The etch tool 108 etches into the dielectric layer 302 based on the pattern to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

In some implementations, a hard mask layer is used as an alternative technique for forming the recess based on a pattern.

The deposition tool 102 and/or the plating tool 112 may deposit the word line conductive structure 314 in the recess using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the word line conductive structure 314 after the word line conductive structure 314 is deposited.

Figure 5B:
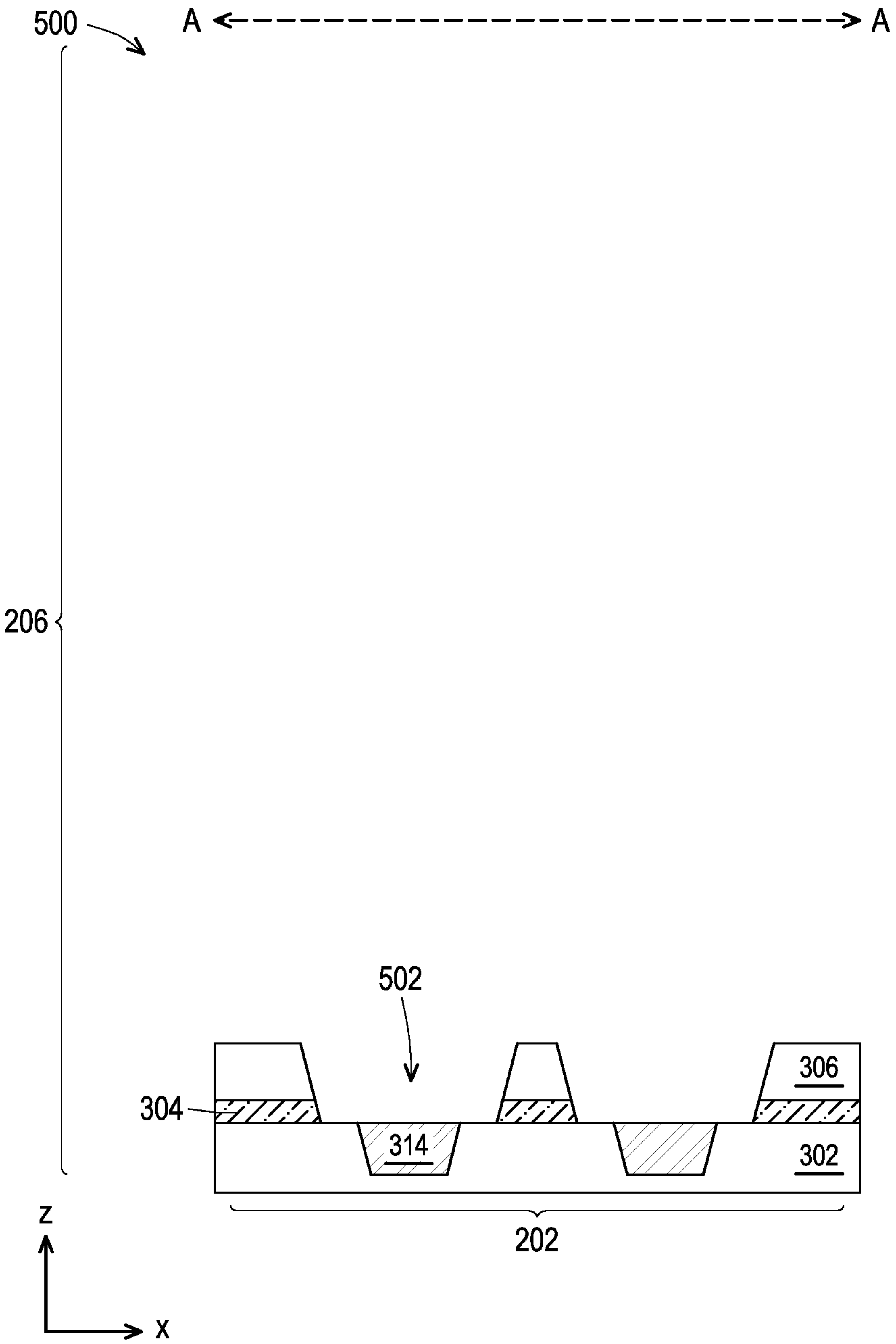

As shown in FIG. 5B, the dielectric layer 304 may be formed over and/or on the dielectric layer 302, and over and/or on the word line conductive structure 314. Moreover, the dielectric layer 306 (or a portion thereof) may be formed over and/or on the dielectric layer 304. The deposition tool 102 may deposit the dielectric layer 304 and the dielectric layer 306 using a CVD technique, a PVD technique, an ALD technique, another deposition technique described above in connection with FIG. 1, and/or a deposition technique other than as described above in connection with FIG. 1.

As further shown in FIG. 5B, a recess 502 may be formed in and/or through the dielectric layers 304 and 306 in the volatile memory array 202. In particular, the recess 502 may be formed over the word line conductive structure 314. The recess 502 may be formed fully through the dielectric layers 304 and 306 such that the top surface of the word line conductive structure 314 is exposed through the recess 502. In some implementations, a pattern in a photoresist layer is used to form the recess 502 in the dielectric layers 304 and 306. In these implementations, the deposition tool 102 forms the photoresist layer on the dielectric layer 306. The exposure tool 104 exposes the photoresist layer to a radiation source to pattern the photoresist layer. The developer tool 106 develops and removes portions of the photoresist layer to expose the pattern. The etch tool 108 etches into the dielectric layers 304 and 306 based on the pattern to form the recess 502. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess 502 based on a pattern.

Figure 5C:
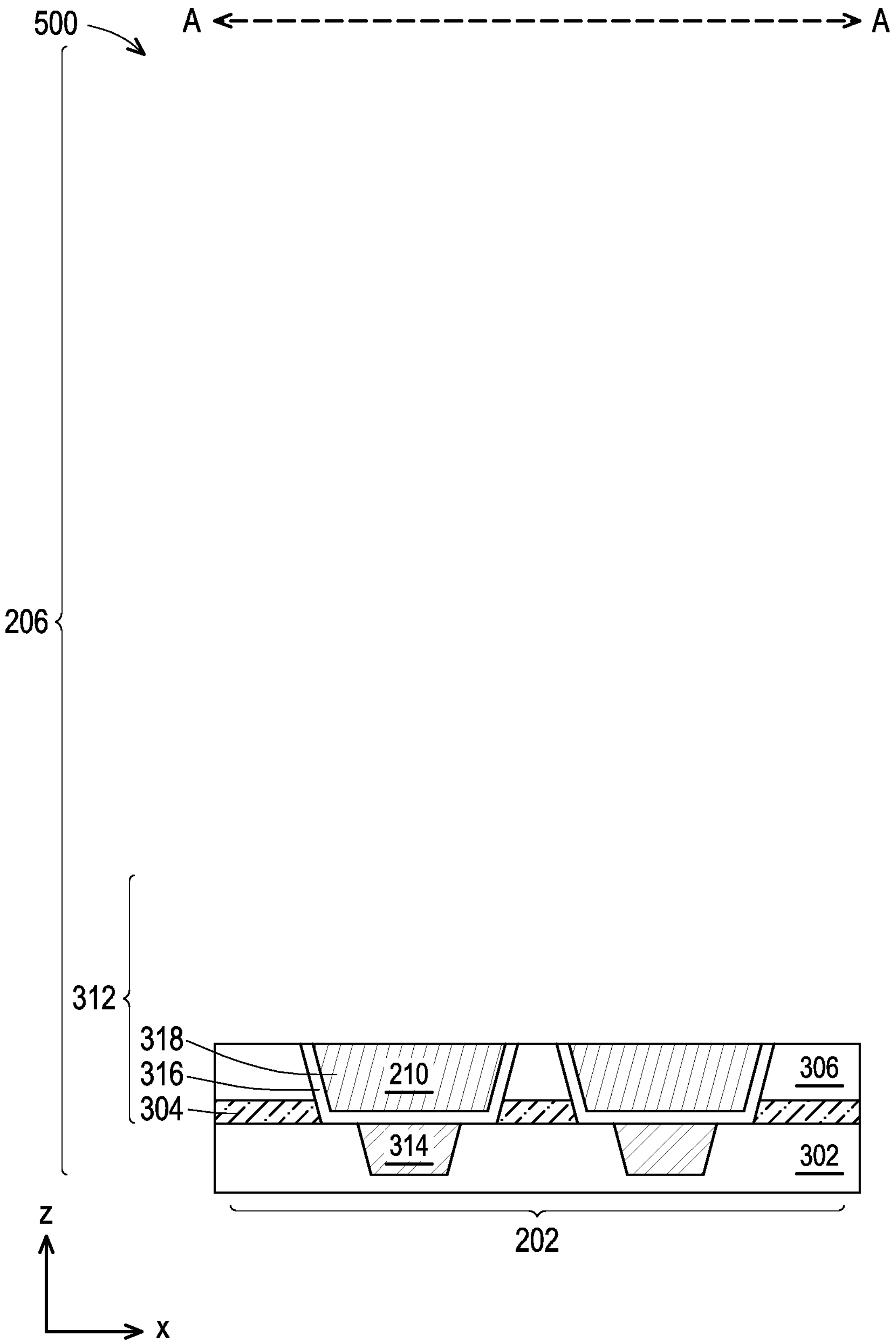

As shown in FIG. 5C, a gate structure 210 of a transistor structure 312 of the volatile memory structure 206 may be formed in the recess 502 over the word line conductive structure 314. The gate structure 210 may be formed directly on the word line conductive structure 314 such that the gate structure 210 and the word line conductive structure 314 are in direct physical contact and electrically coupled. To form the gate structure 210, the deposition tool 102 and/or the plating tool 112 may deposit the liner layer(s) 316 in the recess 502 using a CVD technique, a PVD technique, an ALD technique, an electroplating technique, another deposition technique described above in connection with FIG. 1, and/or a deposition technique other than as described above in connection with FIG. 1. The deposition tool 102 and/or the plating tool 112 may deposit the gate electrode 318 over and/or on the liner layer(s) 316 in the recess 502 using a CVD technique, a PVD technique, an ALD technique, an electroplating technique, another deposition technique described above in connection with FIG. 1, and/or a deposition technique other than as described above in connection with FIG. 1.

Figure 5D:
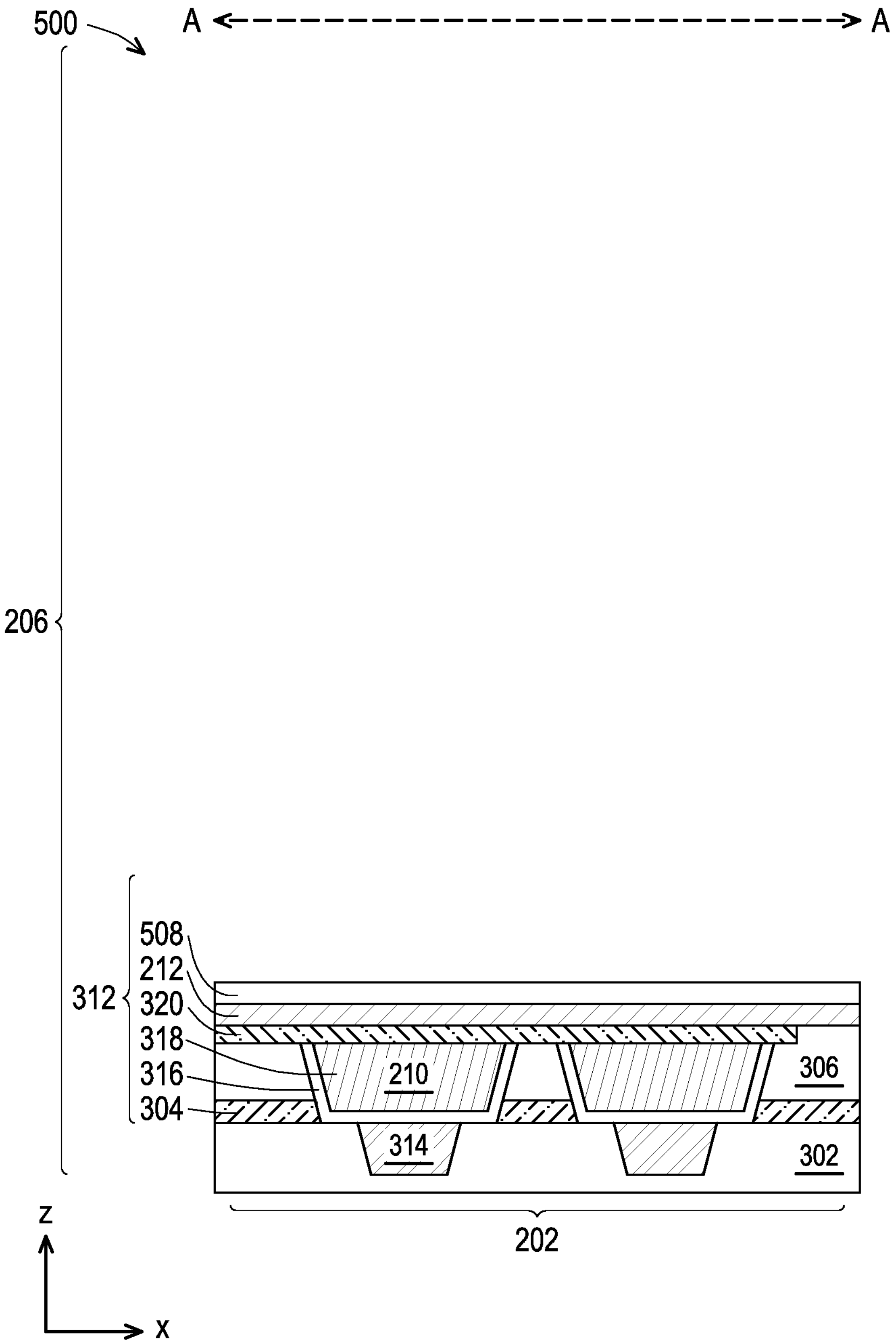

As shown in FIG. 5D, a plurality of layers may be formed over and/or on the dielectric layer 306 and over and/or on the gate structure 210. For example, a dielectric layer 504 may be formed over and/or on the dielectric layer 306 and over and/or on the gate structure 210. As another example, a channel material layer 506 may be formed over and/or on the dielectric layer 504. As another example, a dielectric layer 508 may be formed over and/or on the channel material layer 506. The deposition tool 102 may deposit the dielectric layer 504, the channel material layer 506, and the dielectric layer 508 using a CVD technique, a PVD technique, an ALD technique, another deposition technique described above in connection with FIG. 1, and/or a deposition technique other than as described above in connection with FIG. 1.

Figure 5E:
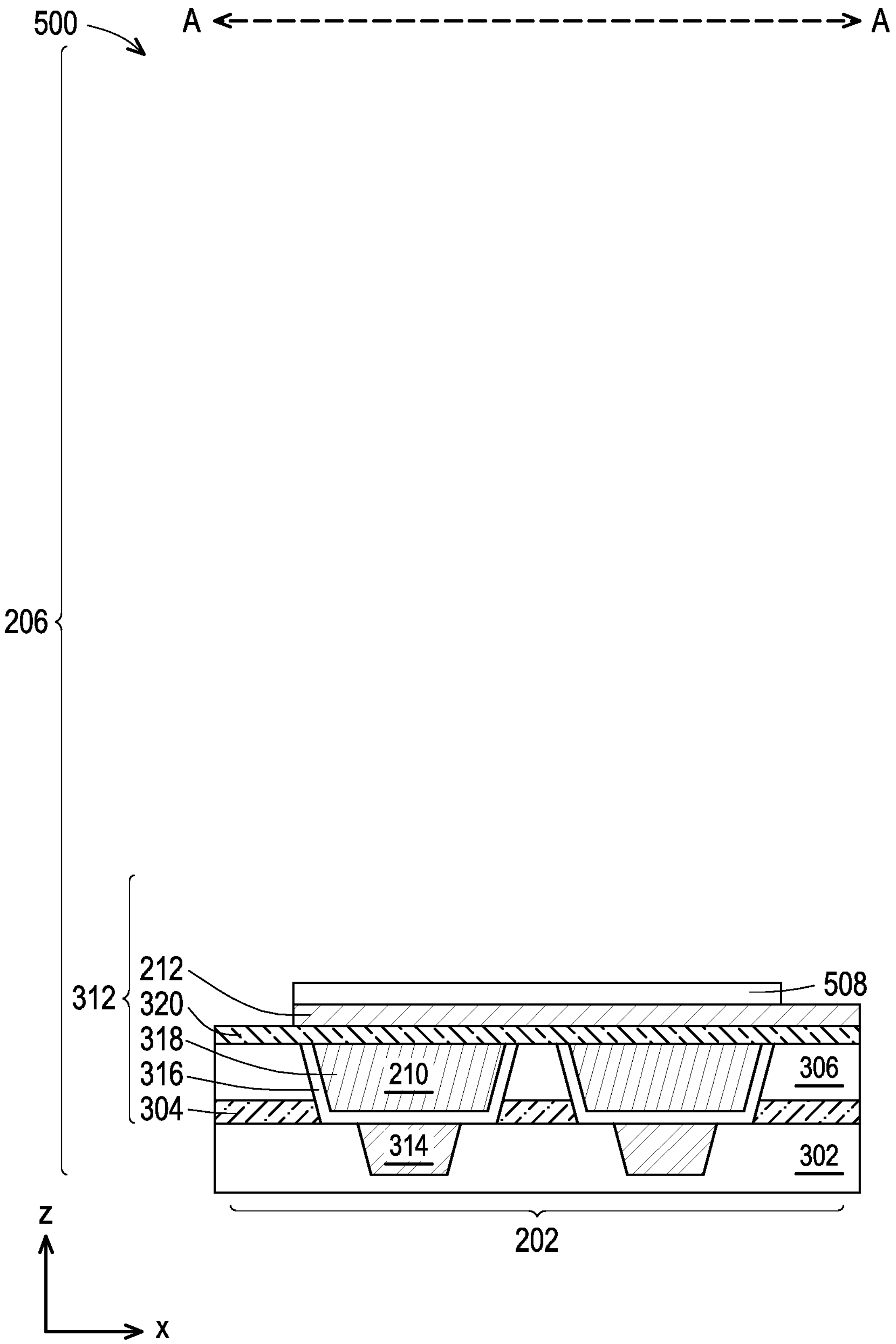

As further shown in FIG. 5E, one or more etch operations may be performed to remove portions of the dielectric layer 504, portions of the channel material layer 506, and/or portions of the dielectric layer 508 to form the channel layer 212 and the gate dielectric layer 320 of the transistor structure 312 over the gate structure 210. The gate dielectric layer 320 may be formed on the gate structure 210, and the channel layer 212 may be formed on the gate dielectric layer 320.

In some implementations, a pattern in a photoresist layer is used to form the channel layer 212 and the gate dielectric layer 320. In these implementations, the deposition tool 102 forms the photoresist layer on the dielectric layer 508. The exposure tool 104 exposes the photoresist layer to a radiation source to pattern the photoresist layer. The developer tool 106 develops and removes portions of the photoresist layer to expose the pattern. The etch tool 108 etches through the dielectric layer 508, through the channel material layer 506, and/or through the dielectric layer 504 based on the pattern. The remaining portions of the channel material layer 506 over the gate structure 210 corresponds to the channel layer 212, and remaining portions of the dielectric layer 504 over the gate structure 210 correspond to the gate dielectric layer 320. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the channel layer 212 and the gate dielectric layer 320 based on a pattern.

Figure 5F:
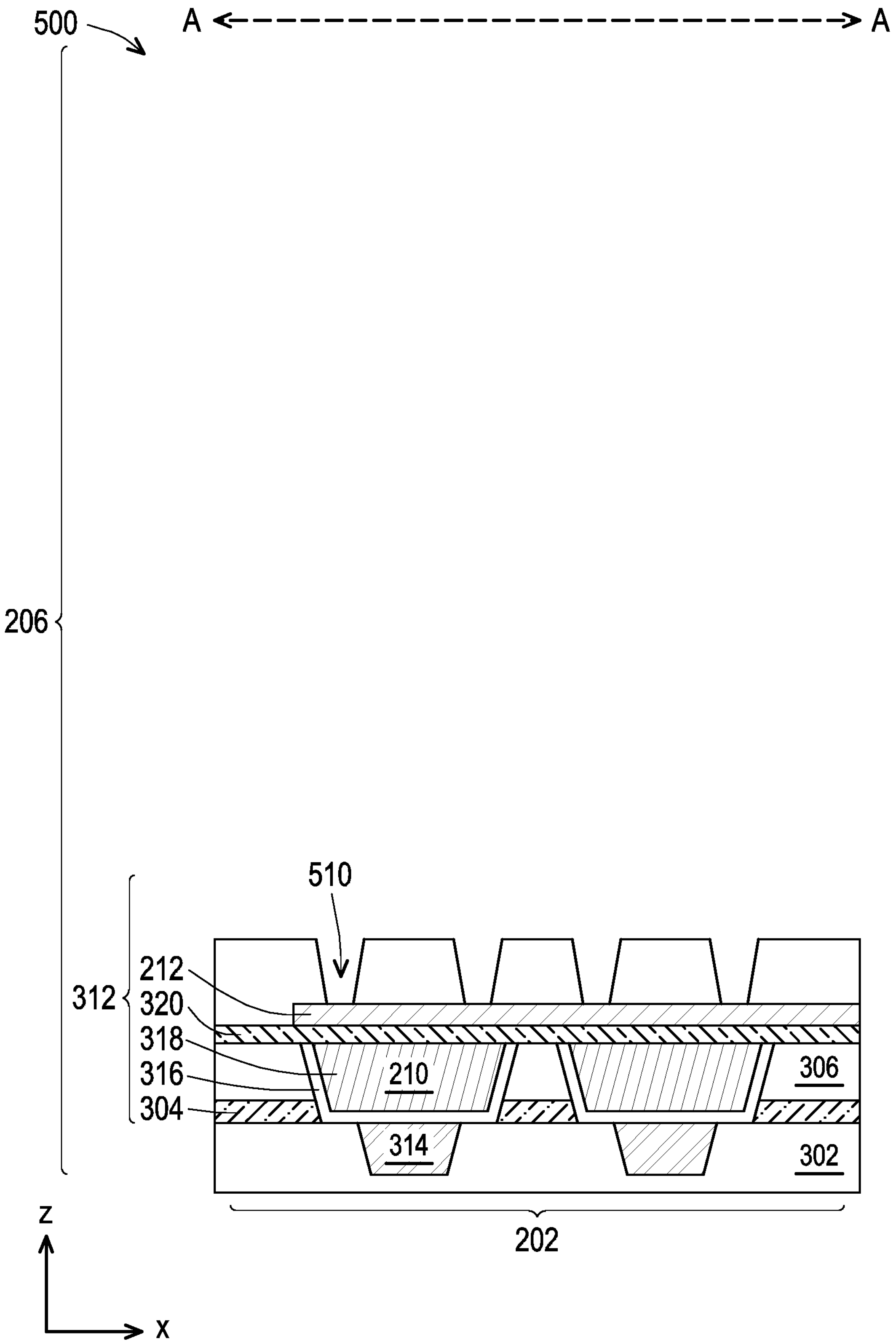

As shown in FIG. 5F, additional dielectric material for the dielectric layer 306 may be deposited in the volatile memory array 202. The additional dielectric material for the dielectric layer 306 may be formed over and/or on the gate dielectric layer 320 and/or over and/or on the channel layer 212. The deposition tool 102 may deposit the additional dielectric material for the dielectric layer 306 using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 306.

As further shown in FIG. 5F, recesses 510 may be formed in the dielectric layer 306 over the channel layer 212 such that portions of the channel layer 212 over the gate structure 210 are exposed through the recesses 510. The recesses 510 may be referred to as source/drain recesses. In some implementations, a pattern in a photoresist layer is used to form the recesses 510 in the dielectric layer 306. In these implementations, the deposition tool 102 forms the photoresist layer on the dielectric layer 306. The exposure tool 104 exposes the photoresist layer to a radiation source to pattern the photoresist layer. The developer tool 106 develops and removes portions of the photoresist layer to expose the pattern. The etch tool 108 etches into the dielectric layer 306 based on the pattern to form the recesses 510. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 510 based on a pattern.

Figure 5G:
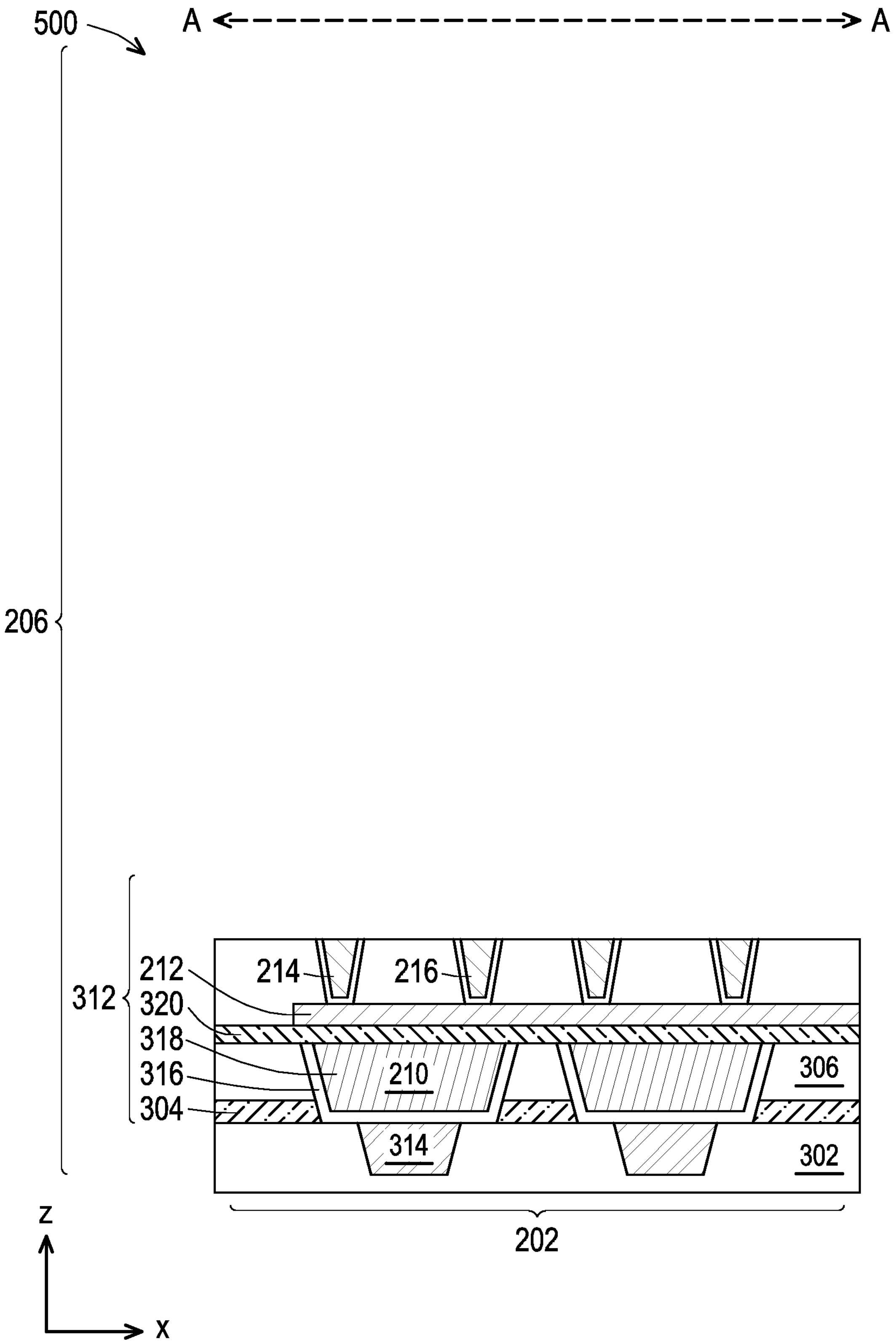

As shown in FIG. 5G, source/drain regions 214 and 216 of the transistor structure 312 may be formed in the recesses 510. The source/drain regions 214 and 216 may be coupled with the channel layer 212. The deposition tool 102 may deposit the source/drain regions 214 and 216 using an epitaxy technique, CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the source/drain regions 214 and 216. In some implementations, one or more liner layers are deposited in the recesses 510 prior to formation of the source/drain regions 214 and 216 to promote adhesion between the dielectric layer 306 and the source/drain regions 214 and 216, and to reduce dopant diffusion into the dielectric layer 306 from the source/drain regions 214 and 216.

Figure 5H:
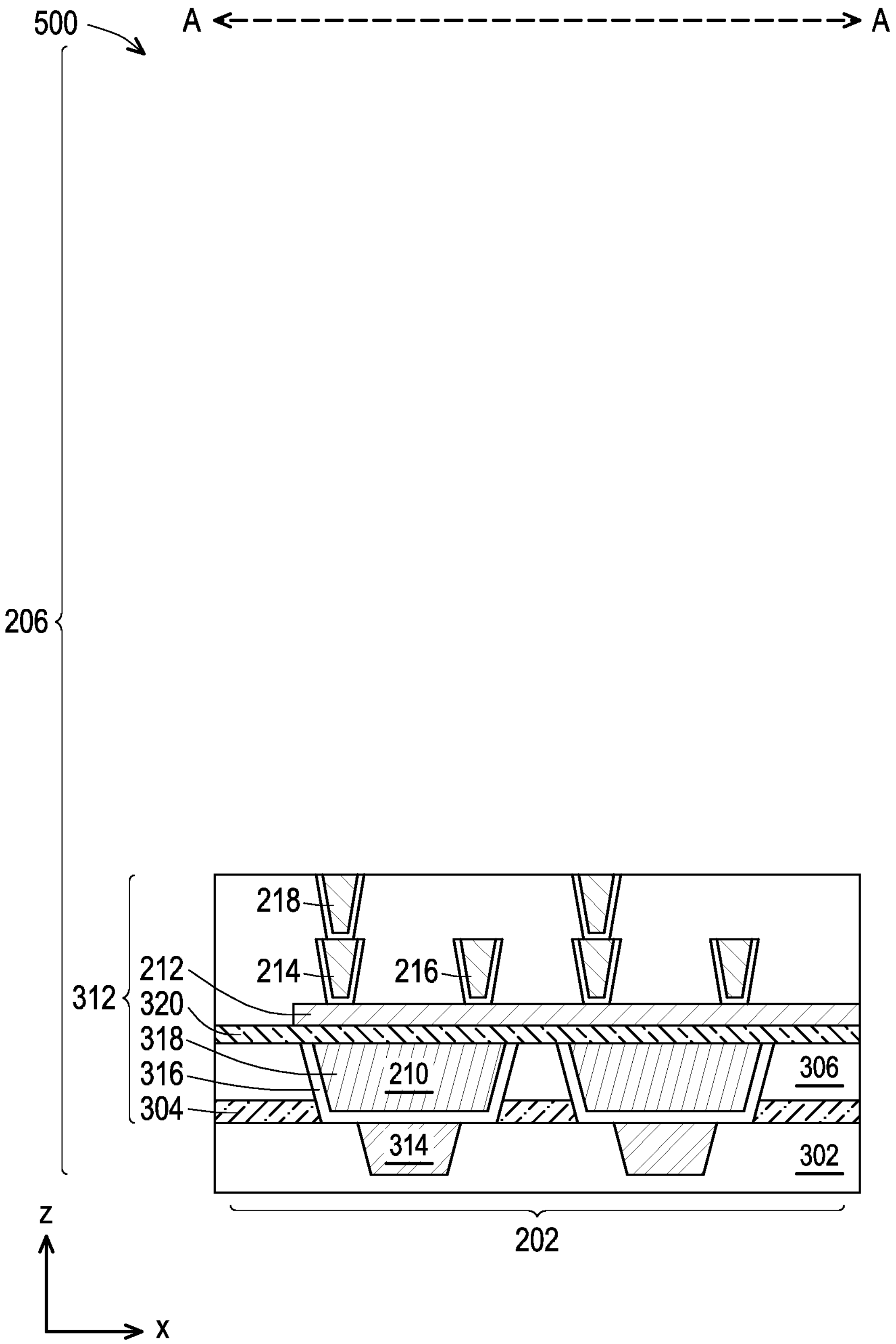

As shown in FIG. 5H, additional dielectric material may be deposited for the dielectric layer 306. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 306.

As further shown in FIG. 5H, an interconnect structure (e.g., a source/drain contact, a source/drain interconnect structure) 218 may be formed in the dielectric layer 306. The interconnect structure 218 may be formed over and/or on the source/drain region 214 such that the interconnect structure 218 is physically coupled and/or electrically coupled with the source/drain region 214.

In some implementations, a pattern in a photoresist layer is used to form a recess in the dielectric layer 306 over and to the source/drain region 214. In these implementations, the deposition tool 102 forms the photoresist layer on the dielectric layer 306. The exposure tool 104 exposes the photoresist layer to a radiation source to pattern the photoresist layer. The developer tool 106 develops and removes portions of the photoresist layer to expose the pattern. The etch tool 108 etches into the dielectric layer 306 based on the pattern to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

In some implementations, a hard mask layer is used as an alternative technique for forming the recesses based on a pattern.

The deposition tool 102 and/or the plating tool 112 may deposit the interconnect structure 218 in the recess using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the interconnect structure 218. In some implementations, one or more liner layers are deposited in the recess prior to formation of the interconnect structure 218 to promote adhesion between the dielectric layer 306 and the interconnect structure 218, and to reduce electron migration into the dielectric layer 306 from the interconnect structure 218.

Figure 5I:
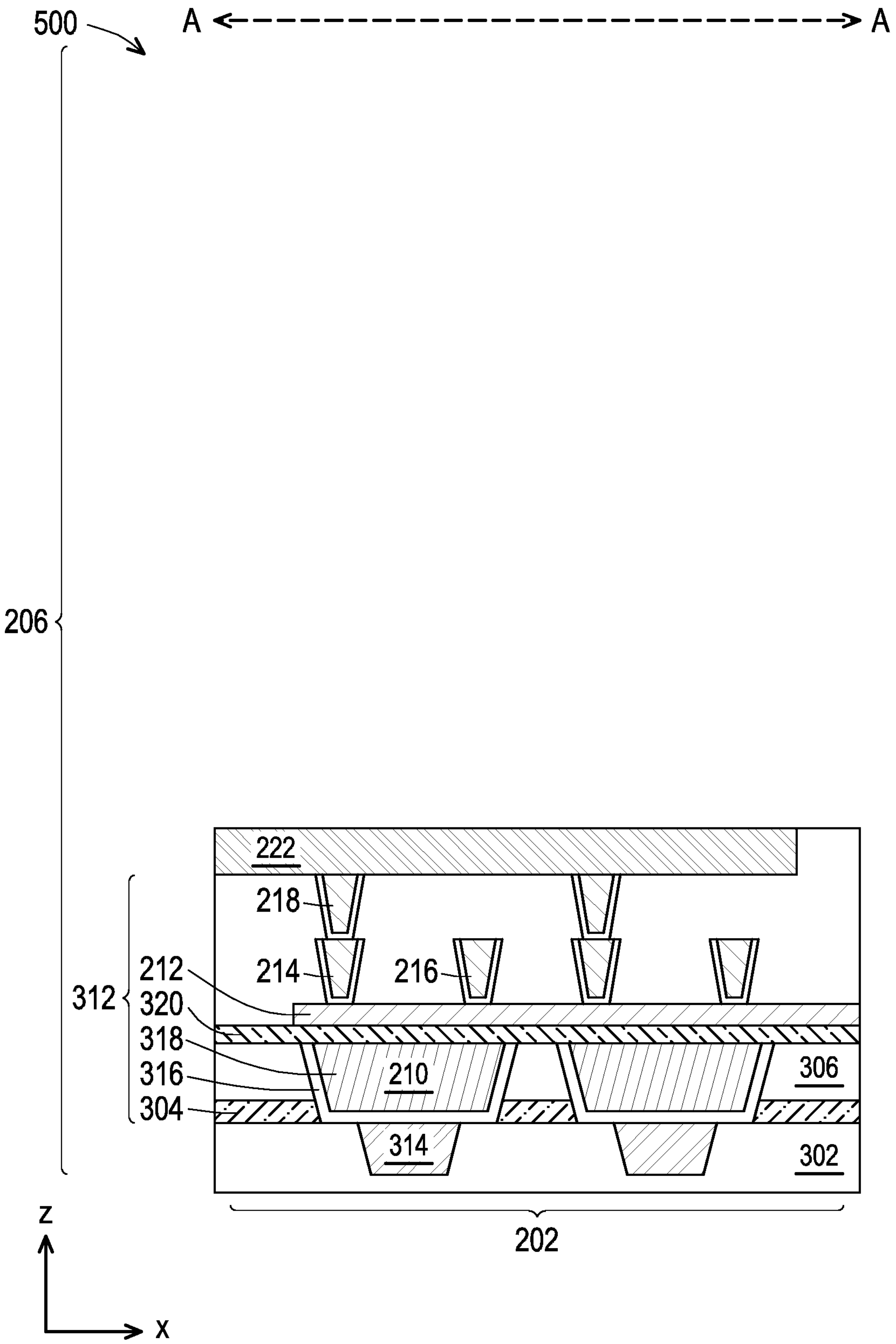

As shown in FIG. 5I, additional dielectric material may be deposited for the dielectric layer 306. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 306.

As further shown in FIG. 5I, a bit line conductive structure 222 of the volatile memory array 202 may be formed in and/or on the dielectric layer 306. The bit line conductive structure 222 may be formed above the transistor structure 312 and over and/or on the interconnect structure 218 such that the interconnect structure 218 is coupled with the bit line conductive structure 222.

In some implementations, a pattern in a photoresist layer is used to form a recess in the dielectric layer 306. In these implementations, the deposition tool 102 forms the photoresist layer on the dielectric layer 306. The exposure tool 104 exposes the photoresist layer to a radiation source to pattern the photoresist layer. The developer tool 106 develops and removes portions of the photoresist layer to expose the pattern. The etch tool 108 etches into the dielectric layer 306 based on the pattern to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess based on a pattern.

The deposition tool 102 and/or the plating tool 112 may deposit the bit line conductive structure 222 in the recess using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the bit line conductive structure 222.

Figure 5J:
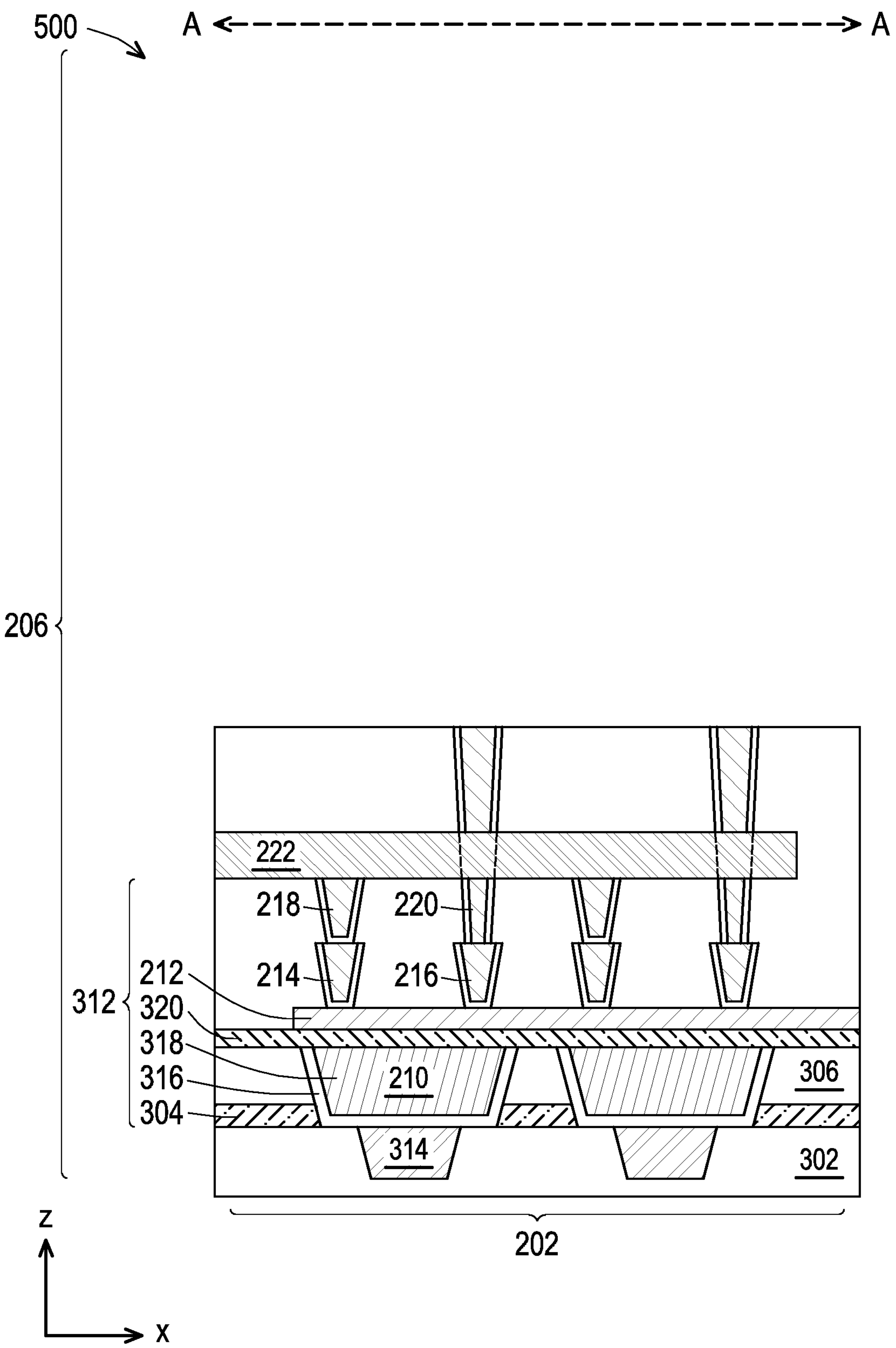

As shown in FIG. 5J, additional dielectric material may be deposited for the dielectric layer 306. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 306.

As further shown in FIG. 5J, an interconnect structure (e.g., a source/drain contact, a source/drain interconnect) 220 may be formed in the dielectric layer 306. The interconnect structure 220 may be formed over and/or on the source/drain region 216 such that the interconnect structure 220 is physically coupled and/or electrically coupled with the source/drain region 216.

In some implementations, a pattern in a photoresist layer is used to form a recess in the dielectric layer 306 over and to the source/drain region 216 such that the source/drain region 216 is exposed through the recess. In these implementations, the deposition tool 102 forms the photoresist layer on the dielectric layer 306. The exposure tool 104 exposes the photoresist layer to a radiation source to pattern the photoresist layer. The developer tool 106 develops and removes portions of the photoresist layer to expose the pattern. The etch tool 108 etches into the dielectric layer 306 based on the pattern to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess based on a pattern.

The deposition tool 102 and/or the plating tool 112 may deposit the interconnect structure 220 in the recess using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the interconnect structure 220. In some implementations, one or more liner layers are deposited in the recesses prior to formation of the interconnect structure 220 to promote adhesion between the dielectric layer 306 and the interconnect structure 220, and to reduce electron migration into the dielectric layer 306 from the interconnect structures 220.

Figure 5K:
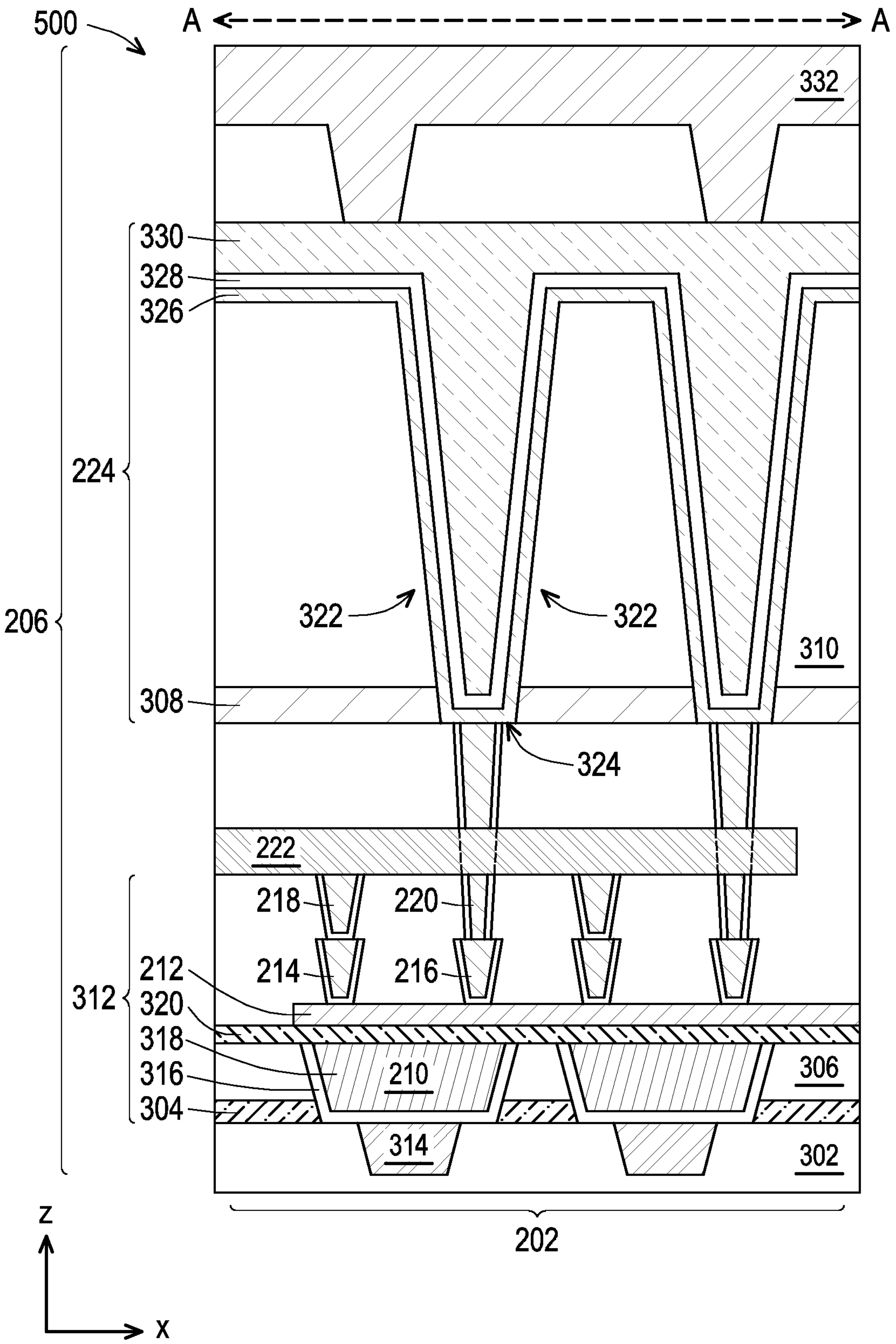

As shown in FIG. 5K, the dielectric layer 308 may be formed over and/or on the dielectric layer 306, and/or over and/or on the interconnect structure 220. The dielectric layer 310 may be formed over and/or on the dielectric layer 308. The deposition tool 102 may deposit the dielectric layers 308 and 310 using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layers 308 and/or 310.

As further shown in FIG. 5K, a capacitor structure 224 may be formed in the volatile memory structure 206 of the volatile memory array 202. The capacitor structure 224 may be electrically coupled with the transistor structure 312 through the interconnect structure 220.

In some implementations, a pattern in a photoresist layer is used to form a recess in the dielectric layers 308 and/or 310 over and to the interconnect structure 220. In these implementations, the deposition tool 102 forms the photoresist layer on the dielectric layer 310. The exposure tool 104 exposes the photoresist layer to a radiation source to pattern the photoresist layer. The developer tool 106 develops and removes portions of the photoresist layer to expose the pattern. The etch tool 108 etches into the dielectric layers 308 and 310 based on the pattern to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess based on a pattern.

The deposition tool 102 and/or the plating tool 112 may deposit the conductive layer 326, the dielectric layer 328, and the conductive layer 330 in the recesses using a CVD technique, a PVD technique, an ALD technique, an electroplating technique, another deposition technique described above in connection with FIG. 1, and/or a deposition technique other than as described above in connection with FIG. 1.

Additional dielectric material may be deposited for the dielectric layer 310 after formation of the capacitor structure 224. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 310.

As further shown in FIG. 5K, the ground conductive structure 332 may be formed in the dielectric layer 310. The ground conductive structure 332 may be formed over and/or on the capacitor structure 224 such that the ground conductive structure 332 is physically coupled and/or electrically coupled with the capacitor structure 224 (e.g., with the conductive layer 330 of the capacitor structure 224).

In some implementations, a pattern in a photoresist layer is used to form a recess in the dielectric layer 310. In these implementations, the deposition tool 102 forms the photoresist layer on the dielectric layer 310. The exposure tool 104 exposes the photoresist layer to a radiation source to pattern the photoresist layer. The developer tool 106 develops and removes portions of the photoresist layer to expose the pattern. The etch tool 108 etches into the dielectric layer 310 based on the pattern to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess based on a pattern.

The deposition tool 102 and/or the plating tool 112 may deposit the ground conductive structure 332 in the recess using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the ground conductive structure 332.

As indicated above, FIGS. 5A-5K are provided as an example. Other examples may differ from what is described with regard to FIGS. 5A-5K.

FIGS. 6A-6M are diagrams of an example implementation 600 of forming a non-volatile memory structure 208 of a non-volatile memory array 204 described herein. The example implementation 600 may include an example process for forming the non-volatile memory structure 208 of the non-volatile memory array 204 in the back end region (e.g., BEOL region) of the semiconductor device 200 of FIG. 2 and/or of the semiconductor device 700 of FIG. 7 described herein. In some implementations, one or more of the processing operations described in connection with FIGS. 6A-6M may be performed by one or more of the semiconductor processing tools 102-112 and/or the wafer/die transport tool 114. In some implementations, one or more of the processing operations described in connection with FIGS. 6A-6M may be performed by another semiconductor processing tool not shown in FIG. 1. In some implementations, one or more of the processing operations described in connection with FIGS. 6A-6M may be performed after front end processing of the semiconductor device.

As described in greater detail in connection with FIGS. 6A-6M, one or more of the semiconductor processing operations that are performed to form the non-volatile memory structure 208 of the non-volatile memory array 204 may be performed in the same set of semiconductor processing operations for forming the volatile memory structure 206 of the volatile memory array 202. For example, one or more lithography masks or reticles may be used to pattern one or more layers for forming components of the non-volatile memory structure 208 of the non-volatile memory array 204 and of the volatile memory structure 206 of the volatile memory array 202 in the same lithography operation. As another example, one or more layers may be etched in the same etch operation to forming recesses or components of the non-volatile memory structure 208 of the non-volatile memory array 204 and of the volatile memory structure 206 of the volatile memory array 202. The integration of processes for forming the non-volatile memory structure 208 of the non-volatile memory array 204 and of the volatile memory structure 206 of the volatile memory array 202 reduces the cost and complexity of forming the non-volatile memory structure 208 of the non-volatile memory array 204 and of the volatile memory structure 206 of the volatile memory array 202 relative to forming these structures in separate processing operations. As an example, the integration of processes for forming the non-volatile memory structure 208 of the non-volatile memory array 204 and of the volatile memory structure 206 of the volatile memory array 202 reduces the quantity of lithography masks needed for forming the non-volatile memory structure 208 of the non-volatile memory array 204 and of the volatile memory structure 206 of the volatile memory array 202 relative to forming these structures in separate processing operations. As another example, the integration of processes for forming the non-volatile memory structure 208 of the non-volatile memory array 204 and of the volatile memory structure 206 of the volatile memory array 202 reduces the quantity of semiconductor processing operations needed for forming the non-volatile memory structure 208 of the non-volatile memory array 204 and of the volatile memory structure 206 of the volatile memory array 202 relative to forming these structures in separate processing operations. As an example, the integration of processes for forming the non-volatile memory structure 208 of the non-volatile memory array 204 and of the volatile memory structure 206 of the volatile memory array 202 conserves processing resources and memory resources, and reduces power consumption of the semiconductor processing tools (e.g., semiconductor processing tools 102-112 and/or the wafer/die transport tool 114) that are used to form the non-volatile memory structure 208 of the non-volatile memory array 204 and of the volatile memory structure 206 of the volatile memory array 202.

Figure 6A:
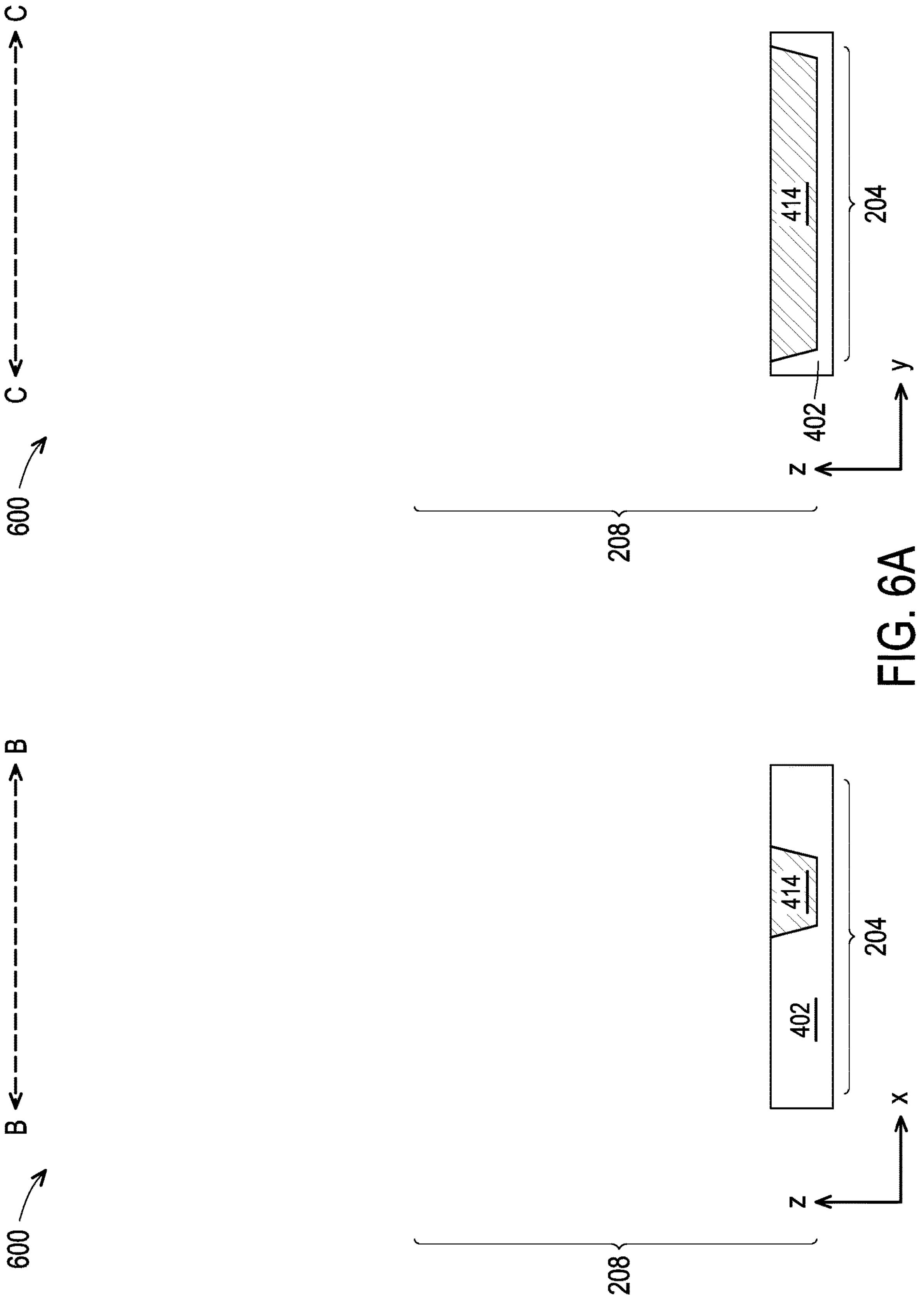
FIGS. 6A-6M are diagrams of an example implementation of forming a non-volatile memory structure of a non-volatile memory array described herein.

As shown in FIG. 6A, the dielectric layer 402 may be formed. The deposition tool 102 may deposit the dielectric layer 402 using a CVD technique, a PVD technique, an ALD technique, another deposition technique described above in connection with FIG. 1, and/or a deposition technique other than as described above in connection with FIG. 1. In some implementations, the dielectric layer 302 and the dielectric layer 402 are the same dielectric layer in the BEOL region of the semiconductor device.

As further shown in FIG. 6A, a word line conductive structure 414 may be formed in dielectric layer 402 in the non-volatile memory array 204. In some implementations, a pattern in a photoresist layer is used to form a recess in the dielectric layer 402. In these implementations, the deposition tool 102 forms the photoresist layer on the dielectric layer 402. The exposure tool 104 exposes the photoresist layer to a radiation source to pattern the photoresist layer. The developer tool 106 develops and removes portions of the photoresist layer to expose the pattern. The etch tool 108 etches into the dielectric layer 402 based on the pattern to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess based on a pattern. In some implementations, the recess for the word line conductive structure 314 and the recess for the word line conductive structure 414 may be formed in the same set of one or more semiconductor processing operations (e.g., in the same photolithography operations using the same photomask or reticle and/or using the same hard mask or photoresist layer, in the same etch operations).

The deposition tool 102 and/or the plating tool 112 may deposit the word line conductive structure 414 in the recess using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the word line conductive structure 414 after the word line conductive structure 414 is deposited. In some implementations, the word line conductive structure 314 and the word line conductive structure 414 are deposited in the same set of one or more semiconductor processing operations (e.g., in the same deposition operations).

Figure 6B:
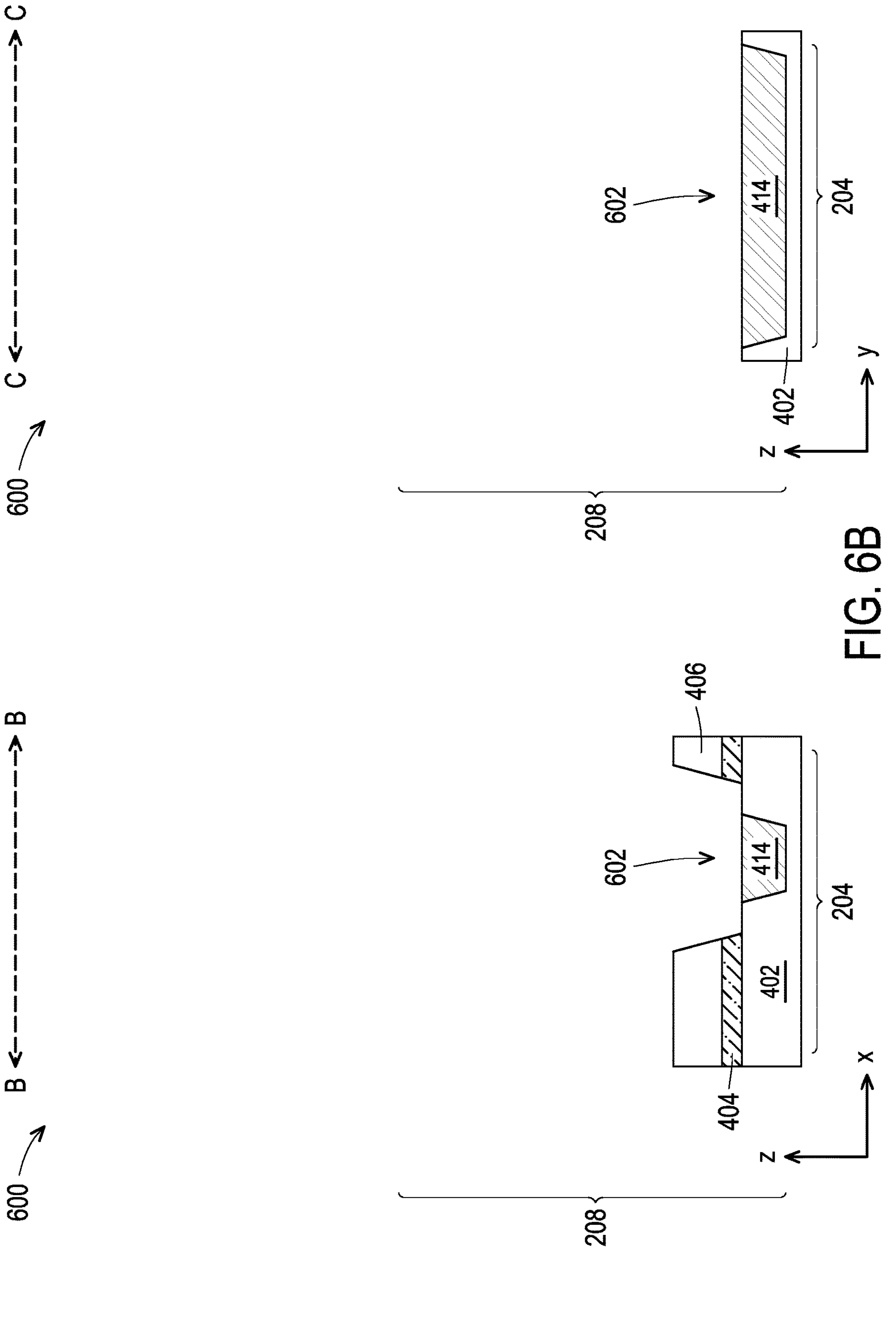

As shown in FIG. 6B, the dielectric layer 404 may be formed over and/or on the dielectric layer 402, and over and/or on the word line conductive structure 414. Moreover, the dielectric layer 406 (or a portion thereof) may be formed over and/or on the dielectric layer 404. The deposition tool 102 may deposit the dielectric layer 404 and the dielectric layer 406 using a CVD technique, a PVD technique, an ALD technique, another deposition technique described above in connection with FIG. 1, and/or a deposition technique other than as described above in connection with FIG. 1. In some implementations, the dielectric layer 304 and the dielectric layer 404 are the same dielectric layer in the BEOL region of the semiconductor device. In some implementations, the dielectric layer 306 and the dielectric layer 406 are the same dielectric layer in the BEOL region of the semiconductor device.

As further shown in FIG. 6B, a recess 602 may be formed in and/or through the dielectric layers 404 and 404 in the non-volatile memory array 204. In particular, the recess 602 may be formed over the word line conductive structure 414. The recess 602 may be formed fully through the dielectric layers 404 and 404 such that the top surface of the word line conductive structure 414 is exposed through the recess 602. In some implementations, a pattern in a photoresist layer is used to form the recess 602 in the dielectric layers 404 and 404. In these implementations, the deposition tool 102 forms the photoresist layer on the dielectric layer 406. The exposure tool 104 exposes the photoresist layer to a radiation source to pattern the photoresist layer. The developer tool 106 develops and removes portions of the photoresist layer to expose the pattern. The etch tool 108 etches into the dielectric layers 404 and 406 based on the pattern to form the recess 602. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess 602 based on a pattern. In some implementations, the recess 502 and the recess 602 are formed in the same set of one or more semiconductor processing operations (e.g., in the same photolithography operations using the same photomask or reticle and/or using the same hard mask or photoresist layer, in the same etch operations).

Figure 6C:
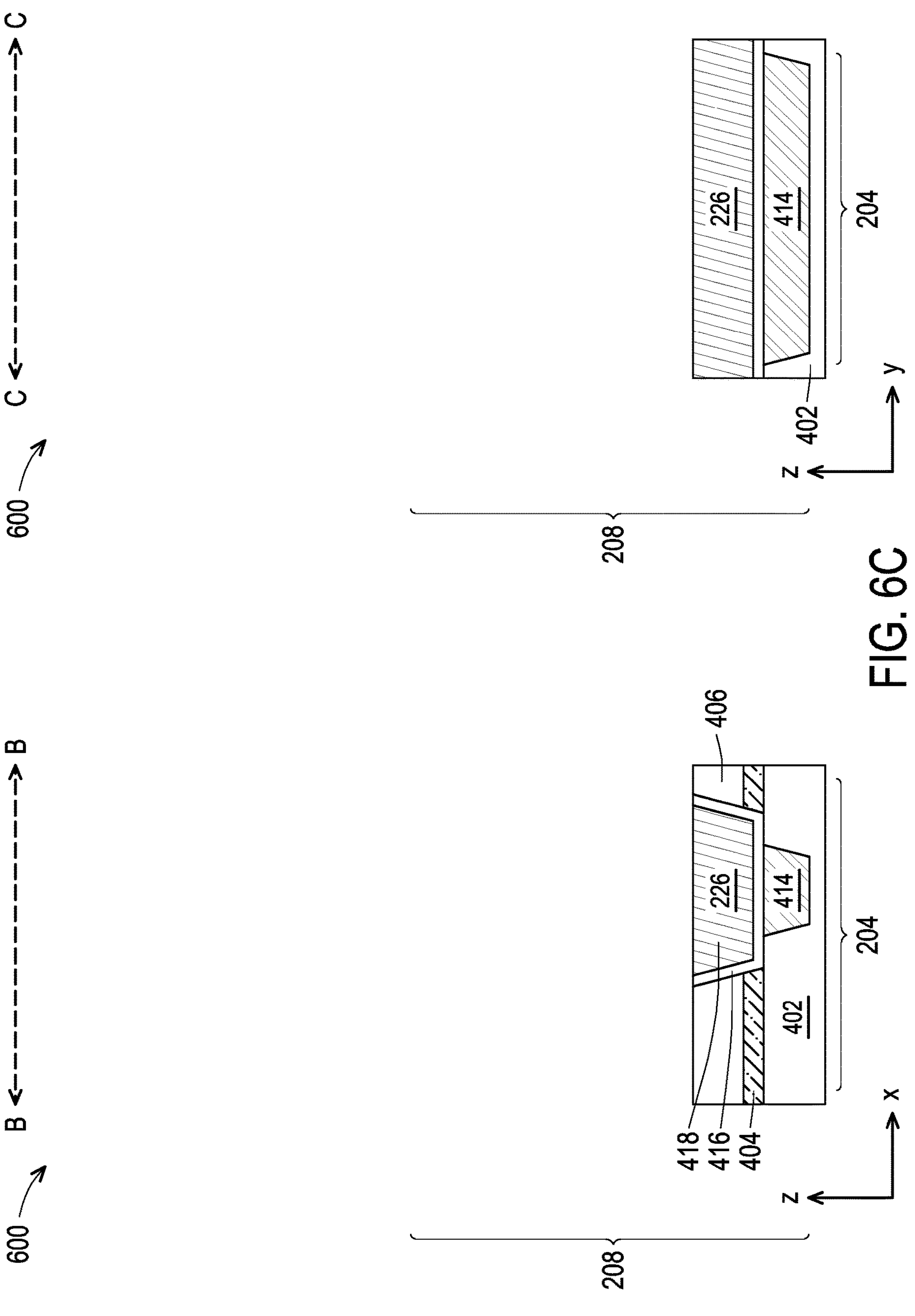

As shown in FIG. 6C, a gate structure 226 of the non-volatile memory structure 208 may be formed in the recess 602 over the word line conductive structure 414. The gate structure 226 may be formed directly on the word line conductive structure 414 such that the gate structure 226 and the word line conductive structure 414 are in direct physical contact and electrically coupled. To form the gate structure 226, the deposition tool 102 and/or the plating tool 112 may deposit the liner layer(s) 416 in the recess 602 using a CVD technique, a PVD technique, an ALD technique, an electroplating technique, another deposition technique described above in connection with FIG. 1, and/or a deposition technique other than as described above in connection with FIG. 1. The deposition tool 102 and/or the plating tool 112 may deposit the gate electrode 418 over and/or on the liner layer(s) 416 in the recess 602 using a CVD technique, a PVD technique, an ALD technique, an electroplating technique, another deposition technique described above in connection with FIG. 1, and/or a deposition technique other than as described above in connection with FIG. 1. In some implementations, the gate structure 210 and the gate structure 226 are deposited in the same set of one or more semiconductor processing operations (e.g., in the same deposition operations).

Figure 6D:
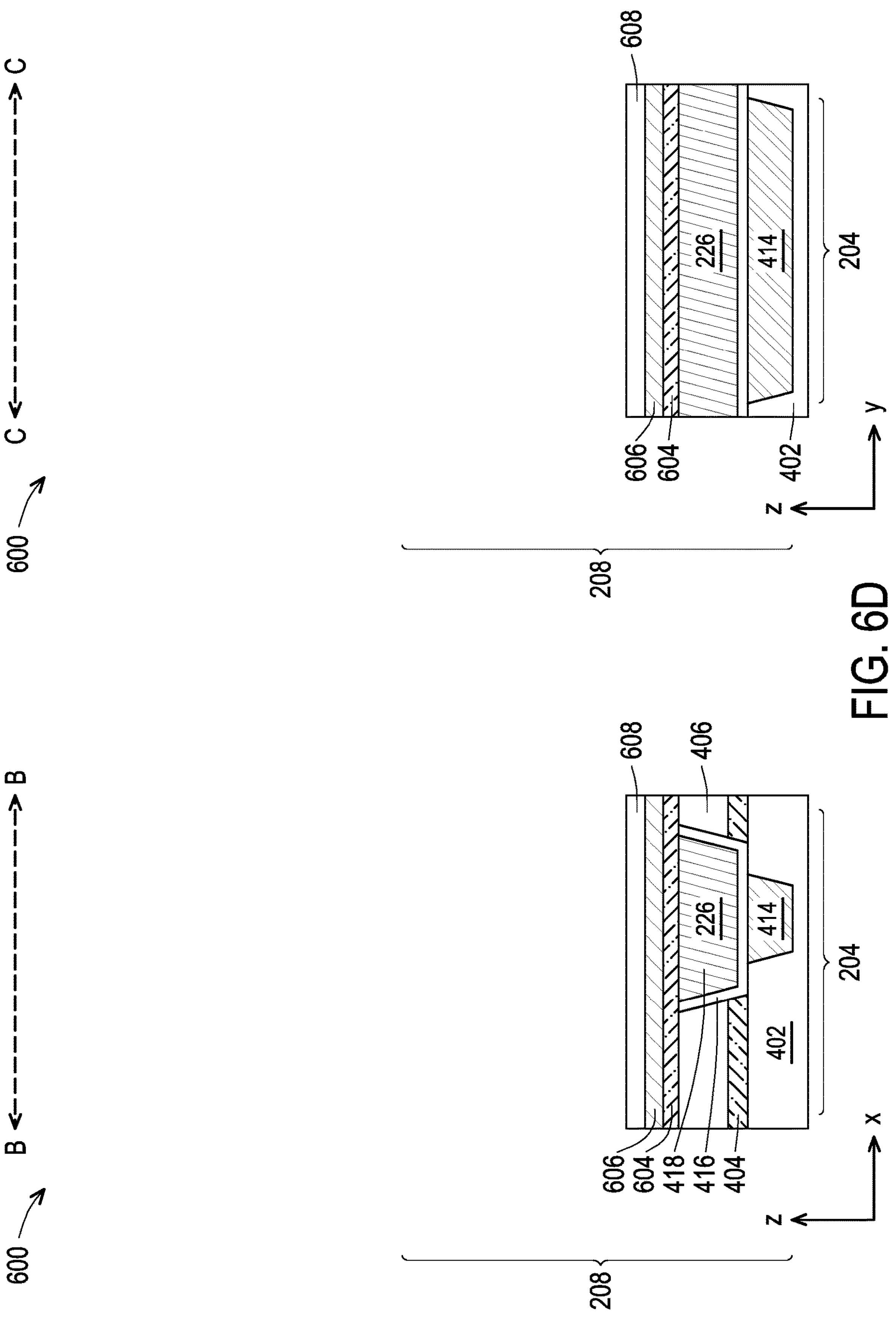

As shown in FIG. 6D, a plurality of layers may be formed over and/or on the dielectric layer 406 and over and/or on the gate structure 210. For example, a dielectric layer 604 may be formed over and/or on the dielectric layer 406 and over and/or on the gate structure 226. As another example, a channel material layer 606 may be formed over and/or on the dielectric layer 604. As another example, a dielectric layer 608 may be formed over and/or on the channel material layer 606. The deposition tool 102 may deposit the dielectric layer 604, the channel material layer 606, and the dielectric layer 608 using a CVD technique, a PVD technique, an ALD technique, another deposition technique described above in connection with FIG. 1, and/or a deposition technique other than as described above in connection with FIG. 1. In some implementations, the dielectric layer 504 and the dielectric layer 604 are deposited in the same set of one or more semiconductor processing operations (e.g., in the same deposition operations). In some implementations, the channel material layer 506 and the channel material layer 606 are deposited in the same set of one or more semiconductor processing operations (e.g., in the same deposition operations). In some implementations, the dielectric layer 508 and the dielectric layer 608 are deposited in the same set of one or more semiconductor processing operations (e.g., in the same deposition operations).

Figure 6E:
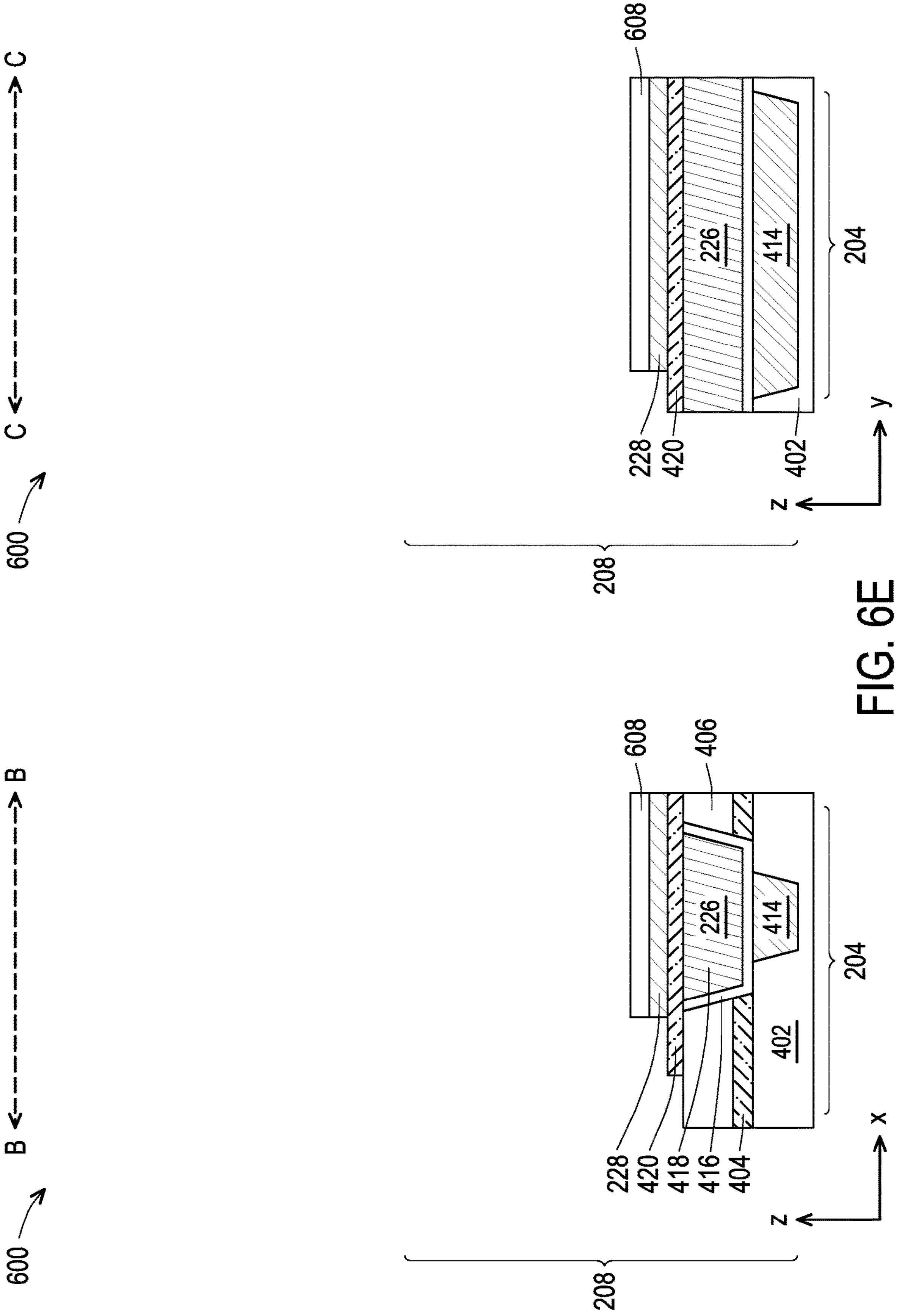

As further shown in FIG. 6E, one or more etch operations may be performed to remove portions of the dielectric layer 604, portions of the channel material layer 606, and/or portions of the dielectric layer 608 to form the channel layer 228 and the gate dielectric layer 420 of the non-volatile memory structure 208 over the gate structure 226. The gate dielectric layer 420 may be formed on the gate structure 226, and the channel layer 228 may be formed on the gate dielectric layer 420. In some implementations, the channel layer 228 and the gate dielectric layer 420 of the non-volatile memory structure 208 are formed in the same set of one or more semiconductor processing operations as the channel layer 212 and the gate dielectric layer 320 of the volatile memory structure 206.

In some implementations, a pattern in a photoresist layer is used to form the channel layer 228 and the gate dielectric layer 420. In these implementations, the deposition tool 102 forms the photoresist layer on the dielectric layer 608. The exposure tool 104 exposes the photoresist layer to a radiation source to pattern the photoresist layer. The developer tool 106 develops and removes portions of the photoresist layer to expose the pattern. The etch tool 108 etches through the dielectric layer 608, through the channel material layer 606, and/or through the dielectric layer 604 based on the pattern. The remaining portions of the channel material layer 606 over the gate structure 226 corresponds to the channel layer 228, and remaining portions of the dielectric layer 604 over the gate structure 226 correspond to the gate dielectric layer 420. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the channel layer 228 and the gate dielectric layer 420 based on a pattern.

Figure 6F:
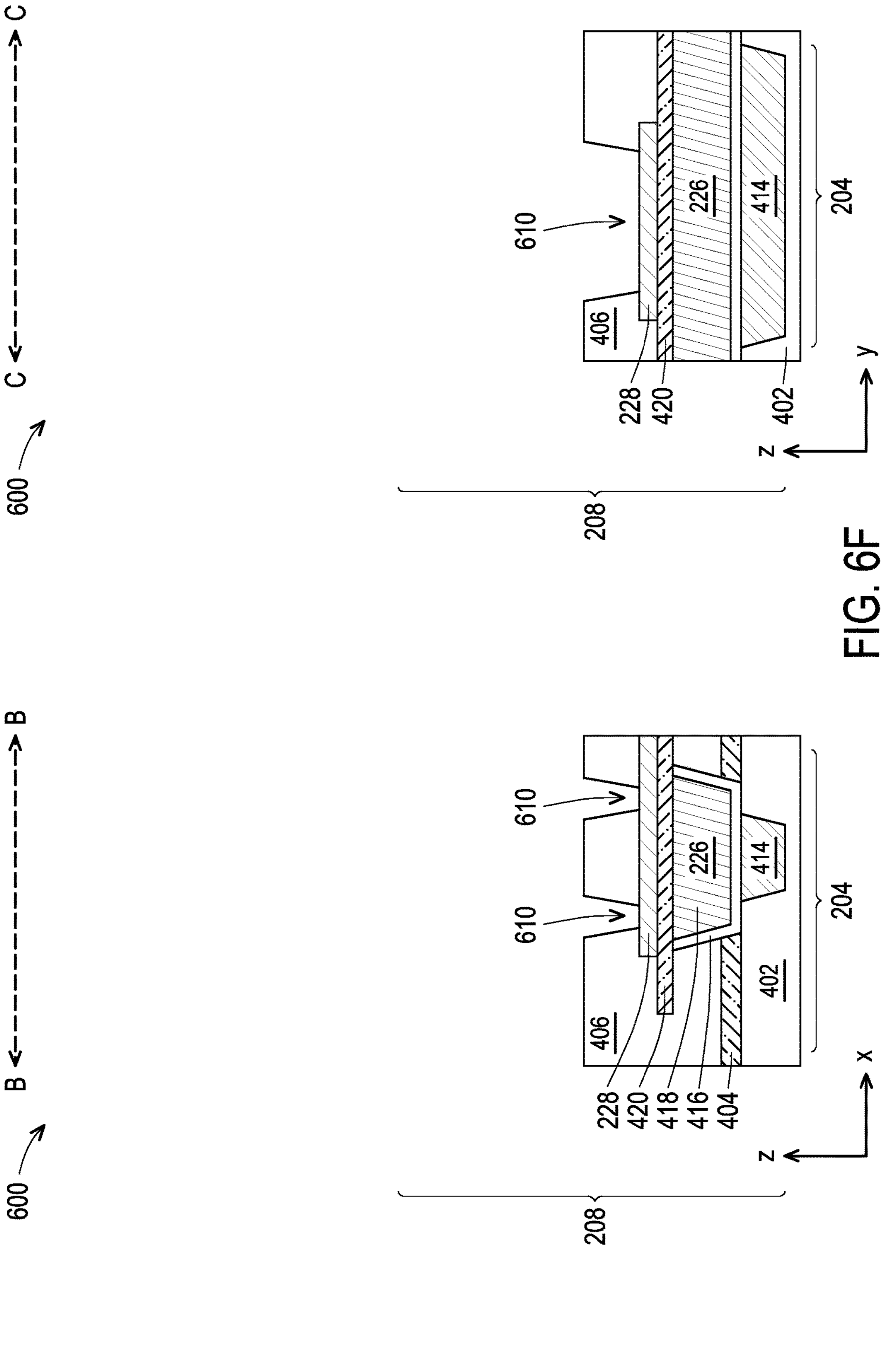

As shown in FIG. 6F, additional dielectric material for the dielectric layer 406 may be deposited in the non-volatile memory array 204. The additional dielectric material for the dielectric layer 406 may be formed over and/or on the gate dielectric layer 420 and/or over and/or on the channel layer 228. The deposition tool 102 may deposit the additional dielectric material for the dielectric layer 406 using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 406.

As further shown in FIG. 6F, recesses 610 may be formed in the dielectric layer 406 over the channel layer 228 such that portions of the channel layer 228 over the gate structure 226 are exposed through the recesses 610. The recesses 610 may be referred to as source/drain recesses. In some implementations, a pattern in a photoresist layer is used to form the recesses 610 in the dielectric layer 406. In these implementations, the deposition tool 102 forms the photoresist layer on the dielectric layer 406. The exposure tool 104 exposes the photoresist layer to a radiation source to pattern the photoresist layer. The developer tool 106 develops and removes portions of the photoresist layer to expose the pattern. The etch tool 108 etches into the dielectric layer 406 based on the pattern to form the recesses 610. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 610 based on a pattern. In some implementations, the recesses 510 and the recesses 610 are formed in the same set of one or more semiconductor processing operations (e.g., in the same photolithography operations using the same photomask or reticle and/or using the same hard mask or photoresist layer, in the same etch operations).

Figure 6G:
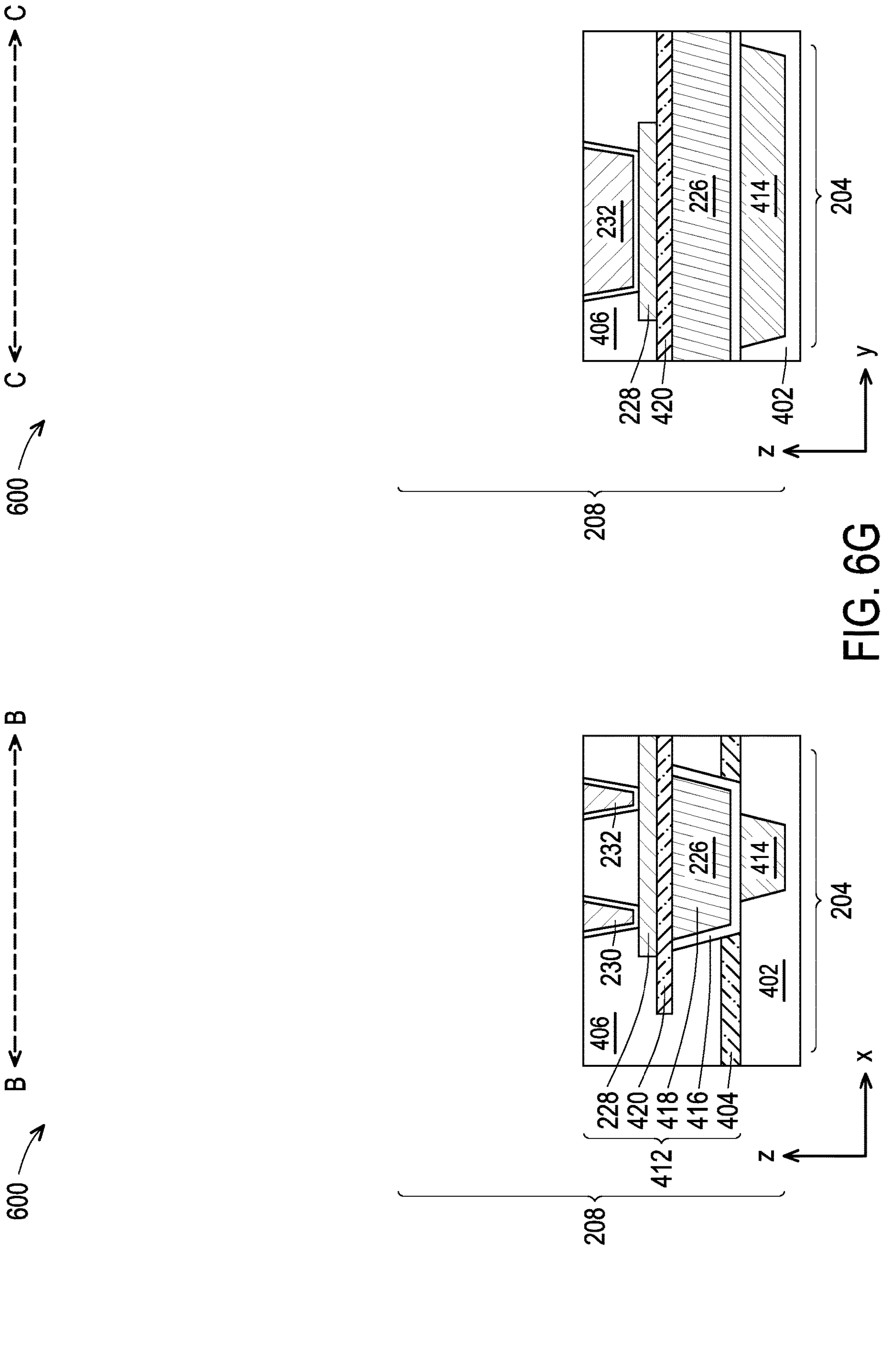

As shown in FIG. 6G, source/drain regions 230 and 232 of the non-volatile memory structure 208 may be formed in the recesses 610. The gate structure 226, the channel layer 228, the source/drain regions 230 and 232, and the gate dielectric layer 420 may correspond to a transistor structure 412 of the non-volatile memory structure 208. The source/drain regions 230 and 232 may be coupled with the channel layer 228. The deposition tool 102 may deposit the source/drain regions 230 and 232 using an epitaxy technique, CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the source/drain regions 230 and 232. In some implementations, one or more liner layers are deposited in the recesses 610 prior to formation of the source/drain regions 230 and 232 to promote adhesion between the dielectric layer 406 and the source/drain regions 230 and 232, and to reduce dopant diffusion into the dielectric layer 406 from the source/drain regions 230 and 232. In some implementations, the source/drain regions 214 and 216 are deposited in the same set of one or more semiconductor processing operations (e.g., in the same deposition operations) as the source/drain regions 230 and 232.

Figure 6H:
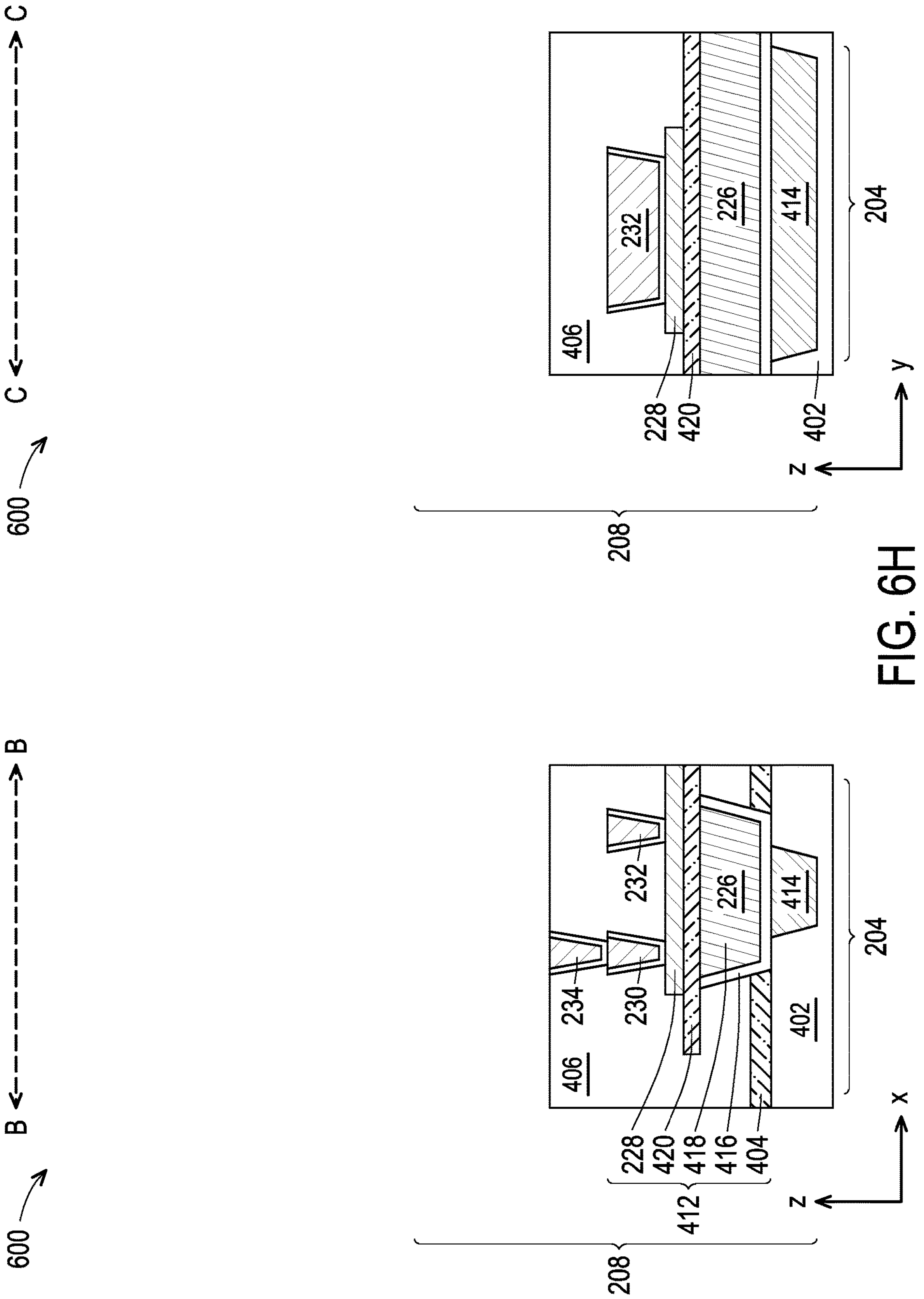

As shown in FIG. 6H, additional dielectric material may be deposited for the dielectric layer 406. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 406.

As further shown in FIG. 6H, an interconnect structure (e.g., a source/drain contact, a source/drain interconnect structure) 234 may be formed in the dielectric layer 406. The interconnect structure 234 may be formed over and/or on the source/drain region 230 such that the interconnect structure 234 is physically coupled and/or electrically coupled with the source/drain region 230. In some implementations, the interconnect structure 218 is formed in the same set of one or more semiconductor processing operations (e.g., in the same photolithography operations using the same photomask or reticle and/or using the same hard mask or photoresist layer, in the same etch operations, in the same deposition operations) as the interconnect structure 234.

In some implementations, a pattern in a photoresist layer is used to form a recess in the dielectric layer 406 over and to the source/drain region 230. In these implementations, the deposition tool 102 forms the photoresist layer on the dielectric layer 406. The exposure tool 104 exposes the photoresist layer to a radiation source to pattern the photoresist layer. The developer tool 106 develops and removes portions of the photoresist layer to expose the pattern. The etch tool 108 etches into the dielectric layer 406 based on the pattern to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses based on a pattern.

The deposition tool 102 and/or the plating tool 112 may deposit the interconnect structure 234 in the recess using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the interconnect structure 234. In some implementations, one or more liner layers are deposited in the recess prior to formation of the interconnect structure 234 to promote adhesion between the dielectric layer 406 and the interconnect structure 234, and to reduce electron migration into the dielectric layer 406 from the interconnect structure 234.

Figure 6I:
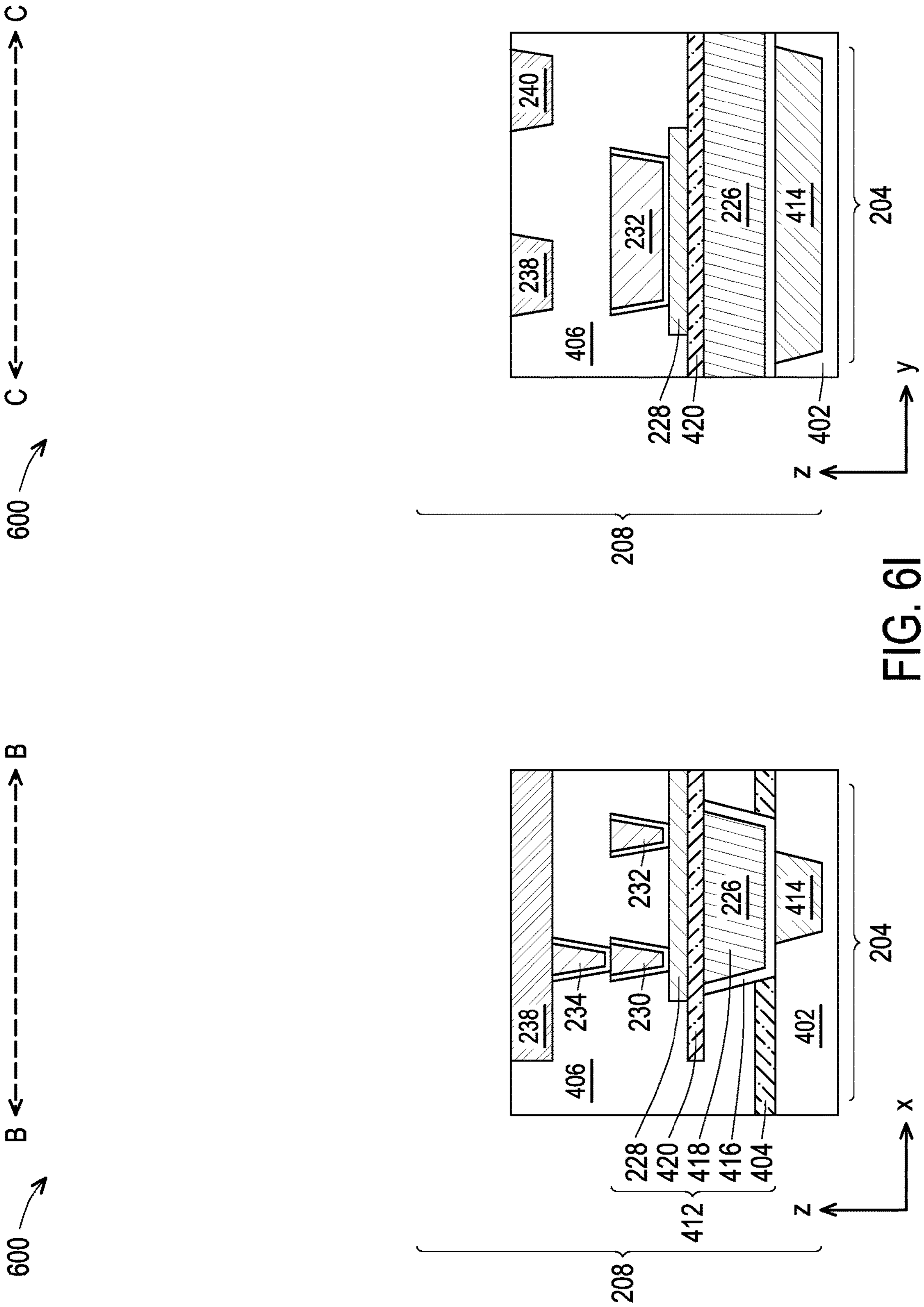

As shown in FIG. 6I, additional dielectric material may be deposited for the dielectric layer 406. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 406.

As further shown in FIG. 6I, a bit line conductive structure 238 of the non-volatile memory array 204 may be formed in and/or on the dielectric layer 406. The bit line conductive structure 238 may be formed over and/or on the interconnect structure 234 such that the interconnect structure 234 is coupled with the bit line conductive structure 238. A select line conductive structure 240 of the non-volatile memory array 204 may be formed in and/or on the dielectric layer 406. The select line conductive structure 240 may be formed adjacent to the bit line conductive structure 238 in the dielectric layer 406. In some implementations, the bit line conductive structure 222, the bit line conductive structure 238, and the select line conductive structure 240 are formed in the same set of one or more semiconductor processing operations (e.g., in the same photolithography operations using the same photomask or reticle and/or using the same hard mask or photoresist layer, in the same etch operations, in the same deposition operations).

In some implementations, a pattern in a photoresist layer is used to form a recess in the dielectric layer 406. In these implementations, the deposition tool 102 forms the photoresist layer on the dielectric layer 406. The exposure tool 104 exposes the photoresist layer to a radiation source to pattern the photoresist layer. The developer tool 106 develops and removes portions of the photoresist layer to expose the pattern. The etch tool 108 etches into the dielectric layer 406 based on the pattern to form the recesses. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess based on a pattern.

The deposition tool 102 and/or the plating tool 112 may deposit the bit line conductive structure 238 in a recess using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the bit line conductive structure 238. The deposition tool 102 and/or the plating tool 112 may deposit the select line conductive structure 240 in another recess using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the select line conductive structure 240.

Figure 6J:
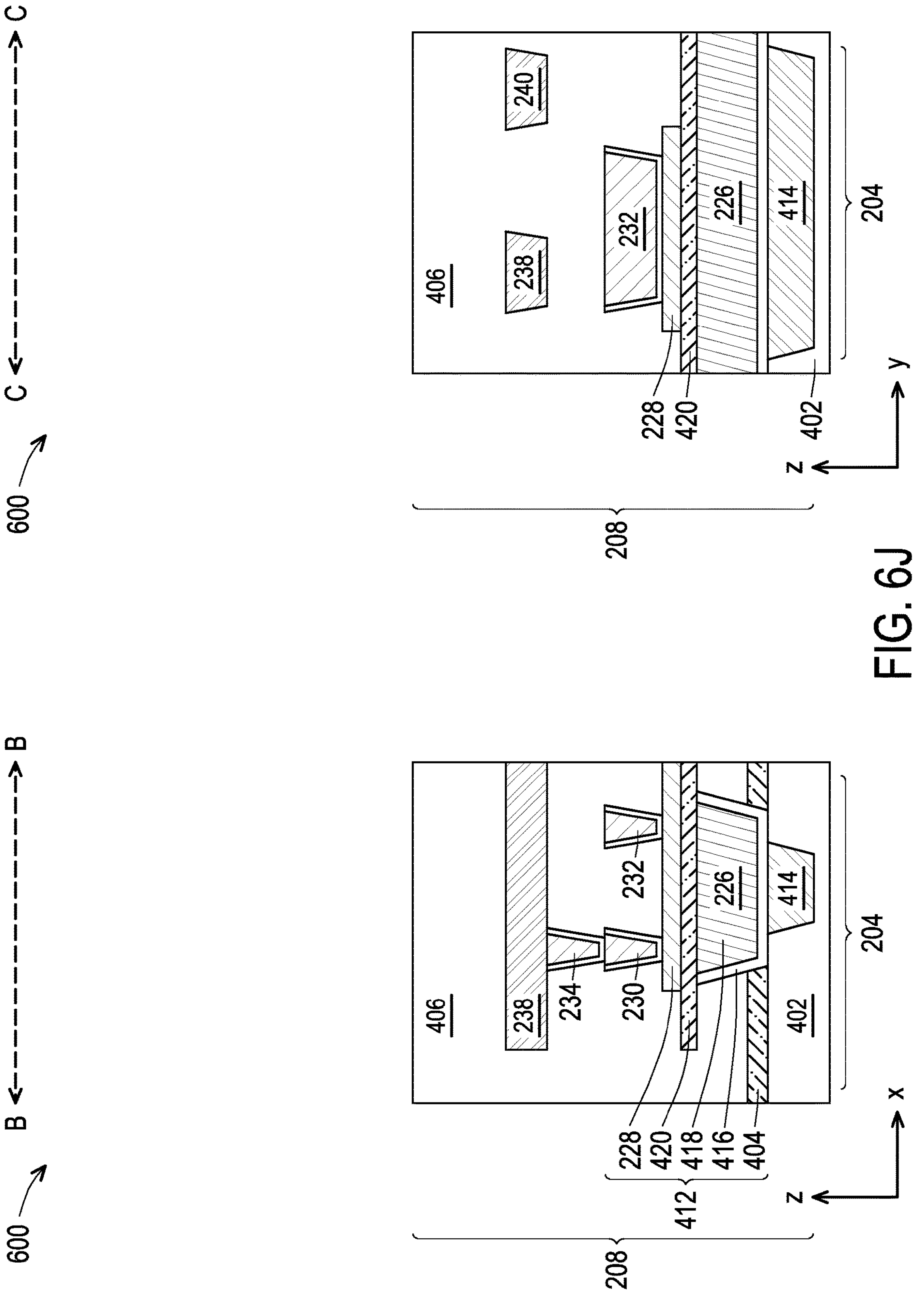

As shown in FIG. 6J, additional dielectric material may be deposited for the dielectric layer 406. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 406.

Figure 6K:
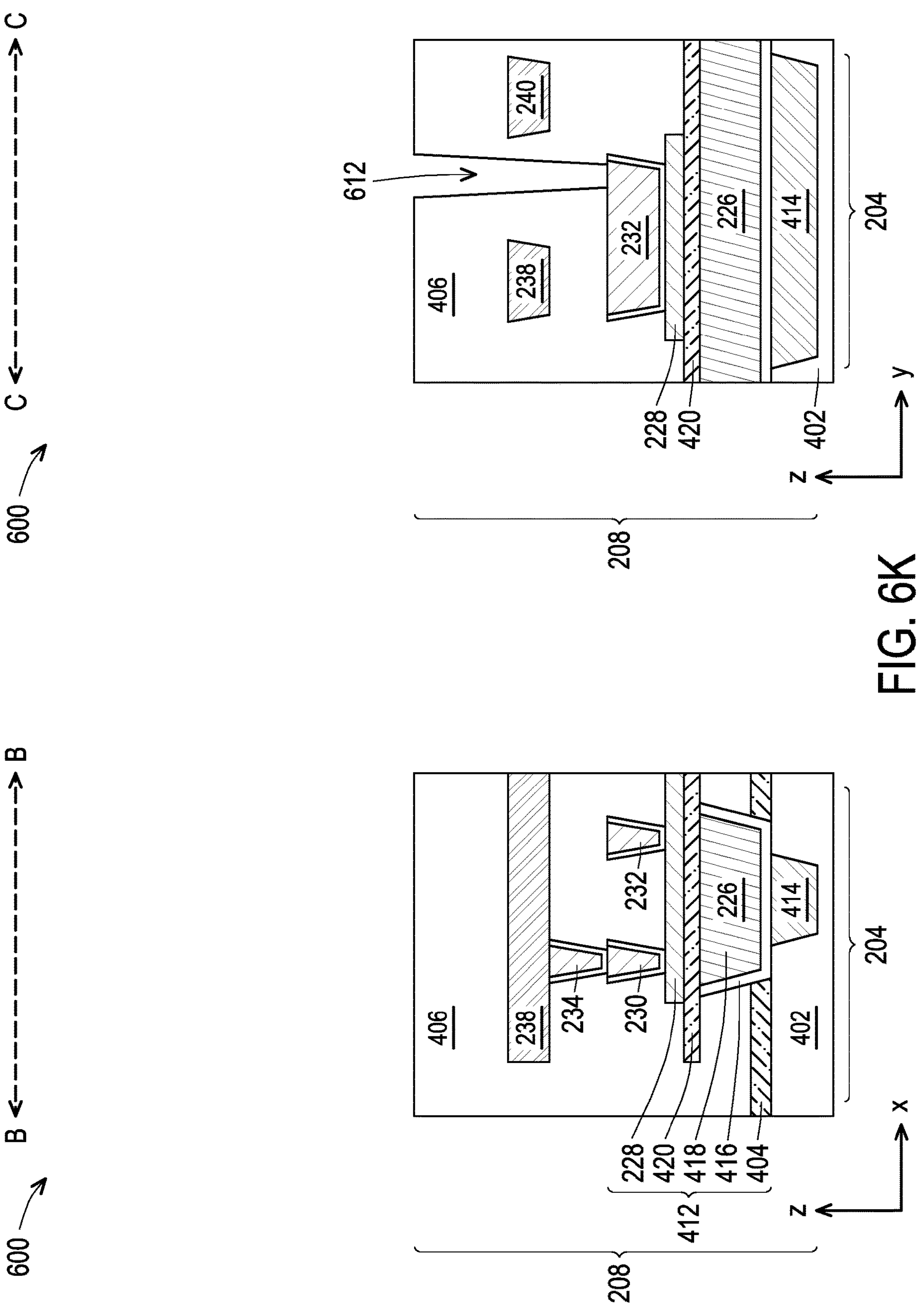

As shown in FIG. 6K, a recess 612 may be formed through the dielectric layer 406 and to the source/drain region 232 to expose the source/drain region 232 through the recess 612. The recess 612 may be formed between the bit line conductive structure 238 and the select line conductive structure 240.

In some implementations, a pattern in a photoresist layer is used to form the recess 612 in the dielectric layer 406 over and to the source/drain region 232. In these implementations, the deposition tool 102 forms the photoresist layer on the dielectric layer 406. The exposure tool 104 exposes the photoresist layer to a radiation source to pattern the photoresist layer. The developer tool 106 develops and removes portions of the photoresist layer to expose the pattern. The etch tool 108 etches into the dielectric layer 406 based on the pattern to form the recess 612. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess 612 based on a pattern.

Figure 6L:
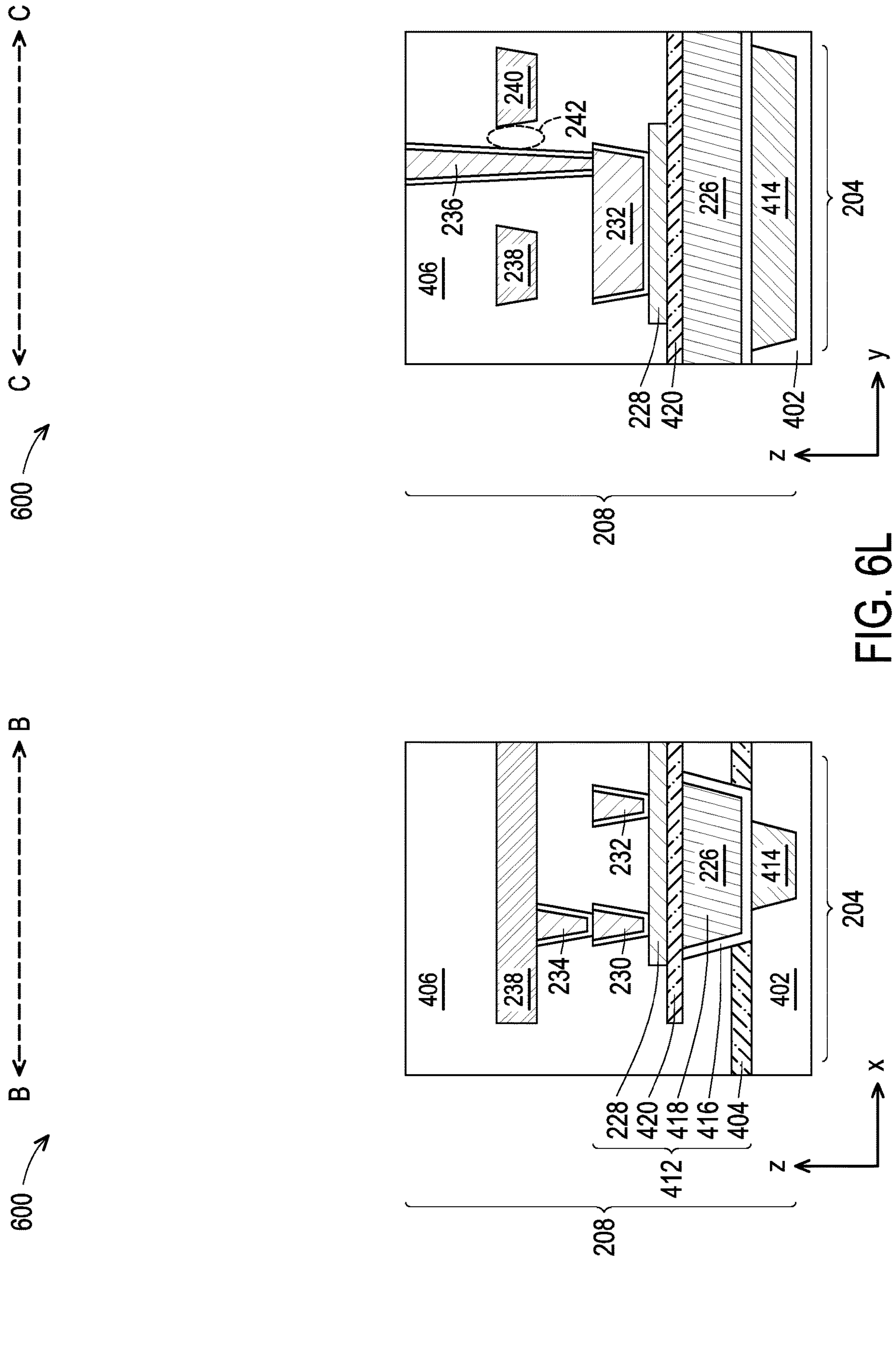

As shown in FIG. 6L, an interconnect structure (e.g., a source/drain contact, a source/drain interconnect) 236 may be formed in the recess 612 in the dielectric layer 406. In some implementations, the interconnect structure 220 is formed in the same set of one or more semiconductor processing operations (e.g., in the same photolithography operations using the same photomask or reticle and/or using the same hard mask or photoresist layer, in the same etch operations, in the same deposition operations) as the interconnect structure 236. The interconnect structure 236 may be formed over and/or on the source/drain region 232 such that the interconnect structure 236 is physically coupled and/or electrically coupled with the source/drain region 232. The interconnect structure 236 may be formed such that the interconnect structure 236 is included between the bit line conductive structure 238 and the select line conductive structure 240. Moreover, the interconnect structure 236 may be formed such that the interconnect structure 236 is spaced apart from the bit line conductive structure 238 and spaced apart from the select line conductive structure 240 such that a portion of the dielectric layer 406 are included between the interconnect structure 236 and the bit line conductive structure 238, and another portion of the dielectric layer 406 is included between the interconnect structure 236 and the select line conductive structure 240. The interconnect structure 236 may be formed closer to the select line conductive structure 240 than the bit line conductive structure 238. This enables the portion of the dielectric layer 406 between the interconnect structure 236 and the select line conductive structure 240 to be used as a programmable resistance-based memory cell region 242 and to prevent conductive bridging between the interconnect structure 236 and the bit line conductive structure 238 through the portion of the dielectric layer 406 between the interconnect structure 236 and the bit line conductive structure 238.

The deposition tool 102 and/or the plating tool 112 may deposit the interconnect structure 236 in the recess 612 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the interconnect structure 236. In some implementations, one or more liner layers are deposited in the recess 612 prior to formation of the interconnect structure 236 to promote adhesion between the dielectric layer 406 and the interconnect structure 236, and to reduce electron migration into the dielectric layer 406 from the interconnect structure 236.

Figure 6M:
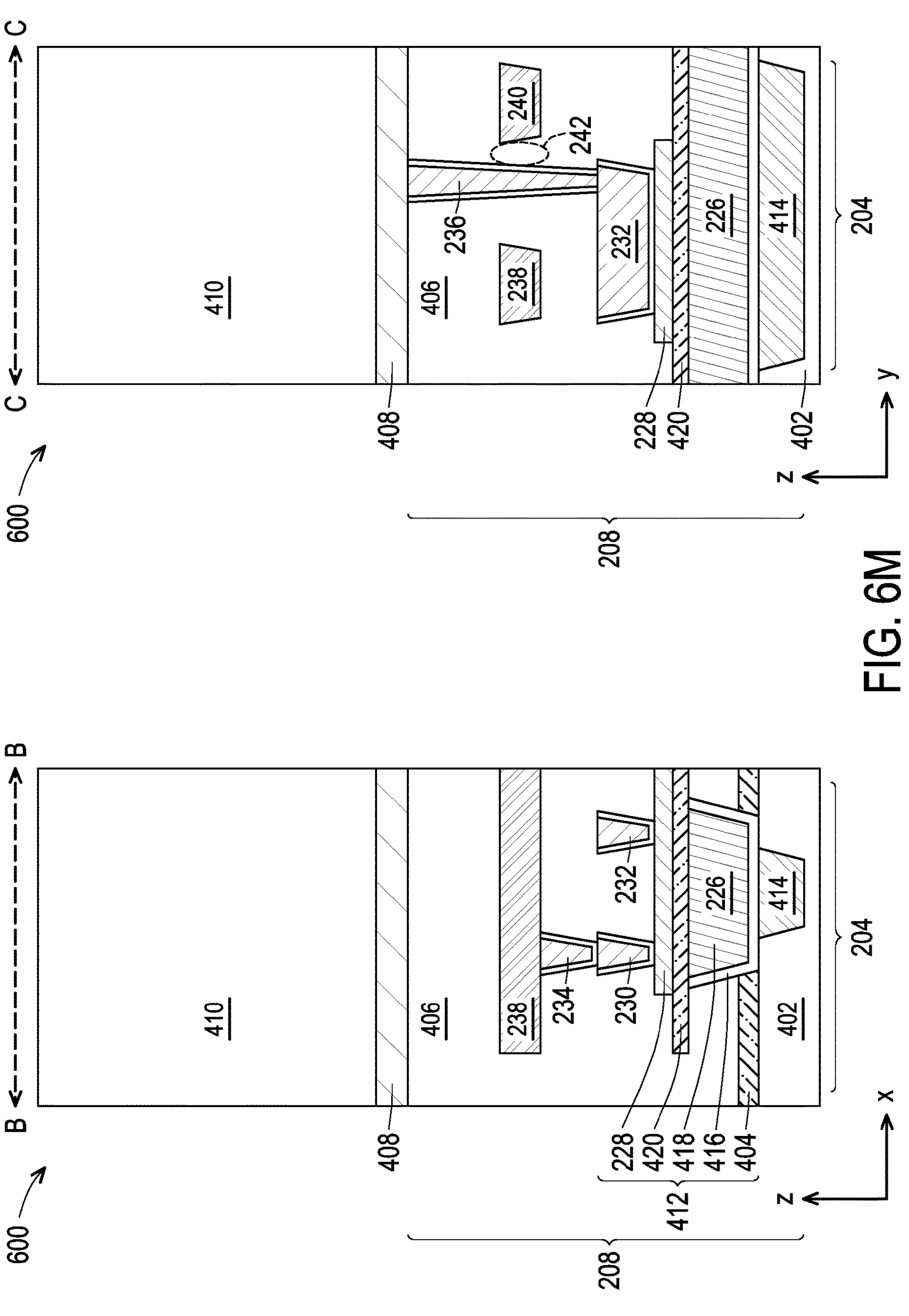

As shown in FIG. 6M, the dielectric layer 408 may be formed over and/or on the dielectric layer 406, and/or over and/or on the interconnect structure 236. The dielectric layer 410 may be formed over and/or on the dielectric layer 408. The deposition tool 102 may deposit the dielectric layers 408 and 410 using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layers 408 and/or 410. In some implementations, the dielectric layers 308 and 310 are deposited in the same set of one or more semiconductor processing operations (e.g., in the same deposition operations) as the dielectric layers 408 and 410. In some implementations, additional semiconductor process operations may be subsequently performed to form the capacitor structure 224 and/or the ground conductive structure 332 in the volatile memory structure 206 of the volatile memory array 202 after formation of the non-volatile memory structure 208 of the non-volatile memory array 204.

As indicated above, FIGS. 6A-6M are provided as an example. Other examples may differ from what is described with regard to FIGS. 6A-6M.

Figure 7:
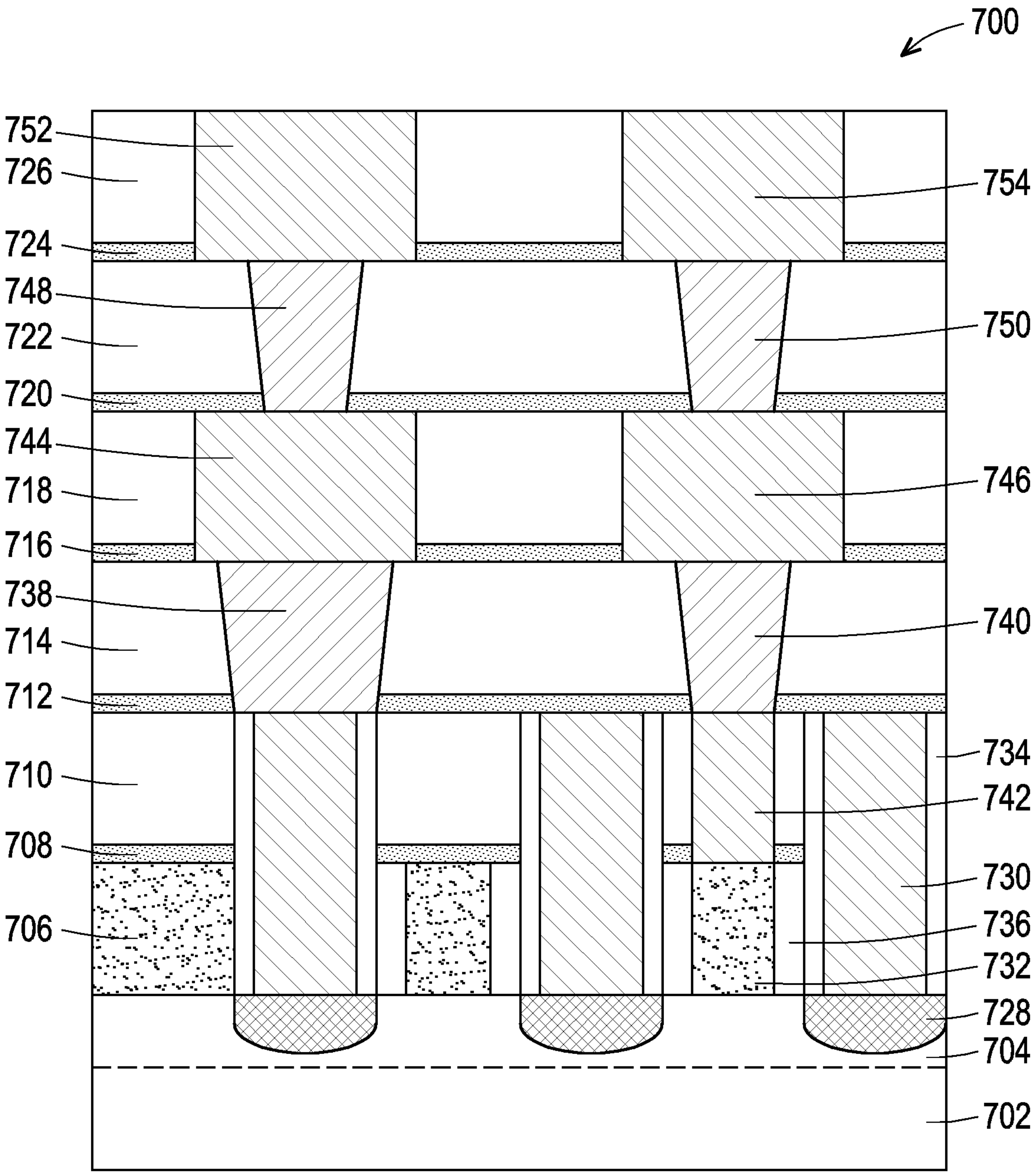
FIG. 7 is a diagram of an example semiconductor device described herein.

FIG. 7 is a diagram of a portion of an example semiconductor device 700 described herein. The semiconductor device 700 includes an example of a semiconductor device that may include a memory device (e.g., an SRAM, a DRAM), a logic device, a processor, an input/output device, or another type of semiconductor device that includes one or more transistors. The semiconductor device 700 may include a substrate 702 and one or more fin structures 704 formed in the substrate 702. In some implementations, the semiconductor device 200 may be implemented by and/or included in the semiconductor device 700. In some implementations, the semiconductor device 700 may be implemented by and/or included in the semiconductor device 200.

The semiconductor device 700 includes one or more stacked layers, including a dielectric layer 706, an etch stop layer (ESL) 708, a dielectric layer 710, an ESL 712, a dielectric layer 714, an ESL 716, a dielectric layer 718, an ESL 720, a dielectric layer 722, an ESL 724, and a dielectric layer 726, among other examples. The dielectric layers 706, 710, 714, 718, 722, and 726 are included to electrically isolate various structures of the semiconductor device 700. The dielectric layers 706, 710, 714, 718, 722, and 726 include a silicon nitride ($Si_xN_y$), an oxide (e.g., a silicon oxide ($SiO_x$) and/or another oxide material), and/or another type of dielectric material. The ESLs 708, 712, 716, 720, 724 includes a layer of material that is configured to permit various portions of the semiconductor device 700 (or the layers included therein) to be selectively etched or protected from etching to form one or more of the structures included in the semiconductor device 700.

As further shown in FIG. 7, the semiconductor device 700 includes a plurality of epitaxial (epi) regions 728 that are grown and/or otherwise formed on and/or around portions of the fin structure 704. The epitaxial regions 728 are formed by epitaxial growth. In some implementations, the epitaxial regions 728 are formed in recessed portions in the fin structure 704. The recessed portions may be formed by strained source drain (SSD) etching of the fin structure 704 and/or another type etching operation. The epitaxial regions 728 function as source or drain regions of the transistors included in the semiconductor device 700.

The epitaxial regions 728 are electrically connected to metal source or drain contacts 730 of the transistors included in the semiconductor device 700. The metal source or drain contacts (MDs or CAs) 730 include cobalt (Co), ruthenium (Ru), and/or another conductive or metal material. The transistors further include gates 732 (MGs), which are formed of a polysilicon material, a metal (e.g., tungsten (W) or another metal), and/or another type of conductive material. The metal source or drain contacts 730 and the gates 732 are electrically isolated by one or more sidewall spacers, including spacers 734 on each side of the metal source or drain contacts 730 and spacers 736 on each side of the gate 732. The spacers 734 and 736 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 734 are omitted from the sidewalls of the source or drain contacts 730.

As further shown in FIG. 7, the metal source or drain contacts 730 and the gates 732 are electrically connected to one or more types of interconnects. The interconnects electrically connect the transistors of the semiconductor device 700 and/or electrically connect the transistors to other areas and/or components of the semiconductor device 700. In some implementations, the interconnects electrically connect the transistors in the front end of line (FEOL) region of the semiconductor device 700 to a back end of line (BEOL) region of the semiconductor device 700.

The metal source or drain contacts 730 are electrically connected to source or drain interconnects 738 (e.g., source/drain vias or VDs). One or more of the gates 732 are electrically connected to gate interconnects 740 (e.g., gate vias or VGs). The interconnects 738 and 740 include a conductive material such as tungsten, cobalt, ruthenium, copper, and/or another type of conductive material. In some implementations, the gates 732 are electrically connected to the gate interconnects 740 by gate contacts 742 (CB or MP) to reduce contact resistance between the gates 732 and the gate interconnects 740. The gate contacts 742 include tungsten (W), cobalt (Co), ruthenium (Ru), titanium (Ti), aluminum (Al), copper (Cu) or gold (Au), among other examples of conductive materials.

As further shown in FIG. 7, the interconnects 738 and 740 are electrically connected to a plurality of BEOL layers, each including one or more metallization layers and/or vias. As an example, the interconnects 738 and 740 may be electrically connected to an M0 metallization layer that includes conductive structures 744 and 746. The M0 metallization layer is electrically connected to a V0 via layer that includes vias 748 and 750. The V0 via layer is electrically connected to an M1 metallization that includes conductive structures 752 and 754. In some implementations, the BEOL layers of the semiconductor device 700 includes additional metallization layers and/or vias that connect the semiconductor device 700 to a package.

One or more memory arrays (e.g., a volatile memory array 202, a non-volatile memory array 204) may be included in one or more layers in the BEOL region of the semiconductor device 700. In some implementations, a plurality of volatile memory structures 206 of a volatile memory array 202 and/or a plurality of non-volatile memory structures 208 of a non-volatile memory array 204 may be included in the dielectric layer 714 the dielectric layer 718, the dielectric layer 722, and/or the ESL 724, among other examples. The volatile memory structures 206 may be configured for caching and other volatile memory functions in the semiconductor device 700, whereas the non-volatile memory structures 208 may be configured for long-term storage, firmware storage, circuit trim parameter storage, and/or other non-volatile memory functions in the semiconductor device 700. In some implementations, volatile memory structures 206 and the non-volatile memory structures 208 may be formed in the same set of semiconductor processing operations or a subset of the same semiconductor processing operations to reduce complexity of manufacturing the semiconductor device 700.

As indicated above, FIG. 7 is provided as an example. Other examples may differ from what is described with regard to FIG. 7.

Figure 8:
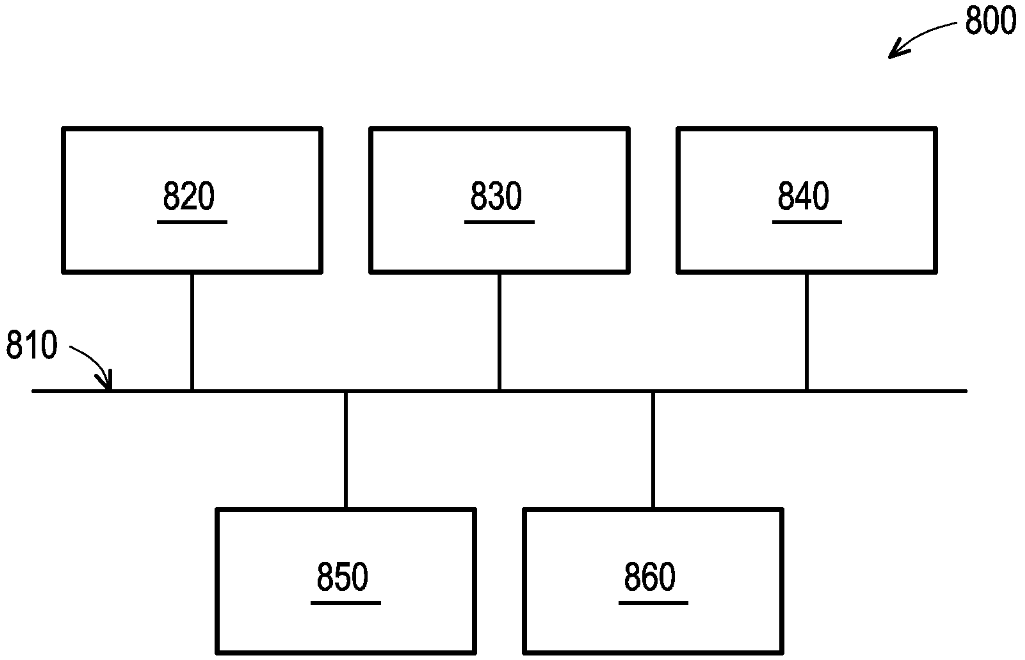
FIG. 8 is a diagram of example components of one or more devices described herein.

FIG. 8 is a diagram of example components of a device 800 described herein. In some implementations, one or more of the semiconductor processing tools 102-112 and/or the wafer/die transport tool 114 may include one or more devices 800 and/or one or more components of the device 800. As shown in FIG. 8, the device 800 may include a bus 810, a processor 820, a memory 830, an input component 840, an output component 850, and/or a communication component 860.

The bus 810 may include one or more components that enable wired and/or wireless communication among the components of the device 800. The bus 810 may couple together two or more components of FIG. 8, such as via operative coupling, communicative coupling, electronic coupling, and/or electric coupling. For example, the bus 810 may include an electrical connection (e.g., a wire, a trace, and/or a lead) and/or a wireless bus. The processor 820 may include a central processing unit, a graphics processing unit, a microprocessor, a controller, a microcontroller, a digital signal processor, a field-programmable gate array, an application-specific integrated circuit, and/or another type of processing component. The processor 820 may be implemented in hardware, firmware, or a combination of hardware and software. In some implementations, the processor 820 may include one or more processors capable of being programmed to perform one or more operations or processes described elsewhere herein.

The memory 830 may include volatile and/or nonvolatile memory. For example, the memory 830 may include random access memory (RAM), read only memory (ROM), a hard disk drive, and/or another type of memory (e.g., a flash memory, a magnetic memory, and/or an optical memory). The memory 830 may include internal memory (e.g., RAM, ROM, or a hard disk drive) and/or removable memory (e.g., removable via a universal serial bus connection). The memory 830 may be a non-transitory computer-readable medium. The memory 830 may store information, one or more instructions, and/or software (e.g., one or more software applications) related to the operation of the device 800. In some implementations, the memory 830 may include one or more memories that are coupled (e.g., communicatively coupled) to one or more processors (e.g., processor 820), such as via the bus 810. Communicative coupling between a processor 820 and a memory 830 may enable the processor 820 to read and/or process information stored in the memory 830 and/or to store information in the memory 830.

The input component 840 may enable the device 800 to receive input, such as user input and/or sensed input. For example, the input component 840 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 850 may enable the device 800 to provide output, such as via a display, a speaker, and/or a light-emitting diode. The communication component 860 may enable the device 800 to communicate with other devices via a wired connection and/or a wireless connection. For example, the communication component 860 may include a receiver, a transmitter, a transceiver, a modem, a network interface card, and/or an antenna.

The device 800 may perform one or more operations or processes described herein. For example, a non-transitory computer-readable medium (e.g., memory 830) may store a set of instructions (e.g., one or more instructions or code) for execution by the processor 820. The processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry may be used instead of or in combination with the instructions to perform one or more operations or processes described herein. Additionally, or alternatively, the processor 820 may be configured to perform one or more operations or processes described herein. Thus, implementations described herein are not limited to any specific combination of hardware circuitry and software.

The number and arrangement of components shown in FIG. 8 are provided as an example. The device 800 may include additional components, fewer components, different components, or differently arranged components than those shown in FIG. 8. Additionally, or alternatively, a set of components (e.g., one or more components) of the device 800 may perform one or more functions described as being performed by another set of components of the device 800.

Figure 9:
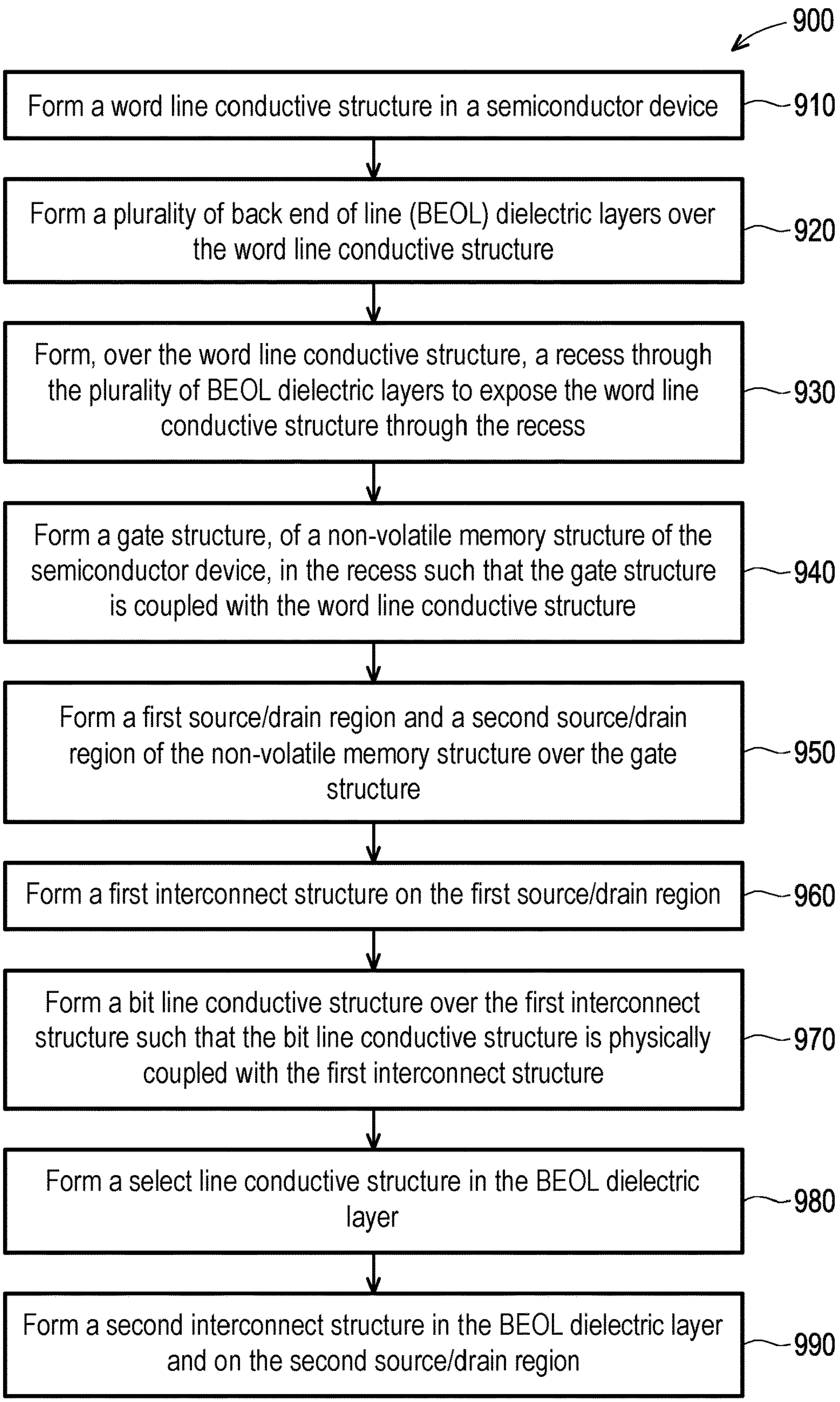
FIG. 9 is a flowchart of an example process associated with forming a semiconductor device described herein.

FIG. 9 is a flowchart of an example process 900 associated with forming a semiconductor device described herein. In some implementations, one or more process blocks of FIG. 9 are performed by one or more semiconductor processing tools (e.g., one or more of the semiconductor processing tools 102-112). Additionally, or alternatively, one or more process blocks of FIG. 9 may be performed by one or more components of device 800, such as processor 820, memory 830, input component 840, output component 850, and/or communication component 860.

As shown in FIG. 9, process 900 may include forming a word line conductive structure in a semiconductor device (block 910). For example, one or more of the semiconductor processing tools 102-112 may form a word line conductive structure 414 in a semiconductor device (e.g., the semiconductor device 200, the semiconductor device 700), as described herein.

As further shown in FIG. 9, process 900 may include forming a plurality of BEOL dielectric layers over the word line conductive structure (block 920). For example, one or more of the semiconductor processing tools 102-112 may form a plurality of BEOL dielectric layers (e.g., one or more of layers 404, 406, and/or 708-726) over the word line conductive structure 414, as described herein.

As further shown in FIG. 9, process 900 may include forming, over the word line conductive structure, a recess through the plurality of BEOL dielectric layers to expose the word line conductive structure through the recess (block 930). For example, one or more of the semiconductor processing tools 102-112 may form, over the word line conductive structure 414, a recess 602 through the plurality of BEOL dielectric layers to expose the word line conductive structure 414 through the recess 602, as described herein.

As further shown in FIG. 9, process 900 may include forming a gate structure, of a non-volatile memory structure of the semiconductor device, in the recess such that the gate structure is coupled with the word line conductive structure (block 940). For example, one or more of the semiconductor processing tools 102-112 may form a gate structure 226, of a non-volatile memory structure 208 of the semiconductor device, in the recess 602 such that the gate structure 226 is coupled with the word line conductive structure 414, as described herein.

As further shown in FIG. 9, process 900 may include forming a first source/drain region and a second source/drain region of the non-volatile memory structure over the gate structure (block 950). For example, one or more of the semiconductor processing tools 102-112 may form a first source/drain region 230 and a second source/drain region 232 of the non-volatile memory structure 208 over the gate structure 226, as described herein.

As further shown in FIG. 9, process 900 may include forming a first interconnect structure (234) on the first source/drain region (block 960). For example, one or more of the semiconductor processing tools 102-112 may form a first interconnect structure 234 on the first source/drain region 230, as described herein.

As further shown in FIG. 9, process 900 may include forming a bit line conductive structure over the first interconnect structure such that the bit line conductive structure is physically coupled with the first interconnect structure (block 970). For example, one or more of the semiconductor processing tools 102-112 may form a bit line conductive structure 238 over the first interconnect structure 234 such that the bit line conductive structure 238 is physically coupled with the first interconnect structure 234, as described herein. In some implementations, the bit line conductive structure 238 is formed in a BEOL dielectric layer (e.g., one or more of the layers 406 and/or 708-276) of the plurality of BEOL dielectric layers.

As further shown in FIG. 9, process 900 may include forming a select line conductive structure in the BEOL dielectric layer (block 980). For example, one or more of the semiconductor processing tools 102-112 may form a select line conductive structure 240 in the BEOL dielectric layer, as described herein.

As further shown in FIG. 9, process 900 may include forming a second interconnect structure in the BEOL dielectric layer and on the second source/drain region (block 990). For example, one or more of the semiconductor processing tools 102-112 may form a second interconnect structure 236 in the BEOL dielectric layer and on the second source/drain region 232, as described herein. In some implementations, the second interconnect structure 236 is formed such that the second interconnect structure 236 and the select line conductive structure 240 are spaced apart by the BEOL dielectric layer.

Process 900 may include additional implementations, such as any single implementation or any combination of implementations described below and/or in connection with one or more other processes described elsewhere herein.

In a first implementation, process 900 includes forming a gate dielectric layer 420 of the non-volatile memory structure 208 over the gate structure 226, and forming a channel layer 228 of the non-volatile memory structure 208 over the gate dielectric layer 420, where forming the first source/drain region 230 and the second source/drain region 232 includes forming the first source/drain region 230 and the second source/drain region 232 over the channel layer 228.

In a second implementation, alone or in combination with the first implementation, forming the second interconnect structure 236 includes forming the second interconnect structure 236 after forming the bit line conductive structure 238 and after forming the select line conductive structure 240.

In a third implementation, alone or in combination with one or more of the first and second implementations, forming the second interconnect structure 236 includes forming the second interconnect structure 236 between the bit line conductive structure 238 and the select line conductive structure 240.

In a fourth implementation, alone or in combination with one or more of the first through third implementations, process 900 includes forming a gate structure 210, of a volatile memory structure 206 of the semiconductor device, in the plurality of BEOL dielectric layers, where the gate structure 226 of the non-volatile memory structure 208 and the gate structure 210 of the volatile memory structure 206 are formed in a same set of semiconductor processing operations.

In a fifth implementation, alone or in combination with one or more of the first through fourth implementations, process 900 includes forming a first source/drain region 214 and a second source/drain region 216 of a volatile memory structure 206 of the semiconductor device, where the first source/drain region 230 and the second source/drain region 232 of the non-volatile memory structure 208 and the first source/drain region 214 and the second source/drain region 216 of the volatile memory structure are formed in a same set of first semiconductor processing operations, forming a first interconnect structure 218 for the non-volatile memory structure on the first source/drain region 214 of the volatile memory structure 206, where the first interconnect structure 234 of the non-volatile memory structure 208 and the first interconnect structure 218 of the volatile memory structure 206 are formed in a same set of second semiconductor processing operations, and forming a second interconnect structure 220 for the volatile memory structure 206 on the second source/drain region 216 of the volatile memory structure 206, where the second interconnect structure 236 of the non-volatile memory structure 208 and the second interconnect structure 220 of the volatile memory structure 206 are formed in a same set of third semiconductor processing operations.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

In this way, a semiconductor device may include a non-volatile memory structure that may be formed in a BEOL region of a semiconductor device. The non-volatile memory structure may include a dielectric-based OTP anti-fuse memory structure or a dielectric-based ReRAM, among other examples. The non-volatile memory structure may be selectively programmed based on modifying an electrical resistance of the non-volatile memory structure, and may retain data stored in the non-volatile memory structure even when electrical power is removed from the semiconductor device.

As described in greater detail above, some implementations described herein provide a semiconductor device. The semiconductor device includes a plurality of back end dielectric layers. The semiconductor device includes a non-volatile memory structure included in the plurality of back end dielectric layers, comprising, a gate structure a channel layer over the gate structure a first source/drain region and a second source/drain region over the channel layer a first interconnect structure above and coupled with the first source/drain region, where the first interconnect structure is coupled with a bit line conductive structure in the semiconductor device a second interconnect structure above and coupled with the second source/drain region, where the second interconnect structure is adjacent to a select line conductive structure in the semiconductor device, and where a portion of a back end dielectric layer, of the plurality of back end dielectric layers, is located between the second interconnect structure and the select line conductive structure.

As described in greater detail above, some implementations described herein provide a method. The method includes forming a word line conductive structure in a semiconductor device. The method includes forming a plurality of BEOL dielectric layers over the word line conductive structure. The method includes forming, over the word line conductive structure, a recess through the plurality of BEOL dielectric layers to expose the word line conductive structure through the recess. The method includes forming a gate structure, of a non-volatile memory structure of the semiconductor device, in the recess such that the gate structure is coupled with the word line conductive structure. The method includes forming a first source/drain region and a second source/drain region of the non-volatile memory structure over the gate structure. The method includes forming a first interconnect structure on the first source/drain region. The method includes forming a bit line conductive structure over the first interconnect structure such that the bit line conductive structure is physically coupled with the first interconnect structure, where the bit line conductive structure is formed in a BEOL dielectric layer of the plurality of BEOL dielectric layers. The method includes forming a select line conductive structure in the BEOL dielectric layer. The method includes forming a second interconnect structure in the BEOL dielectric layer and on the second source/drain region, where the second interconnect structure is formed such that the second interconnect structure and the select line conductive structure are spaced apart by the BEOL dielectric layer.

As described in greater detail above, some implementations described herein provide a semiconductor device. The semiconductor device includes a plurality of back end dielectric layers. The semiconductor device includes a volatile memory array, in the plurality of back end dielectric layers, comprising a plurality of volatile memory structures. The semiconductor device includes a non-volatile memory array, in the plurality of back end dielectric layers, comprising a plurality of non-volatile memory structures, where a non-volatile memory structure, of the plurality of non-volatile memory structures, includes a programmable resistance-based memory cell region that corresponds to a portion of a back end dielectric layer of the plurality of back end dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a word line conductive structure in a semiconductor device;

forming a plurality of back end of line (BEOL) dielectric layers over the word line conductive structure;

forming, over the word line conductive structure, a recess through the plurality of BEOL dielectric layers to expose the word line conductive structure through the recess;

forming a gate structure, of a non-volatile memory structure of the semiconductor device, in the recess such that the gate structure is coupled with the word line conductive structure;

forming a first source/drain region and a second source/drain region of the non-volatile memory structure over the gate structure;

forming a first interconnect structure on the first source/drain region;

forming a bit line conductive structure over the first interconnect structure such that the bit line conductive structure is physically coupled with the first interconnect structure, wherein the bit line conductive structure is formed in a BEOL dielectric layer of the plurality of BEOL dielectric layers; and forming a select line conductive structure in the BEOL dielectric layer; and forming a second interconnect structure in the BEOL dielectric layer and on the second source/drain region, wherein the second interconnect structure is formed such that the second interconnect structure and the select line conductive structure are spaced apart by the BEOL dielectric layer.

2. The method of claim 1, further comprising:

forming a gate dielectric layer of the non-volatile memory structure over the gate structure; and forming a channel layer of the non-volatile memory structure over the gate dielectric layer, wherein forming the first source/drain region and the second source/drain region comprises:

forming the first source/drain region and the second source/drain region over the channel layer.

3. The method of claim 1, wherein forming the second interconnect structure comprises:

forming the second interconnect structure after forming the bit line conductive structure and after forming the select line conductive structure.

4. The method of claim 1, wherein forming the second interconnect structure comprises:

forming the second interconnect structure between the bit line conductive structure and the select line conductive structure.

5. The method of claim 1, further comprising:

forming a gate structure, of a volatile memory structure of the semiconductor device, in the plurality of BEOL dielectric layers, wherein the gate structure of the non-volatile memory structure and the gate structure of the volatile memory structure are formed in a same set of semiconductor processing operations.

6. The method of claim 1, further comprising:

forming a first source/drain region and a second source/drain region of a volatile memory structure of the semiconductor device, wherein the first source/drain region and the second source/drain region of the non-volatile memory structure and the first source/drain region and the second source/drain region of the volatile memory structure are formed in a same set of first semiconductor processing operations;

forming a first interconnect structure for the volatile memory structure on the first source/drain region of the volatile memory structure, wherein the first interconnect structure of the non-volatile memory structure and the first interconnect structure of the volatile memory structure are formed in a same set of second semiconductor processing operations; and forming a second interconnect structure for the volatile memory structure on the second source/drain region of the volatile memory structure, wherein the second interconnect structure of the non-volatile memory structure and the second interconnect structure of the volatile memory structure are formed in a same set of third semiconductor processing operations.

7. A method of forming a semiconductor device, comprising:

forming a plurality of back end dielectric layers; and forming a non-volatile memory structure included in the plurality of back end dielectric layers, comprising:

forming a gate structure;

forming a channel layer over the gate structure;

forming a first source/drain region and a second source/drain region over the channel layer;

forming a first interconnect structure above and coupled to the first source/drain region, wherein the first interconnect structure is coupled to a bit line conductive structure in the semiconductor device; and forming a second interconnect structure above and coupled to the second source/drain region, wherein the second interconnect structure is adjacent to a select line conductive structure in the semiconductor device, wherein a portion of a back end dielectric layer, of the plurality of back end dielectric layers, is located between the second interconnect structure and the select line conductive structure, and wherein the portion of the back end dielectric layer, between the second interconnect structure and the select line conductive structure, comprises an oxide dielectric material.

8. The method of claim 7, wherein the non-volatile memory structure is a resistive random access memory (ReRAM) structure.

9. The method of claim 7, wherein the non-volatile memory structure is a one-time programmable anti-fuse memory structure.

10. The method of claim 7, wherein a top surface of the second interconnect structure extends above a top surface of the first interconnect structure.

11. The method of claim 7, wherein a top surface of the second interconnect structure extends above a top surface of the bit line conductive structure.

12. The method of claim 7, wherein a top surface of the second interconnect structure extends above a top surface of the select line conductive structure.

13. The method of claim 7, wherein the first source/drain region and the second source/drain region both extend in a first direction in a top-down view of the semiconductor device.

14. The method of claim 13, wherein the portion of the back end dielectric layer is located between the second interconnect structure and the select line conductive structure in the first direction in the top-down view of the semiconductor device.

15. A method of forming a semiconductor device, comprising:

forming a plurality of back end dielectric layers; and forming a non-volatile memory structure included in the plurality of back end dielectric layers, comprising:

forming a gate structure;

forming a channel layer over the gate structure;

forming a first source/drain region and a second source/drain region over the channel layer;

forming a first interconnect structure above and coupled to the first source/drain region, wherein the first interconnect structure is coupled to a bit line conductive structure in the semiconductor device; and forming a second interconnect structure above and coupled to the second source/drain region, wherein the second interconnect structure is adjacent to a select line conductive structure in the semiconductor device, wherein a portion of a back end dielectric layer, of the plurality of back end dielectric layers, is located between the second interconnect structure and the select line conductive structure, and wherein a top surface of the second interconnect structure extends above a top surface of the first interconnect structure.

16. The method of claim 15, wherein the non-volatile memory structure is a resistive random access memory (ReRAM) structure.

17. The method of claim 15, wherein the non-volatile memory structure is a one-time programmable anti-fuse memory structure.

18. The method of claim 15, wherein the first source/drain region and the second source/drain region both extend in a first direction in a top-down view of the semiconductor device.

19. The method of claim 18, wherein the bit line conductive structure and the select line conductive structure both extend in a second direction in the top-down view of the semiconductor device that is approximately orthogonal to the first direction.

20. The method of claim 15, wherein the portion of the back end dielectric layer, between the second interconnect structure and the select line conductive structure, comprises an oxide dielectric material.

* * * * *